US007648861B2

(12) United States Patent
Yamazaki et al.

(10) Patent No.: US 7,648,861 B2
(45) Date of Patent: Jan. 19, 2010

(54) METHOD OF FABRICATING A SEMICONDUCTOR DEVICE INCLUDING SEPARATELY FORMING A SECOND SEMICONDUCTOR FILM CONTAINING AN IMPURITY ELEMENT OVER THE FIRST SEMICONDUCTOR REGION

(75) Inventors: Shunpei Yamazaki, Setagaya (JP); Shinji Maekawa, Kanagawa (JP); Tatsuya Honda, Isehara (JP); Hironobu Shoji, Machida (JP); Osamu Nakamura, Atsugi (JP); Yukie Suzuki, Isehara (JP); Ikuko Kawamata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 508 days.

(21) Appl. No.: 11/193,513

(22) Filed: Aug. 1, 2005

(65) Prior Publication Data

US 2006/0189047 A1 Aug. 24, 2006

(30) Foreign Application Priority Data

Aug. 3, 2004 (JP) ............................ 2004-227292
Aug. 11, 2004 (JP) ............................ 2004-234677

(51) Int. Cl.
*H01L 21/00* (2006.01)

(52) U.S. Cl. ....................... 438/149; 438/151; 438/158; 257/E21.133; 257/E21.414

(58) Field of Classification Search ................. 438/149, 438/151, 158; 257/59, E21.133, E21.414
See application file for complete search history.

(56) References Cited

U.S. PATENT DOCUMENTS 6,121,660 A 9/2000 Yamazaki et al.

(Continued)

FOREIGN PATENT DOCUMENTS

JP 05-035207 2/1993

OTHER PUBLICATIONS

Katsuhiko Kumakawa, "*Advancements in the Visibility of Moving Images of OCB*", Nikkei Microdevice Flat-Panel Display 2002, pp. 102-109 (Abstract—pp. 102-109; Partial Translation—pp. 102-103.

(Continued)

*Primary Examiner*—Khiem D Nguyen
(74) *Attorney, Agent, or Firm*—Eric J. Robinson; Robinson Intellectual Property Law Office, P.C.

(57) ABSTRACT

The invention provides a method of fabricating a semiconductor device having an inversely staggered TFT capable of high-speed operation, which has few variations of the threshold. In addition, the invention provides a method of fabricating a semiconductor device with high throughput where the cost reduction is achieved with few materials.

According to the invention, a semiconductor device is fabricated by forming an inversely staggered TFT which is obtained by forming a gate electrode using a highly heat-resistant material, depositing an amorphous semiconductor film, adding a catalytic element into the amorphous semiconductor film and heating the amorphous semiconductor film to form a crystalline semiconductor film, forming a layer containing a donor element or a rare gas element over the crystalline semiconductor film and heating the layer to remove the catalytic element from the crystalline semiconductor film, forming a semiconductor region by utilizing a part of the crystalline semiconductor film, forming a source electrode and a drain electrode to be electrically connected to the semiconductor region, and forming a gate wiring to be connected to the gate electrode.

26 Claims, 52 Drawing Sheets

U.S. PATENT DOCUMENTS

| | | | | |
|---|---|---|---|---|
| 6,680,223 | B1 * | 1/2004 | Yamazaki et al. | 438/149 |
| 6,924,528 | B2 | 8/2005 | Yamazaki et al. | |
| 7,199,033 | B2 * | 4/2007 | Hirai et al. | 438/584 |
| 7,381,991 | B2 * | 6/2008 | Yamazaki et al. | 257/72 |
| 7,456,056 | B2 * | 11/2008 | Yamazaki et al. | 438/166 |
| 2006/0027804 | A1 | 2/2006 | Yamazaki et al. | |

OTHER PUBLICATIONS

Katsuhiko Kumakawa, "*Advancements in the Visibility of Moving Images of OCB - Introducing an Impulse Type Light-Emission by Inserting Black Periods*", Nikkei Microdevice Flat-Panel Display 2002, pp. 102-109 (Abstract — pp. 102- 109; Partial Translation — pp. 102-103).

* cited by examiner (A)

(B)

(C)

(A)

(B)

(C)

(D)

(E)

(A)

(B)

(C)

(A)

(B)

(A)

(B)

METHOD OF FABRICATING A SEMICONDUCTOR DEVICE INCLUDING SEPARATELY FORMING A SECOND SEMICONDUCTOR FILM CONTAINING AN IMPURITY ELEMENT OVER THE FIRST SEMICONDUCTOR REGION

INDUSTRIAL FIELD OF THE INVENTION

The present invention relates to a method of fabricating a semiconductor device having an inversely staggered thin film transistor which is formed of a crystalline semiconductor film.

PRIOR ART

In recent years, a flat panel display (FPD) typified by a liquid crystal display (LCD) or an EL display is attracting attention as an alternative display device for a conventional CRT In particular, development of a large-screen liquid crystal television mounted with a large liquid crystal display panel which is driven by an active matrix method is the primary task for liquid crystal panel manufacturers. In recent years, a large-screen EL television has also been developed following the liquid crystal television.

In a conventional liquid crystal display device or display device having light-emitting elements, a thin film transistor (hereinafter referred to as a TFT) which uses amorphous silicon is used as a semiconductor element for driving each pixel (see Patent Document 1).

Meanwhile, in a conventional liquid crystal television, there has been a defect in that images are blurred due to the limitation of the viewing angle characteristics, limitation of the high speed operation resulting from liquid crystal materials and the like. However, in recent years, a new display mode is proposed for solving such a problem, which is an OCB mode (see Non-patent Document 1).

[Patent Document 1] Japanese Patent Laid-Open No. Hei 5-35207

[Non-patent Document 1] Nikkei Microdevices' Flat Panel Display 2002 Yearbook, edited by Yasuhiro Nagahiro and others, Nikkei Business Publications, Inc., published in October, 2001 (pp. 102-109)

DISCLOSURE OF THE INVENTION

[Problems To Be Solved By The Invention]

However, when a TFT formed of an amorphous semiconductor film is driven with direct current, the threshold thereof easily varies, resulting in variations of the TFT characteristics. Therefore, in the display device using such a TFT formed of an amorphous semiconductor film for switching of the pixel, luminance unevenness occurs. Such a phenomenon is recognized more easily in a large-screen TV having a diagonal size of 30 inches or larger (typically, 40 inches or larger), which thus poses a serious problem on the degradation in image quality.

Meanwhile, in order to enhance the image quality of an LCD, a switching element capable of high-speed operation is required. However, the TFT using an amorphous semiconductor film has a limitation. For example, it is difficult to realize a liquid crystal display device of the OCB mode.

In a conventional formation process of an inversely staggered TFT using a lithography step, a wiring or a semiconductor region is formed by applying a resist onto a film which is deposited over the whole surface of a substrate by a CVD method, a PVD method or the like. However, most of the film deposited over the whole surface of the substrate by the CVD method, the PVD method or the like and the material of the resist or the like are wasted as well as the number of steps for forming the wiring or the semiconductor region is increased, which results in the lower throughput.

Further, it is difficult for a light exposure system used in the photolithography step to perform light exposure to a large-area substrate at one time. Therefore, in a fabrication method of a display device using a large-area substrate, a plurality of times of light exposure are required. Therefore, adjacent patters have unconformity, resulting in the lower yield. This problem occurs more often in a large-sized display device typified by a large-sized television.

The invention is made in view of the aforementioned circumstances, and the invention provides a method of fabricating a semiconductor device having an inversely staggered TFT capable of high-speed operation, which has few variations of the threshold. In addition, the invention provides a method of fabricating a display device having an excellent switching property and high image contrast. Further, the invention provides a method of fabricating a semiconductor device with high yield where the cost reduction is achieved with few materials.

[Means For Solving The Problem]

According to the gist of the invention, an inversely staggered TFT is formed by forming a gate electrode using a highly heat-resistant material, forming an amorphous semiconductor film, adding a catalytic element into the amorphous semiconductor film and heating the amorphous semiconductor film to form a crystalline semiconductor film, forming a layer containing a donor element or a rare gas element or a layer containing a donor element and a rare gas element over the crystalline semiconductor film and heating the layer to remove the catalytic element from the crystalline semiconductor film, forming a semiconductor region by utilizing a part of the crystalline semiconductor film, forming a source electrode and a drain electrode to be electrically connected to the semiconductor region, and forming a gate wiring to be connected to the gate electrode. In addition, a display device is formed by forming a first electrode to be connected to the source electrode or the drain electrode of the aforementioned TFT, and forming a layer containing a light-emitting substance and a second electrode over the first electrode.

One aspect of a fabrication method of a semiconductor device of the invention comprises the steps of: forming a gate electrode over an insulating surface, forming a gate insulating film over the gate electrode, forming a first semiconductor region over the gate insulating film, adding a catalytic element into the first semiconductor region and heating the first semiconductor region, forming a second semiconductor region containing an impurity element over the first semiconductor region, heating the first semiconductor region and the second semiconductor region, forming a first conductive layer to be in contact with the second semiconductor region by a droplet discharge method, partially etching the first conductive layer and the second semiconductor region to form a second conductive layer, a source region and a drain region, forming an insulating film over the second conductive layer, partially etching the insulating film and the gate insulating film to partially expose the gate electrode, and forming a third conductive layer to be connected to the gate electrode by a droplet discharge method.

The impurity element is an element selected from phosphorus, nitrogen, arsenic, antimony and bismuth. Alternatively, one or more of helium, neon, argon, krypton and xenon may be added into the second semiconductor region.

One aspect of a fabrication method of a semiconductor device of the invention comprises the steps of: forming a gate electrode over an insulating surface, forming a gate insulating film over the gate electrode, forming a first semiconductor region over the gate insulating film, adding a catalytic element into the first semiconductor region and heating the first semiconductor region, forming a second semiconductor region containing a first impurity element over the first semiconductor region, heating the first semiconductor region and the second semiconductor region, removing the second semiconductor region, forming a third semiconductor region containing a second impurity element to be in contact with the first semiconductor region, forming a first conductive layer to be in contact with the third semiconductor region by a droplet discharge method, partially etching the first conductive layer and the third semiconductor region to form a second conductive layer, a source region and a drain region, forming an insulating film over the second conductive layer, partially etching the insulating film and the gate insulating film to partially expose the gate electrode, and forming a third conductive layer to be connected to the gate electrode by a droplet discharge method.

One aspect of a fabrication method of a semiconductor device of the invention comprises the steps of: forming a gate electrode over an insulating surface, forming a gate insulating film over the gate electrode, forming a first semiconductor region over the gate insulating film, adding a catalytic element into the first semiconductor region and heating the first semiconductor region, forming a second semiconductor region containing a first impurity element over the first semiconductor region, heating the first semiconductor region and the second semiconductor region, removing the second semiconductor region, adding a second impurity element into the first semiconductor region to form a source region and a drain region, forming a first conductive layer to be in contact with the source region and the drain region by a droplet discharge method, partially etching the first conductive layer to form a second conductive layer, forming an insulating film over the second conductive layer, partially etching the insulating film and the gate insulating film to partially expose the gate electrode, and forming a third conducive layer to be connected to the gate electrode by a droplet discharge method.

The first impurity element is one or more of elements selected from helium, neon, argon, krypton and xenon, and the second impurity element is one or more of elements selected from phosphorus, nitrogen, arsenic, antimony and bismuth.

The insulating film may be formed by partially discharging an insulating material onto the first conductive layer.

The third conductive layer is connected to three or more gate electrodes. Alternatively, the third conductive layer may be connected to two gate electrodes.

One aspect of a fabrication method of a semiconductor device of the invention comprises the steps of: forming a gate electrode over an insulating surface, forming a gate insulating film over the gate electrode, forming a first semiconductor region over the gate insulating film, adding a catalytic element into the first semiconductor region and heating the first semiconductor region, forming a second semiconductor region containing an impurity element over the first semiconductor region, heating the first semiconductor region and the second semiconductor region, partially removing the gate insulating film formed over the gate electrode, forming an insulating film over the gate electrode by a droplet discharge method, forming a first conductive layer to be connected to the gate electrode and forming a second conductive layer to be connected to the insulating film and the second semiconductor region by a droplet discharge method, and partially etching the first and second conductive layers and the second semiconductor region to form third and fourth conductive layers, a source region and a drain region.

The impurity element is one or more of elements selected from phosphorus, nitrogen, arsenic, antimony and bismuth, and the second impurity element is one or more of elements selected from helium, neon, argon, krypton and xenon.

One aspect of a fabrication method of a semiconductor device of the invention comprises the steps of: forming a gate electrode over an insulating surface, forming a gate insulating film over the gate electrode, forming a first semiconductor region over the gate insulating film, adding a catalytic element into the first semiconductor region and heating the first semiconductor region, forming a second semiconductor region containing a first impurity element over the first semiconductor region, heating the first semiconductor region and the second semiconductor region, removing the second semiconductor region, forming a third semiconductor region containing a second impurity element to be in contact with the first semiconductor region, partially removing the gate insulating film formed over the gate electrode, forming an insulating film over the gate electrode by a droplet discharge method, forming a first conductive layer to be connected to the gate electrode and forming a second conductive layer to be connected to the insulating film and the third semiconductor region by a droplet discharge method, and partially etching the first and second conductive layers and the third semiconductor region to form third and fourth conductive layers, a source region and a drain region.

One aspect of a fabrication method of a semiconductor device of the invention comprises the steps of: forming a gate electrode over an insulating surface, forming a gate insulating film over the gate electrode, forming a first semiconductor region over the gate insulating film, adding a catalytic element into the first semiconductor region and heating the first semiconductor region, forming a second semiconductor region containing a first impurity element over the first semiconductor region, heating the first semiconductor region and the second semiconductor region, removing the second semiconductor region, adding a second impurity element into the first semiconductor region to form a source region and a drain region, partially removing the gate insulating film formed over the gate electrode, forming an insulating film over the gate electrode by a droplet discharge method, forming a first conductive layer to be connected to the gate electrode and forming a second conductive layer to be connected to the insulating film and the third semiconductor region by a droplet discharge method, and partially etching the first and second conductive layers and the third semiconductor region to form third and fourth conductive layers.

The first impurity element is one or more of elements selected from helium, neon, argon, krypton and xenon, and the second impurity element is one or more of elements selected from phosphorus, nitrogen, arsenic, antimony and bismuth.

The first conductive layer is connected to three or more gate electrodes. Alternatively, the first conductive layer may be connected to two gate electrodes.

One aspect of a fabrication method of a semiconductor device of the invention comprises the steps of: forming first and second gate electrodes over a substrate, forming a gate insulating film over the first and second gate electrodes, forming a first semiconductor region over the gate insulating film, adding a catalytic element into the first semiconductor region and heating the first semiconductor region, forming a second semiconductor region containing a first impurity element over the first semiconductor region, heating the first and second semiconductor regions, etching the first semiconductor region to form third and fourth semiconductor regions, etching the second semiconductor region to form fifth and sixth semiconductor regions, covering the third and fifth semiconductor regions with a first mask and partially covering the sixth semiconductor region with a second mask to add a second impurity element, forming first and second conductive layers over the fifth and sixth semiconductor regions by a droplet discharge method, etching the first and second conductive layers to form third and fourth conductive layers, etching a part of the fifth semiconductor region and a region of the sixth semiconductor region that is covered with the second mask, forming an insulating film over the third and fourth conductive layers, partially etching the insulating film and the gate insulating film to partially expose the gate electrode, and forming a fifth conductive layer to be connected to the gate electrode by a droplet discharge method.

One aspect of a fabrication method of a semiconductor device of the invention comprises the steps of: forming first and second gate electrodes over a substrate, forming a gate insulating film over the first and second gate electrodes, forming a first semiconductor region over the gate insulating film, adding a catalytic element into the first semiconductor region and heating the first semiconductor region, etching the first semiconductor region to form second and third semiconductor regions, forming a first mask for partially covering each of the second and third semiconductor regions, adding a first impurity element into the second and third semiconductor regions and heating them, forming a second mask for partially covering the whole second semiconductor region and a part of the third semiconductor region, adding a second impurity element into the third semiconductor region and heating the third semiconductor region, forming first and second conductive layers over the first semiconductor region and the second semiconductor region by a droplet discharge method, etching the first and second conductive layers to form third and fourth conductive layers, forming an insulating film over the third and fourth conductive layers, partially etching the insulating film and the gate insulating film to partially expose the gate electrode, and forming a fifth conductive layer to be connected to the gate electrode by a droplet discharge method.

The first impurity element is one or more of elements selected from phosphorus, nitrogen, arsenic, antimony and bismuth, and the second impurity element is boron. Alternatively, one or more of elements selected from helium, neon, argon, krypton and xenon may be added into the second semiconductor region.

One aspect of a fabrication method of a semiconductor device of the invention comprises the steps of: forming a gate electrode over an insulating surface, forming a gate insulating film over the gate electrode, forming a first semiconductor region over the gate insulating film, adding a catalytic element into the first semiconductor region and heating the first semiconductor region, forming a second semiconductor region containing a first impurity element over the first semiconductor region, heating the first semiconductor region and the second semiconductor region, removing the second semiconductor region, etching the first semiconductor region to form a third semiconductor region and a fourth semiconductor region, forming a first mask for covering the whole fourth semiconductor region and a part of the third semiconductor region, adding a second impurity element into the third semiconductor region, forming a second mask for covering the whole third semiconductor region and a part of the fourth semiconductor region, adding a third impurity element into the fourth semiconductor region, forming first and second conductive layers over the third semiconductor region and the fourth semiconductor region by a droplet discharge method, etching the first and second conductive layers to form a third conductive layer and a fourth conductive layer, forming an insulating film over the third and fourth conductive layers, partially etching the insulating film and the gate insulating film to partially expose the gate electrode, and forming a fifth conductive layer to be connected to the gate electrode by a droplet discharge method.

The first impurity element is one or more of elements selected from helium, neon, argon, krypton and xenon, the first impurity element is one or more of elements selected from phosphorus, nitrogen, arsenic, antimony, and bismuth, and the second impurity element is boron.

The insulating film may be formed by partially discharging an insulating material onto the first conductive layer.

The first and second masks may be formed by a droplet discharge method. Alternatively, they may be formed by discharging or applying a photosensitive material, irradiating the photosensitive material with laser light for light exposure and developing it.

The fifth conductive layer is connected to three or more gate electrodes. Alternatively, the fifth conductive layer may be connected to two gate electrodes.

The gate electrode is formed by forming a conductive film over an insulating surface, discharging or applying a photosensitive resin onto the conductive film, partially irradiating the photosensitive resin with laser light to form a mask, and then etching the conductive film using the mask.

The gate electrode is formed of a heat-resistant conductive layer. Typically, it is formed of a crystalline silicon film containing tungsten, molybdenum, zirconium, hafnium, bismuth, niobium, tantalum, chromium (Cr), cobalt, nickel, platinum, or phosphorus, indium tin oxide, zinc oxide, indium zinc oxide, gallium-doped zinc oxide, or indium tin oxide containing silicon oxide.

The catalytic element is one or more of elements selected from tungsten, molybdenum, zirconium, hafnium, bismuth, niobium, tantalum, chromium, cobalt, nickel, and platinum.

The semiconductor device of the invention includes an integrated circuit, a display device, a wireless tag, an IC tag, a display device and the like each of which is constructed of semiconductor elements. Typically, the display device includes a liquid crystal display device, a DMD (Digital Micromirror Device), a PDP (Plasma Display Panel), an FED (Field Emission Display), an electrophoretic display device (electronic paper), and the like.

Note that the display device of the invention includes all of a module in which a display panel is connected to a connector, for example, a flexible printed wiring (FPC: Flexible Printed Circuit), a TAB (Tape Automated Bonding) tape, or a TCP (Tape Carrier Package), a module in which a tip of a TAB tape or a TCP is provided with a printed wiring board, or a module in which an IC (integrated circuit) or a CPU is directly mounted on display elements by a COG (Chip On Glass) method.

One aspect of the invention is a television having the aforementioned display device, typically, an EL television or a liquid crystal television.

[Effect Of The Invention]

According to the invention, an inversely staggered TFT formed of a crystalline semiconductor film can be formed. The inversely staggered TFT of the invention has a gate electrode formed of a highly heat-resistant material. After applying heat treatment such as an activation step, a gettering step and a crystallization step, wirings such as a source wiring and a gate wiring are formed using a low-resistant material. Accordingly, a TFT with crystallinity can be formed to have less impurity metal elements and low wiring resistance. In the display device of the invention having light-emitting elements, a pixel electrode can be formed over an insulating film, thereby the aperture ratio can be increased.

A TFT formed of a crystalline semiconductor film has mobility of several ten to fifty times higher than an inversely staggered TFT formed of an amorphous semiconductor film. In addition, a source region and a drain region thereof contains a catalytic element in addition to an acceptor element or a donor element. Therefore, a source region and a drain region having low contact resistance with a semiconductor region can be formed. As a result, a display device having light-emitting elements which requires high-speed operation can be fabricated. Typically, a liquid crystal display device such as an OCB-mode liquid crystal display device can be fabricated, which exhibits high response speed while being capable of performing display with a wide viewing angle.

In addition, a gate wiring driver circuit can be formed on the periphery of the liquid crystal display device or the display device having light-emitting elements, simultaneously with TFTs of a pixel region. Therefore, a downsized display device can be fabricated.

In comparison with a TFT formed of an amorphous semiconductor film, variations of the threshold are less likely to occur, which results in the decrease in variations of the TFT characteristics. Therefore, in comparison with a display device having a display element using a TFT formed of an amorphous semiconductor film as a switching element, display unevenness can be reduced.

Further, as the metal element mixed into the semiconductor film at the deposition phase is gettered by a gettering step, the off current can be reduced. Typically, a TFT having an ON/OFF ratio of 6 or more digits can be formed. By providing such a TFT as a switching element of the display device, the contrast can be improved.

Further, according to the invention, a thin film material or a resist may be discharged to a predetermined position using a droplet discharge method without the need of depositing a thin film over the whole surface of a substrate. Thus, TFTs can be formed without using photomasks. Therefore, the throughput and yield can be improved as well as the cost reduction can be achieved.

Further, the throughput and yield of a television which has a display device including light-emitting elements or a liquid crystal display device fabricated in accordance with the aforementioned fabrication steps (denoted by an EL (electroluminescence) television or a liquid crystal television) can be improved, and thus such a television can be fabricated at low cost.

[Best Mode For Carrying Out The Invention]

Although the invention will be fully described by way of embodiment modes with reference to the accompanying drawings, it is to be understood that various changes and modifications will be apparent to those skilled in the art. Therefore, unless otherwise such changes and modifications depart from the scope of the invention, they should be constructed as being included therein. Note that common portions or portions having a common function are denoted by common reference numerals in all the drawings, and therefore, the description thereof is made only onc

EMBODIMENT MODE 1

In this embodiment mode, description is made with reference to FIGS. 1 to 3, 26 and 51 on fabrication steps of an active matrix substrate in which an inversely staggered TFT having a crystalline semiconductor film is used as an element for driving a light-emitting element. In this embodiment mode, a switching TFT and a driving TFT are shown as typical examples of an element for driving a light-emitting element. FIG. 3 shows cross-sectional views and a top view of the switching TFT and the driving TFT. FIGS. 1 and FIGS. 2 show cross-sectional views illustrating a connection portion of a gate electrode and a gate wiring of a switching TFT, a driving TFT and a light-emitting element.

As shown in FIG. 1(A) a first conductive layer 102 is formed over a substrate 101, and photosensitive materials 103 and 104 are applied onto the first conductive layer, and then dried and baked. Then, the photosensitive materials 103 and 104 are irradiated with laser light (hereinafter also referred to as laser beams) 105 and 106 respectively to form first masks 111 and 112 as shown in FIG. 1B.

The substrate 101 may be a glass substrate, a quartz substrate, a substrate formed of an insulating substance such as ceramics, for example, alumina, a silicon wafer, a metal plate or the like. In the case of using a glass substrate as the substrate 101, a large substrate can be used which has a size of, for example, 320 mm×400 mm, 370 mm×470 mm, 550 mm×650 mm, 600 mm×720 mm, 680 mm×880 mm, 1000 mm×1200 mm, 1100 mm×1250 mm or 1150 mm×1300 mm.

The first conductive layer 102 is formed in a predetermined region to have a thickness of 500 to 1000 nm using a droplet discharge method, a printing method, an electrolytic plating method or the like. Alternatively, it may be formed over the whole surface of the substrate by a PVD method (Physical Vapor Deposition), a CVD method (Chemical Vapor Deposition), a vapor deposition method or the like. Note that by using the droplet discharge method, the printing method or the electrolytic plating method, the conductive layer can be formed in the predetermined region; therefore, a region to be removed in a subsequent etching step can be reduced as well as the material can be reduced. Further, the number of steps can be reduced. Note that the droplet discharge method is a method for producing a minute droplet by discharging a mixed compound from a nozzle in accordance with an electronic signal, and landing it onto a predetermined position.

The first conductive layer 102 is preferably formed using a high-melting-point material. By using a high-melting-point material, subsequent heating steps such as a crystallization step, a gettering step and an activation step can be performed. As the high-melting-point material, there are metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti) and platinum (Pt), or alloys or metal nitride of such metals. In addition, a plurality of such materials may be stacked in layers. Typically, such stacked-layer structures may be employed that a tantalum nitride film and a tungsten film are formed in this order; a tantalum nitride film and molybdenum are formed in this order; a titanium nitride film and a tungsten film are formed in this order; or a titanium nitride film and a molybdenum film are formed in this order over the surface of the substrate. Alternatively, a silicon film (including an amorphous semiconductor film and a crystalline semiconductor film) containing phosphorus, indium tin oxide, zinc oxide, indium zinc oxide, gallium-doped zinc oxide, or indium tin oxide containing silicon oxide can be used.

Further, in the case of performing the subsequent heating step by an LRTA (Lamp Rapid Thermal Anneal) method which uses heat radiated from one or more of a halogen lamp, a metal halide lamp, a xenon arc lamp, a carbon arc lamp, a high-pressure sodium lamp and a high-pressure mercury lamp, or a GRTA (Gas Rapid Thermal Anneal) method which uses an inert gas such as nitrogen or argon as a heating medium, the heat treatment can be performed in short time. Therefore, the first conductive film may be formed using aluminum (Al), silver (Ag) or gold (Cu) having a relatively low melting point. At this time, it is preferable that a barrier film be provided over the surface of the film, such as a titanium nitride film, a titanium film, an aluminum nitride film, a tantalum nitride film, a silicon nitride film or a silicon nitride oxide film. Typically, there are a stacked-layer structure of a titanium film, a titanium nitride film, an aluminum film and a titanium nitride film, a stacked-layer structure of a titanium film, a titanium nitride film, an aluminum-silicon alloy film and a titanium nitride film, and the like.

As a material for the photosensitive materials 103 and 104, a negative photosensitive material or a positive photosensitive material which is sensitive to ultraviolet light to infrared light is employed. As a typical example of the photosensitive material, there are photosensitive organic resin materials such as an epoxy resin, a phenol resin, a novolac resin, an acrylic resin, a melamine resin and an urethane resin. Alternatively, such photosensitive organic materials can be used as benzocyclobutene, parylene, flare or polyimide. As a typical positive photosensitive resin, there are a novolac resin and a photosensitive resin having a naphthoquinone diazide compound as a photosensitizing agent. As a typical negative photosensitive resin, there are the aforementioned organic resins, and a photosensitive resin containing diphenylsilanediol and an acid generating agent. Here, a negative photosensitive material is employed.

Next, the photosensitive materials 103 and 104 are irradiated with the laser beams 105 and 106 respectively using a laser beam direct writing system.

Description is made with reference to FIG. 51 on a laser beam direct writing system. As shown in FIG. 51, a laser beam direct writing system 1001 includes a personal computer (hereinafter referred to as a PC) 1002 for carrying out various controls in irradiation of a laser beam, a laser oscillator 1003 for outputting laser beams, a power source 1004 of the laser oscillator 1003, an optical system (ND filter) 1005 for attenuating laser beams, an acoustooptic modulator (AOM) 1006 for modulating the intensity of laser beams, an optical system 1007 constituted by a lens for magnifying or reducing the cross-sectional surface of laser beams and a mirror for changing the optical path and the like, a substrate moving mechanism 1009 having an X stage and an Y stage, a D/A converter unit 1010 for digital-analog converting the control data outputted from the PC, a driver 1011 for controlling the acoustooptic modulator 1006 in accordance with an analog voltage outputted from the D/A converter unit, and a driver 1012 for outputting a driving signal for driving the substrate moving mechanism 1009.

As the laser oscillator 1003, a laser oscillator capable of oscillating ultraviolet light, visible light or infrared light can be used. The laser oscillator may be an excimer laser oscillator such as ArF, KrF, XeCl or Xe, a gas laser oscillator such as He, He—Cd, Ar, He—Ne or HF, a solid-state laser oscillator using such crystals as YAG, $GdVO_4$, $YVO_4$, YLF or $YAlO_3$ which are doped with Cr, Nd, Er, Ho, Ce, Co, Ti or Tm, a semiconductor laser oscillator such as GaN, GaAs, GaAlAs or InGaAsP. Note that, as for the solid-state laser oscillator, the second to fifth harmonics of the fundamental wave are desirably used.

Next, description is made on a photosensitizing method of a photosensitive material using a laser beam direct writing system. When the substrate 1008 is placed on the substrate moving mechanism 1009, the PC 1002 detects the position of a marker formed on the substrate 1008 using a camera (not shown). Then, the PC 1002 produces movement data for moving the substrate moving mechanism 1009 based on the detected positional data of the marker and the preprogrammed writing pattern data. After that, the PC 1002 controls the amount of light outputted from the acoustooptic modulator 1006 via the driver 1011, and a laser beam outputted from the laser oscillator 1003 is, after attenuated by the optical system 1005, controlled in quantity by the acoustooptic modulator 1006 to have a predetermined quantity of light. Meanwhile, the laser beam outputted from the acoustooptic modulator 1006 is changed an optical path and beam shape, and condensed with the lens in the optical system 1007. Then, the photosensitive material applied onto the substrate is irradiated with the laser beam to be photosensitized. At this time, the substrate moving mechanism 1009 is controlled to move in the X direction and the Y direction in accordance with the movement data produced by the PC 1002. As a result, a predetermined area is irradiated with the laser beam, and the photosensitive material can be exposed to light.

As a result, as shown in FIG. 1(B), the first masks 111 and 112 are formed in the region irradiated with the laser beams. Here, the region irradiated with the laser beams becomes the first masks since a negative type is used as the photosensitive material. The energy of the laser light is partially converted to heat on a resist, which causes a reaction of a part of the resist; therefore, the width of the resist mask becomes slightly larger than the width of the laser beam. In addition, the beam diameter can be condensed into a smaller one as the wavelength of the laser light is shorter. Therefore, in order to form a resist mask having a minute width, irradiation of a laser beam with a short wavelength is preferable.

In addition, the laser beam to land on the surface of the photosensitive material is processed with the optical system into a spot having a dotted shape, circular shape, elliptical shape, rectangular shape, or linear shape (to be exact, elongated rectangular shape). Note that although the spot may have a circular shape, a resist mask with a uniform width can be formed with a linear shape.

Although the system shown in FIG. 51 is an example in which the front surface of the substrate is irradiated with laser light to expose a photosensitive material to light, such a laser beam direct writing system may be used that the rear surface of the substrate is irradiated with laser light for light exposure by appropriately changing the optical system or the substrate moving mechanism.

Note that although the substrate is selectively irradiated with laser beams while being moved here, the invention is not limited to this, and the substrate can be irradiated with laser beams while moving the laser beams in the XY-axes direction. In such a case, a polygon mirror or a galvanometer mirror is preferably used for the optical system 1007.

Then, as shown in FIG. 1C, the first conductive layer 102 is etched using the first masks to form second conductive layers 121 and 122*a*. The second conductive layer 121 functions as a gate electrode of a driving TFT while the second conductive layer 122*a* functions as a gate electrode of a switching TFT.

Then, after removing the first mask, a first insulating film 123 is formed with a thickness of 10 to 200 nm, or preferably 50 to 100 nm, and a first semiconductor film 124 is formed with a thickness of 50 to 250 nm over the first insulating film. Over the first semiconductor film, a layer 125 containing a catalytic element is formed.

The first insulating film 123 functions as a gate insulating film. The first insulating film 123 may be formed by appropriately using silicon oxide ($SiO_x$), silicon nitride ($SiN_x$), silicon oxynitride ($SiO_xN_y$) (x>y), silicon nitride oxide ($SiN_xO_y$) (x>y) or the like. Further, instead of the first insulating film, an anodized film may be formed by anodizing the second conductive layers 121 and 122*a*. Note that in order to prevent diffusion of impurities from the substrate side, the first insulating film is desirably formed to have a stacked-layer structure by forming an insulating film to be in contact with the substrate side using silicon nitride ($SiN_x$), silicon nitride oxide ($SiN_xO_y$) (x>y) or the like, and forming silicon oxide ($SiO_x$) or silicon oxynitride ($SiO_xN_y$) (x>y) on the first semiconductor film side in view of the interfacial property with the first semiconductor film which is formed later. However, the invention is not limited to such a structure, and an alternative stacked-layer structure may be employed by combining any of silicon oxide ($SiO_x$), silicon nitride ($SiN_x$), silicon oxynitride ($SiO_xN_y$) (x>y), silicon nitride oxide ($SiN_xO_y$) (x>y) and the like. Note that the silicon oxide ($SiO_x$) film contains hydrogen. The first insulating film 123 is formed by a known method such as a CVD method or a PVD method.

The first semiconductor film 124 is formed using a film having any state selected from an amorphous semiconductor, a semi-amorphous semiconductor (also referred to as SAS) in which an amorphous state and a crystalline state are mixed, a microcrystalline semiconductor in which crystal grains of 0.5 to 20 nm can be observed in an amorphous semiconductor, and a crystalline semiconductor. In particular, the microcrystalline state in which crystal grains of 0.5 to 20 nm can be observed is what is called a microcrystal (μc). Each of the aforementioned film thickness can employ a semiconductor film containing silicon, silicon germanium (SiGe) or the like as a main component.

Note that in order to obtain a semiconductor film having a fine crystalline structure in the subsequent crystallization, concentration of impurities such as oxygen and nitrogen contained in the first semiconductor film 124 is preferably reduced to be $5\times10^{18}/cm^3$ (hereinafter, concentrations are all indicated by the atomic concentration measured by secondary ion mass spectrometry (SIMS)). Such impurities easily react with catalytic elements, which would disturb the crystallization later, and would increase the density of the trapping center or the recombination center even after the crystallization.

In addition, by continuously depositing the first insulating film and the first semiconductor film, oxygen concentration of the first semiconductor film can be reduced. For example, the first insulating film is formed by depositing a silicon nitride film by a CVD method using silane and ammonia gas as a material, and then depositing a silicon oxide film by a CVD method by switching the ammonia gas to nitrogen oxide ($N_2O$). Next, only a silane gas is flowed into the chamber without generating plasma. Accordingly, the oxygen concentration inside the chamber can be reduced. After that, by forming the first semiconductor film by a CVD method using the silane gas as a material, the first semiconductor film can be formed to have a low oxygen concentration.

As a method for forming the layer 125 containing a catalytic element, there are a method for forming a thin film containing a catalytic element or silicide of a catalytic element over the surface of the first semiconductor film 124 by a PVD method, a CVD method, a vapor deposition method or the like, a method for applying a solution containing a catalytic element to the surface of the first semiconductor film 124 and the like. As the catalytic element, one or more of tungsten (W), molybdenum (Mo), zirconium (Zr), hafnium (Hf), vanadium (V), niobium (Nb), tantalum (Ta), chromium (Cr), cobalt (Co), nickel (Ni), platinum (Pt) and the like can be used. Alternatively, the catalytic element may be directly added into the semiconductor film by an ion doping method or an ion implantation method. Further alternatively, the surface of the semiconductor film may be subjected to plasma treatment using an electrode formed of the aforementioned catalytic element. Here, a solution containing 1 to 200 ppm, or 10 to 150 ppm of the nickel is applied. Note that the catalytic element here indicates an element (metal catalyst) for accelerating or promoting crystallization of the semiconductor film.

Next, the first semiconductor film is heated to form a first crystalline semiconductor film 131 as shown in FIG. 1(D). In this case, silicide is formed in a portion of the semiconductor film that is in contact with the metal element for promoting crystallization of the semiconductor film, and crystallization progresses with the silicide as a crystal nucleus. Here, after the heat treatment for dehydrogenation (400 to 550° C. for 0.5 to 2 hours), heat treatment for crystallization (550 to 650° C. for 1 to 24 hours) is performed. Alternatively, crystallization may be performed by RTA or GRTA. Here, by performing crystallization without using laser irradiation, variations of crystallinity can be reduced, thereby variations in characteristics of TFTs formed later can be suppressed. In addition, since a ridge (depression/projection) which crystal-grows on the crystalline surface in a projecting manner is unlikely to be formed, the surface of the semiconductor region is relatively flat. Thus, a leak current which flows between the crystalline semiconductor film and the gate electrode with the gate insulating film interposed therebetween can be suppressed.

Next, a channel doping step is performed wholly or selectively in which a Group 3 element (Group 13 element, hereinafter referred to as an acceptor element) or a Group 5 element (Group 15 element, hereinafter referred to as a donor element) is added at a low concentration. This channel doping step is a step for controlling the threshold voltage of a TFT Here, boron is added by an ion doping method by exciting diborane ($B_2H_6$) with plasma without mass separation. Note that the ion implantation method for mass separation may be performed. Note also that the channel doping step may be performed before the crystallization step.

Next, a second semiconductor film 132 containing a donor element is formed with a thickness of 80 to 250 nm over the first crystalline semiconductor film 131. Here, it is deposited by a plasma CVD method using a silicon source gas containing a donor element such as phosphorus or arsenic. By forming the second semiconductor film with such a method, an interface is formed between the first crystalline semiconductor film and the second semiconductor film. Alternatively, the second semiconductor film 132 containing a donor element can be formed by forming a similar semiconductor film to the first semiconductor film and adding a donor element into the semiconductor film by an ion doping method or an ion implantation method. The phosphorus concentration of the second semiconductor film 132 is preferably $1\times10^{19}$ to $3\times10^{21}/cm^3$.

Further, the second semiconductor film 132 may be formed to have a stacked-layer structure by forming a low concentration region (hereinafter referred to as an $n^-$ region) on the side in contact with the first crystalline semiconductor film 131, and forming a high concentration region (hereinafter referred to as an $n^+$ region) thereover, by using the aforementioned plasma CVD method, ion doping method or ion implantation method. At this time, the concentration of the donor element in the $n^-$ region is preferably $1\times10^{17}$ to $3\times10^{19}/cm^3$, or preferably $1\times10^{18}$ to $1\times10^{19}/cm^3$ while the concentration of the donor element in the $n^+$ region is preferably 10 to 100 times as high as that of the donor element in the $n^-$ region. In addition, the $n^-$ region preferably has a thickness of 50 to 200 nm while the $n^+$ region preferably has a thickness of 30 to 100 nm, or preferably 40 to 60 nm. Here, in the second semiconductor film 132, a region between a dashed line and the first crystalline semiconductor film 131 is denoted by the $n^-$ region while a region on the surface side thereof is denoted by the $n^+$ region.

FIG. 26 shows profiles of an impurity in the second semiconductor film which contains the donor element at this time. FIG. 26(A) shows a profile 150*a* of a donor element when a second semiconductor film 132*a* containing a donor element is formed over the first crystalline semiconductor film 131 by a plasma CVD method. Here, the second semiconductor film 132*a* is formed by using two layers having different concentrations. That is, in the second semiconductor film 132*a*, a donor element is dispersed at a fixed concentration (first concentration) in the depth direction of the film from the surface to the interface between an $n^+$ region 144*a* and an $n^-$ region 144*b*. Meanwhile, a donor element is dispersed at a fixed concentration (second concentration) in the depth direction from the interface between the $n^+$ region 144*a* and the $n^-$ region 144*b* to the interface of the first crystalline semiconductor film 131. At this time, the first concentration is higher than the second concentration.

Meanwhile, FIG. 26(B) shows a profile 150*b* of a donor element when the second semiconductor film is formed by forming a semiconductor film having any state selected from an amorphous semiconductor, an SAS, a microcrystalline semiconductor and a crystalline semiconductor, and adding a donor element into the semiconductor film by an ion doping method or an ion implantation method. As shown in FIG. 26(B), in a second semiconductor film 132*b*, a region close to the surface has relatively a high concentration of the donor element. This region is denoted by the $n^+$ region 144*a*. On the other hand, the concentration of the donor element in the second semiconductor film 132*b* is relatively lower in the region closer to the first crystalline semiconductor film 131. A region of which concentration of donor element is $1\times10^{17}$ to $3\times10^{19}/cm^3$, or preferably $1\times10^{18}$ to $1\times10^{19}/cm^3$ is denoted by the $n^-$ region 144*b*. The concentration of the donor element in the $n^+$ region 144*a* is 10 to 100 times as high as that of the donor element in the $n^-$ region.

In FIGS. 26(A) and (B), the $n^+$ region 144*a* functions as a source region and a drain region later while the $n^-$ region 144*b* functions as an LDD region. Note that there is no interface between the $n^+$ region and the $n^-$ region, and the interface changes depending on the relative concentration of the donor element. As shown in FIG. 26, the second semiconductor film 132*b* containing the donor element formed by an ion doping method or an ion implantation method can be controlled in concentration profile depending on the doping conditions, thus each film thickness of the $n^+$ region and the $n^-$ region can be controlled appropriately.

Note that in the second semiconductor film 132, 132*a* or 132*b* containing a donor element, crystal lattice distortion is formed when a rare gas element, typically argon is added thereto. Therefore, a catalytic element can be gettered more efficiently in the subsequent gettering step.

Next, the first crystalline semiconductor film 131 and the second semiconductor film 132 are heated to move the catalytic element contained in the first crystalline semiconductor film 131 to the second semiconductor film 132 as shown by the arrows in FIG. 1(E), thereby gettering the catalytic element. According to this step, the concentration of the catalytic element in the first crystalline semiconductor film can be reduced to have no effect on the device characteristics, specifically the nickel concentration in the film can be reduced to $1\times10^{18}/cm^3$ or lower, or desirably $1\times10^{17}/cm^3$ or lower. Such a film is denoted by a second crystalline semiconductor film 141. In addition, the second semiconductor film to which the gettered catalytic element has moved is similarly crystallized; therefore, it is denoted by a third crystalline semiconductor film 142. Note that in this embodiment mode, the donor element in the third crystalline semiconductor film 142 is activated along with the gettering step.

Next, as shown in FIG. 1(F), a second mask 143 is formed over the third crystalline semiconductor film 142, and the third crystalline semiconductor film 142 and the second crystalline semiconductor film 141 are etched using the second mask, thereby forming a first semiconductor region 152 and a second semiconductor region 151 as shown in FIG. 2(A).

The second mask 143 is formed by forming an organic resin in a predetermined region by a droplet discharge method, a printing method or the like. Alternatively, similarly to the first mask, it may be formed by applying a photosensitive material, irradiating the photosensitive material with laser light for light exposure and developing it. By forming the second mask according to such a method, the area of a semiconductor region formed later can be reduced, thereby high integration of semiconductor elements can be achieved and the aperture ratio of a transmissive display device can be increased.

Note that in the formation step of a mask in the following embodiment modes and embodiments, it is preferable that an insulating film having a thickness of about several nanometers be formed over the surface of a semiconductor film or a semiconductor region before applying a photosensitive material onto the semiconductor film or the semiconductor region. According to such a step, it can be prevented that the semiconductor film or the semiconductor region directly contacts the photosensitive material, thereby intrusion of impurities into the semiconductor film can be prevented. Note that the insulating film may be formed by a method in which an oxidative solution such as ozone water is applied, a method in which the surface is irradiated with oxygen plasma or ozone plasma, or the like.

The third crystalline semiconductor film and the second crystalline semiconductor film can be etched using a chlorine source gas typified by $Cl_2$, $BCl_3$, $SiCl_4$, $CCl_4$ or the like, a fluorine source gas typified by $CF_4$, $SF_6$, $NF_3$, $CHF_3$ or the like, or an $O_2$ gas. The third crystalline semiconductor film is etched to form the first semiconductor region 152 while the second crystalline semiconductor film is etched to form the second semiconductor region 151.

Next, after removing the second mask, a third conductive layer is deposited with a thickness of 500 to 1500 nm, or preferably 500 to 1000 nm. Then, a photosensitive material is applied or discharged onto the third conductive layer, and is then irradiated with laser light using a laser beam direct writing system for light exposure and developed, thereby a third mask 161 as shown in FIG. 2(B) is formed. Here, a positive photosensitive material is used as the photosensitive material.

As a material of a third conductive layer 153, a composition in which a conductor is dissolved or dispersed in a solvent is used. The conductor may be metals such as Ag, Au, Cu, Ni, Pt, Pd, Ir, Rh, W, Al, Ta, Mo, Cd, Zn, Fe, Ti, Si, Ge, Zr or Ba, fine particles of silver halide or the like, or dispersive nanoparticles. In addition, the third conductive layer may be formed by stacking conductive layers formed of such materials. The third conductive layer functions as a wiring. In order to reduce the wiring resistance, a low-resistant material is preferably employed.

Here, a composition discharged from a discharge head is preferably one of gold, silver, and copper which is dissolved or dispersed into a solvent in consideration of the resistivity, or more preferably silver or copper which is low resistant and inexpensive. Note that when using copper, a barrier film is preferably provided before forming the third conductive layer 153 as a measure against impurities. As the solvent, an organic solvent may be used, such as ester such as butyl acetate or ethyl acetate, alcohol such as isopropyl alcohol or ethyl alcohol, methyl ethyl ketone, or acetone.

As the barrier film in the case of using copper as the wiring, an insulating film containing nitrogen is preferably used, such as silicon nitride, silicon oxynitride, aluminum nitride, titanium nitride or tantalum nitride, or a conductive substance, which may be formed by a droplet discharge method.

Note that the viscosity of the composition used in the droplet discharge method is preferably 5 to 20 mPa·s, which can prevent drying and also can allow compositions to be discharged smoothly from the discharge head. The surface tension is preferably not higher than 40 mN/m. However, the viscosity and the like of the composition may be appropriately controlled in accordance with the solvent or the intended purpose. For example, it is preferable that the viscosity of a composition in which silver is dissolved or dispersed into a solvent be 5 to 20 mPa·S while the viscosity of a composition in which gold is dissolved or dispersed into a solvent be 10 to 20 mPa·S.

The step for discharging a composition may be performed under a low pressure. This allows the subsequent drying and baking steps to be omitted or shortened since a solvent of a composition evaporates during the period after the composition is discharged until it is landed on the processing object. After discharging the composition, one or both of the drying and baking steps are performed by laser irradiation, rapid thermal annealing, a heating furnace or the like under a normal pressure or a low pressure depending on the material of the solvent. The drying and baking steps both correspond to the heat treatment steps; however, the object, temperature and time thereof are different from each other. For example, the drying step is performed at 100° C. for 3 minutes while the baking step is performed at 200 to 350° C. for 15 to 120 minutes. In order to perform the drying and baking steps favorably, the substrate may be heated in advance, and the temperature at this time is generally 100 to 800° C. (preferably, 200 to 350° C.) though it depends on the material of the substrate and the like. According to the present step, a solvent of the solution is evaporated while the surrounding resin is cured and shrunk, thereby accelerating the fusion and welding of the conductor. The atmosphere is set at an oxygen atmosphere, a nitrogen atmosphere or air. Above all, the oxygen atmosphere is preferable since a solvent in which a metal element is dissolved or dispersed can be easily removed.

The laser irradiation may be carried out by using a continuous wave or pulsed gas laser or a solid-state laser. The former gas laser includes an excimer laser, a YAG laser, and the like while the latter solid-state laser includes a laser using such crystals as YAG or $YVO_4$ doped with Cr, Nd or the like. Note that the continuous wave laser is preferably employed in view of the absorptivity of laser light. In addition, a so-called hybrid laser irradiation method which combines the pulse oscillation and continuous oscillation may be employed. Note that depending on the heat resistance of the substrate, the heat treatment by laser irradiation is preferably carried out instantaneously for several microseconds to several ten seconds. The rapid thermal annealing (RTA) is performed by instantaneously applying heat for several micro seconds to several minutes by rapidly increasing the temperature using an infrared lamp or using a halogen lamp for emitting the ultraviolet to infrared light under the inert gas atmosphere. This treatment is performed instantaneously; therefore, such an advantage can be provided that only a thin film on the outmost surface can be heated substantially without affecting the film in the lower layer.

Here, a composition containing Ag (hereinafter referred to as an "Ag paste") is selectively discharged, which is then appropriately dried and baked by laser beam irradiation or heat treatment as set forth above, thereby forming a third conductive layer having a thickness of 600 to 800 nm. At this time, the conductive layer is formed by conductive fine particles which are irregularly overlapping one another in three dimensions. That is, the conductive layer is formed by three dimensional aggregate particles. Therefore, the surface thereof has minute depressions/projections. In addition, due to the heat of the conductive layer and the heating time thereof, the fine particles are baked and thus the grain size of the particles is increased; therefore, the surface of the conductive layer has a large difference of elevation.

Note that a region in which the fine particles are fused may have a polycrystalline structure.

Note also that when the baking is performed in an $O_2$ atmosphere, an organic substance such as a binder (heat curable resin) contained in the Ag paste is decomposed, thereby an Ag film containing few organic substances can be obtained. Further, the surface of the film can be smoothed by using a pressing machine or the like.

In the formation step of a conductive film in the following embodiment modes and embodiments, in the case of forming an insulating film over the surface of a semiconductor film at a step of applying or discharging a photosensitive resin, the insulating film is preferably etched before depositing the conductive film in order to reduce the contact resistance.

Next, the third conductive layer is etched into a desired shape using the third mask 161 to form fourth conductive layers 162 and 163 and fourth conductive layers 167 and 169 shown in FIGS. 3(B) and (C). The fourth conductive layer 162 functions as a power source line and a capacitor wiring while the fourth conductive layer 163 functions as a source electrode or a drain electrode of a driving TFT. The fourth conductive layer 167 shown in FIG. 3(C) functions as a source wiring while the fourth conductive layer 169 functions as a source electrode or a drain electrode of the switching TFT. At this time, by performing etching so that the third conductive layer is sectioned to form each wiring and each electrode as well as to narrow a width of the source wiring or drain wiring, the aperture ratio of a transmissive display device formed later can be increased.

Next, an exposed portion of the first semiconductor region 152 is etched using the third mask 161 to form third semiconductor regions 164 and 165 functioning as a source region and a drain region. At this time, the second semiconductor region 151 may be partially over-etched. The over-etched second semiconductor region is denoted by a fourth semiconductor region 166. The fourth semiconductor region 166 functions as a channel forming region of a driving TFT. In addition, through similar steps, a fourth semiconductor region 168 functioning as a channel forming region of a switching TFT shown in FIG. 3(B) is also formed.

Next, after removing the third mask, a second insulating film 171 functioning as a passivation film is preferably deposited with a thickness of 100 to 300 nm over the surface of the fourth conductive layers 162 and 163 and the fourth semiconductor region 166 as shown in FIG. 2(C). The passivation film can be formed by a thin film formation method such as a plasma CVD method or a sputtering method using silicon nitride, silicon oxide, silicon nitride oxide, silicon oxynitride, aluminum oxynitride, aluminum oxide, diamond-like carbon (DLC), carbon containing nitrogen (CN), or other insulating films. Note that the passivation film may have either a single-layer structure or a stacked-layer structure. Here, in view of the interfacial property with the fourth semiconductor region 166, it is preferable that silicon oxide or silicon oxynitride be formed first, and a silicon nitride film or a silicon nitride oxide film be deposited thereover.

After that, the fourth semiconductor region is preferably hydrogenated by heating in a hydrogen atmosphere or a nitrogen atmosphere. Note that in the case of heating in the nitrogen atmosphere, the third insulating film is preferably formed using an insulating film containing hydrogen.

According to the aforementioned steps, an inversely staggered TFT having a crystalline semiconductor film can be formed.

Next, a third insulating film 172 is formed with a thickness of 500 to 1500 nm over the second insulating film 171. The third insulating film can be formed using an inorganic insulating material such as silicon oxide, silicon nitride, silicon oxynitride, aluminum oxide, aluminum nitride and aluminum oxynitride; heat-resistant polymers such as acrylic acid, methacrylic acid, derivatives thereof, polyimide, aromatic polyamide and polybenzimidazole; an insulating material such as an inorganic siloxane polymer typified by a silica glass which is formed using a siloxane polymer material as a starting material, and is compound of silicon, oxygen and hydrogen to have a Si—O—Si bond or an organic siloxane polymer typified by an alkylsiloxane polymer, an alkylsilsesquioxane polymer and a hydrogenated silsesquioxane polymer, of which hydrogen bound to silicon is substituted with an organic group such as methyl or phenyl. The third insulating film is formed by a known method such as a CVD method, a coating method or a printing method. Note that when the coating method is employed, the surface of a fourth insulating layer can be planarized. Here, the fourth insulating film is formed by applying an acrylic resin by the coating method and baking it.

Note that in the case where the third insulating film 172 has a thickness which generates no parasitic capacitance between a sixth conductive layer 175 formed later and the fourth conductive layers 162 and 163, the third insulating film 172 is not necessarily required.

Next, after forming a fourth mask (not shown) over the third insulating film 172, the third insulating film 172 and the second insulating film 171 are partially etched to expose the second conductive layer 122*a* functioning as the gate electrode of the switching TFT. Then, after removing the fourth mask, a fifth conductive layer 173 is formed with a thickness of 500 to 1500 nm, or preferably 500 to 1000 nm. The fifth conductive layer 173 functions as a gate wiring.

The fourth mask can be formed by using similar method and material to the second mask 143. The fifth conductive layer 173 can be formed using similar material and formation method to the third conductive layer 153. Note that in order to suppress the wiring resistance, a low-resistant material is preferably employed. Further, the fifth conductive layer 173 may be etched to have a thin line width by using a mask which is formed using a laser beam direct writing system similarly to the first conductive layer. According to this step, the area of the wiring which occupies the pixels can be reduced, thereby the aperture ratio of a transmissive display device can be improved. Here, an Ag paste is discharged, dried and baked to form the fifth conductive layer.

According to the aforementioned steps, a driving TFT 191 as shown in FIG. 3(A) and FIG. 3(C) can be formed, which has the second conductive layer 121, the first insulating film 123 functioning as a gate insulating film, the fourth semiconductor region 166 functioning as a channel forming region, the third semiconductor regions 164 and 165 functioning as a source region or a drain region, the fourth conductive layer 162 functioning as a power source line, and the fourth conductive layer 163 functioning as a source electrode or a drain electrode.

In addition, a switching TFT 192 as shown in FIG. 3(B) and FIG. 3(C) can be formed, which has the second conductive layer 122*a,* the first insulating film 123 functioning as a gate insulating film, the fourth semiconductor region 168 functioning as a channel forming region, the third semiconductor region functioning as a source region or a drain region, the fourth conductive layer 167 functioning as a source wiring, and the fourth conductive layer 169 functioning as a source electrode or a drain electrode.

Note that as shown in FIG. 3, the second conductive layer 169 functioning as the source electrode or the drain electrode of the switching TFT 192 is connected to the second conductive layer 121 functioning as the gate electrode of the driving TFT 191. In addition, reference numeral 122*a* functioning as the gate electrode of the switching TFT 192 is connected to the fifth conductive layer 173 functioning as the gate wiring.

Next, a fourth insulating film 174 is formed over the fifth conductive layer 173 and the third insulating film 172. The fourth insulating film 174 can be formed using a similar material to the third insulating film 172.

Then, after forming a fifth mask (not shown) over the fourth insulating film 174, the fourth insulating film 174, the third insulating film 172 and the second insulating film 171 are partially etched to partially expose the fourth conductive layer 163. Then, after removing the fifth mask, a sixth conductive layer 175 functioning as a pixel electrode is formed with a thickness of 100 to 200 nm. The fifth mask can be formed using similar method and material to the second mask 143.

As a method for forming the sixth conductive layer 175, a droplet discharge method, a sputtering method, a vapor deposition method, a CVD method, a coating method or the like is appropriately used. By using the droplet discharge method, the sixth conductive layer can be formed selectively. In the case of using the sputtering method, the vapor deposition method, the CVD method, the coating method or the like, a mask is formed first similarly to the second conductive layer, and then the sixth conductive layer is formed by etching the conductive film with the mask.

Note that although a conductive layer functioning as a gate wiring is formed as the fifth conductive layer 173 and a conductive layer functioning as a first pixel electrode is formed as the sixth conductive layer 175, the invention is not limited to these. A conductive layer functioning as a gate wiring may be formed after forming a conductive layer functioning as a pixel electrode.

According to the aforementioned steps, an active matrix substrate can be formed.

Then, as shown in FIG. 2(D), a fifth insulating layer 181 is formed over the sixth conductive layer 175 and the fourth insulating layer 174. The fifth insulating layer 181 functions as a partition layer (all referred to as an embankment or a bank) surrounding edges of the sixth conductive layer 175. The fifth insulating layer 181 is formed of an organic material, and either of a photosensitive or non-photosensitive material may be used. If a photosensitive material is used, the side face thereof has a continuously variable curvature radius, which allows a layer containing a light-emitting substance formed later to be formed without breaking due to steps. In particular, when a negative photosensitive material is used, an upper end of the sixth insulating layer 181 can be provided with a curved surface with a first curvature radius while a lower end of the fifth insulating layer 181 can be provided with a curved surface with a second curvature radius. It is preferable that the first and second curvature radius be 0.2 to 3 μm, and the angle of gradient at a cross section of the fifth insulating layer 181 be 35 degrees or larger. Meanwhile, when a positive photosensitive material is used, only an upper end of the fifth insulating layer 181 is provided with a curved surface with a curvature radius. The cross-sectional structure shown here is the case where a negative photosensitive material is used.

Then, a layer 182 containing a light-emitting substance, and a seventh conductive layer 183 are formed over the sixth conductive layer 175 and the fifth insulating layer 181. The seventh conductive layer 183 functions as the second pixel electrode. The sixth conductive layer 175 functioning as the first pixel electrode and the seventh conductive layer 183 functioning as a second pixel electrode are required to be selected in consideration of the work function. Note that either the first pixel electrode or the second pixel electrode may function as an anode or a cathode depending on the pixel structure. In the case where the polarity of the driving TFT is a p-channel type, it is preferable that the first pixel electrode be an anode while the second pixel electrode be a cathode. In the case where the conductivity of the driving TFT is an n-channel type, it is preferable that the first pixel electrode be a cathode while the second pixel electrode be an anode.

As a material of the anode, a conductive material having a high work function is preferably employed. If light is to be extracted from the anode side, a transparent conductive material (indium tin oxide (ITO), indium tin oxide containing silicon oxide, zinc oxide (ZnO) or tin oxide ($SnO_2$)), indium zinc oxide (IZO), gallium-doped zinc oxide (GZO) or the like may be employed. Meanwhile, if light is blocked at the anode side, a single-layer film may be employed such as TiN, ZrN, Ti, W, Ni, Pt, Cr or Al as well as a stacked-layer structure of titanium nitride and a film containing aluminum as a main component, a three-layer structure of a titanium nitride film, a film containing aluminum as a main component and a titanium nitride film, or the like. Alternatively, a method for stacking a transparent conductive material over the aforementioned light-shielding film may be employed.

As the material of the cathode, a conductive material having a low work function is preferably employed. Specifically, the cathode can be formed using alkaline metals such as Li or Cs, alkaline earth metals such as Mg, Ca or Sr, alloys thereof (Mg:Ag, Al:Li or the like), or rare earth metals such as Yb or Er. Alternatively, a metal material such as Au (gold), Cu (copper), W (tungsten), Al (aluminum), Ti (titanium) or tantalum (Ta), a metal material containing the aforementioned metal and nitrogen at a concentration of the stoichiometric composition or lower, or nitride of such metals may be used, for example such as titanium nitride (TiN), tantalum nitride (TaN), aluminum containing 1 to 20% of nickel.

In the case where light is extracted from the cathode side, the cathode may be formed to have a stacked-layer structure using an alkaline metal such as Li or Cs, an ultra thin film containing an alkaline earth metal such as Mg, Ca or Sr, and a transparent conductive film (transparent conductive material (indium tin oxide (ITO), indium tin oxide containing silicon oxide (ITO), zinc oxide (ZnO), tin oxide ($SnO_2$)), indium zinc oxide (IZO), gallium-doped zinc oxide (GZO) or the like). Alternatively, an electron injection layer in which an alkaline metal or an alkaline earth metal is co-deposited with an electron transporting material may be formed first, and then a transparent conductive film may be stacked thereover.

Note that ITO containing silicon oxide which can be used as the sixth conductive layer 175 or the seventh conductive layer 183 is a material which is not easily crystallized by electrical conduction or heat treatment, and has high surface flatness.

Here, an n-channel TFT is used as the driving TFT; therefore, the sixth conductive layer 175 is formed to have a stacked-layer structure having a bottom layer formed of tantalum nitride (TaN) and a top layer formed of ITO containing silicon oxide. The seventh conductive layer 183 is formed using ITO containing silicon oxide.

Here, since the n-channel TFT is used as the driving TFT, the layer 182 containing a light-emitting substance is formed by stacking an EIL (electron injection layer), an ETL (electron transporting layer), an EML (light-emitting layer), an HTL (hole transporting layer) and an HIL (hole injection layer) in this order from the sixth conductive layer 175 (cathode) side. Note that the layer containing a light-emitting substance may have a single-layer structure or a mixed-layer structure as well as the stacked structure.

In order to protect light-emitting elements from damage such as moisture or degasification, a protective film 185 for covering the seventh conductive layer 183 is preferably provided. The protective film 185 is preferably formed using a dense insulating film (SiN, SiNO film or the like) formed by a PCVD method, a dense inorganic insulating film (SiN, SiNO film or the like) formed by a sputtering method, a thin film containing carbon as a main component (DLC film, CN film or amorphous carbon film), a metal oxide film ($WO_2$, $CaF_2$ or $Al_2O_3$ or the like) or the like.

Note that a light-emitting element 184 is formed to have the sixth conductive layer 175 functioning as the first pixel electrode, the layer 182 containing a light-emitting substance and the seventh conductive layer 183 functioning as the second pixel electrode.

An inversely staggered TFT formed in this embodiment mode has a gate electrode which is formed using a highly heat-resistant material. Meanwhile, wirings such as a source wiring and a gate wiring are formed using a low-resistant material after applying heat treatment such as an activation step, a gettering step and a crystallization step. Therefore, a TFT with crystallinity can be formed to have less impurity metal elements and low wiring resistance. In addition, in the display device of the invention, the pixel electrode can be formed over the insulating film, thereby the aperture ratio can be increased.

Thus, since the inversely staggered TFT of this embodiment mode is formed using a crystalline semiconductor film, higher mobility can be obtained as compared to an inversely staggered TFT formed of an amorphous semiconductor film. In addition, a source region and a drain region contain a catalytic element in addition to a donor element. Therefore, a source region and a drain region having low contact resistance with a semiconductor region can be formed. As a result, a semiconductor device which requires high speed operation can be fabricated.

In addition, in comparison with a TFT formed of an amorphous semiconductor film, variations of the threshold are less likely to occur, which results in the decrease in variations of the TFT characteristics. Therefore, in comparison with a display device using a TFT formed of an amorphous semiconductor film as a switching element, display unevenness can be reduced.

Further, as the metal element mixed into the semiconductor film at the deposition phase is gettered by a gettering step, the off current can be reduced. By providing such a TFT as a switching element of the display device, the contrast can be improved.

Further, in this embodiment mode, a thin film material or a resist may be discharged to a predetermined position using a droplet discharge method without the need of depositing a thin film over the whole surface of a substrate. Thus, TFTs can be formed without using photomasks. Therefore, the throughput and yield can be improved as well as the cost reduction can be achieved.

EMBODIMENT MODE 2

In this embodiment mode, description is made with reference to FIG. 3 on a stacked-layer structure of a power source line, a source wiring, a source electrode or drain electrode, a gate wiring, and a pixel electrode of the active matrix substrate shown in Embodiment Mode 1. An embodiment mode below shows vertical cross-sectional views and a top view corresponding to FIG. 2(C) before the formation of the light-emitting element.

FIG. 3(A) is a view showing a stacked-layer structure of the driving TFT 191 and the fifth conductive layer functioning as a gate wiring of the switching TFT 192, which corresponds to the cross-sectional structure along A-B of FIG. 3(C).

FIG. 3(B) is a view showing a connection structure of the switching TFT 192 and the driving TFT 191, which corresponds to the cross-sectional structure along C-D of FIG. 3(C).

Hereinafter, the fourth conductive layer functioning as a power source line and a capacitor wiring is denoted by a power source line 162*a*, the fourth conductive layer functioning as a source wiring is denoted by a source wiring 167, the fourth conductive layer functioning as a source electrode or a drain electrode is denoted by drain electrodes 163 and 169, the fifth conductive layer functioning as a gate wiring is denoted by a gate wiring 173, the second conductive layer functioning as a gate electrode is denoted by gate electrodes 121 and 122*a*, and the sixth conductive layer functioning as a pixel electrode is denoted by a pixel electrode 175.

As shown in FIG. 3(A), the first insulating film 123 is formed over the gate electrode 121 of the driving TFT 191 and the gate electrode 122*a* of the switching TFT 192. The source wiring 167, and the drain electrode 163, the power source line 162*a* and the fourth semiconductor region 166 of the driving TFT 191 are formed over the first insulating film 123.

Over all of the source wiring 167, the drain electrode 163, the power source line 162*a* and the fourth semiconductor region 166 of the driving TFT 191, and the first insulating film 123, the second insulating film 171 and the third insulating film 172 are formed. Over the third insulating film 172, the gate wiring 173 connected to the gate electrode 122*a* of the switching TFT 192 is formed. That is, each of the power source line 162*a* of the driving TFT 191 and the source wiring 167 of the switching TFT intersects with the gate wiring 173 with the second insulating film 171 and the third insulating film 172 interposed therebetween.

Over all of the gate wiring 173 and the third insulating film 172, the fourth insulating film 174 is formed. Over the fourth insulating film, the pixel electrode 175 is formed. That is, the gate wiring 173 and the pixel electrode 175 are formed to interpose the fourth insulating film therebetween. The fourth insulating film 174 over which the pixel electrode 175 is formed is formed of a planarizing layer; therefore, breaking due to steps of a layer containing a light-emitting substance which is formed later can be suppressed, thereby a display device with few defects can be formed.

Note that the power source line 162*a*, the first insulating film 123 and the gate electrode 121 form a capacitor 193.

As shown in FIG. 3(B), the first insulating film 123 is formed over the gate electrode 122*a* of the switching TFT 192. Over the first insulating film 123, the fourth semiconductor region 168, the source wiring 167 and the drain electrode 169 are formed. The drain electrode 169 of the switching TFT 192 is connected to the gate electrode 121 of the driving TFT 191 with the first insulating film 123 interposed therebetween. In addition, the driving TFT 191 and the switching TFT 192 are covered with the pixel electrode 175, with the second insulating film 171, the third insulating film 172 and the fourth insulating film 174 interposed therebetween.

EMBODIMENT MODE 3

In this embodiment mode, description is made with reference to FIG. 4 on an active matrix substrate having a different stacked-layer structure of a gate wiring and a source wiring from Embodiment Mode 2.

FIG. 4(A) is a view showing a stacked-layer structure of the driving TFT 191 and the gate wiring of the switching TFT 192, which corresponds to the cross-sectional structure along A-B of FIG. 4(C).

Over the first insulating film 123, similarly to Embodiment Mode 2, the gate electrode 121 of the driving TFT 191 and the gate electrode 122*a* of the switching TFT 192 are formed, over which the first insulating film 123 is formed. Over the first insulating film 123, the source wiring 167 is formed as well as the drain electrode 163, the power source line 162*a* and the fourth semiconductor region 166 of the driving TFT 191.

In addition, a gate wiring 1113 is formed over the first insulating film 123 in this embodiment mode.

In addition, a second insulating film 1114 is formed over the source wiring 167, and over the second insulating film 1114, the gate wiring 1113 is formed. That is, the source wiring intersects with the gate wiring 1113 with the second insulating film 1114 interposed therebetween. Here, the second insulating film 1114 is formed by a droplet discharge method or a printing method.

In this embodiment mode, the second insulating film 1114 is provided only in a region where each of the source wiring and the capacitor wiring intersects with the gate wiring. Therefore, it is formed only partially unlike Embodiment Mode 2, and thus materials can be reduced as well as the cost reduction can be achieved.

Over the source wiring 167, the drain electrode 163, the power source line 162*a* and the fourth semiconductor region 166 of the driving TFT 191, the first insulating film 123 and the gate wiring 1113, a third insulating film 1111 functioning as a passivation film is formed.

Over the third insulating film 1111, a fourth insulating film 1112 is formed, and the pixel electrode 175 is formed to be connected to the drain electrode 163 with the fourth insulating film 1112 interposed therebetween.

FIG. 4(B) is a view showing a connection structure of the switching TFT 192 and the driving TFT 191, which corresponds to the cross-sectional structure along C-D of FIG. 4(C).

As shown in FIG. 4(B), the switching TFT 192 is formed similarly to Embodiment Mode 2, and the drain electrode 169 of the switching TFT 192 is connected to the gate electrode 121 of the driving TFT 191 with the first insulating film 123 interposed therebetween. In addition, the driving TFT 191 and the switching TFT 192 are covered with the pixel electrode 175 with the third insulating film 1111 and the fourth insulating film 1112 interposed therebetween.

EMBODIMENT MODE 4

In this embodiment mode, description is made with reference to FIG. 5 on an active matrix substrate having a different structure of a gate wiring from Embodiment Mode 2.

FIG. 5(A) is a view showing a stacked-layer structure of the driving TFT 191 and the gate wiring of the switching TFT 192, which corresponds to the cross-sectional structure along A-B of FIG. 5(C).

FIG. 5(B) is a view showing a connection structure of the switching TFT 192 and the driving TFT 191, which corresponds to the cross-sectional structure along C-D of FIG. 5(C).

In this embodiment mode, the structures of the driving TFT 191, the switching TFT 192 and the capacitor 193 are similar to those in Embodiment Mode 2. Note that as shown in FIG. 5(C), gate wirings 1123*a* and 1123*b* are formed in each pixel, and connected to gate electrodes 122*a* and 122*b* which are provided in adjacent pixels. Therefore, the material of the gate wirings 1123*a* and 1123*b* is not specifically required to be a low-resistant material, and thus the selection range of the material can be widened.

Over all of the gate wirings 1123*a* and 1123*b* and the third insulating film 172, the fourth insulating film 174 is formed, and over the fourth insulating film, the pixel electrode 175 may be formed. That is, the pixel electrode 175 may be formed to partially cover the gate wirings 1123*a* and 1123*b* with the fourth insulating film interposed therebetween.

EMBODIMENT MODE 5

In this embodiment mode, description is made with reference to FIG. 6 on an active matrix substrate having a different stacked-layer structure of a gate wiring and a source wiring from Embodiment Mode 3.

FIG. 6(A) is a view showing a stacked-layer structure of the driving TFT 191 and the gate wiring of the switching TFT 192, which corresponds to the cross-sectional structure along A-B of FIG. 6(C).

FIG. 6(B) is a view showing a connection structure of the switching TFT 192 and the driving TFT 191, which corresponds to the cross-sectional structure along C-D of FIG. 6(C).

In this embodiment mode, the structures of the driving TFT 191, the switching TFT 192 and the capacitor 193 are similar to those in Embodiment Mode 3. Note that as shown in FIG. 6(C), gate wirings 1133*a* and 1133*b* are formed in each pixel, and connected to the gate electrodes 122*a* and 122*b* which are provided in adjacent pixels. Therefore, the material of the gate wirings 1133*a* and 1133*b* is not specifically required to be a low-resistant material, and thus the selection range of the material can be widened.

A second insulating film 1137 is provided only in a region where the source wiring intersects with the gate wirings 1133*a* and 1133*b*. Therefore, the gate wirings 1133*a* and 1133*b* are formed over the second insulating film 1137 and the first insulating film 123.

In this embodiment mode, the second insulating film 1137 is formed only partially unlike Embodiment Mode 2 and Embodiment Mode 4; therefore, materials can be reduced as well as the cost reduction can be achieved.

Over the driving TFT 191, the switching TFT 192 and the capacitor 193, a third insulating film 1131 is provided as a passivation film. Over the third insulating film, the fourth insulating film 1112 is formed. The drain electrode 163 of the driving TFT 191 is covered with the pixel electrode 175 with the third insulating film 1111 and the fourth insulating film 1112 interposed therebetween.

The driving TFT 191 and the switching TFT 192 are covered with the pixel electrode 175 with the third insulating film 1111 and the fourth insulating film 1112 interposed therebetween.

EMBODIMENT MODE 6

In this embodiment mode, description is made with reference to FIG. 7 on an active matrix substrate having a different stacked-layer structure of a gate wiring and a source wiring from Embodiment Modes 2 to 5.

FIG. 7(A) is a view showing a stacked-layer structure of the driving TFT 191 and the gate wiring of the switching TFT 192, which corresponds to the cross-sectional structure along A-B of FIG. 7(C).

FIG. 7(B) is a view showing a connection structure of the switching TFT 192 and the driving TFT 191, which corresponds to the cross-sectional structure along C-D of FIG. 7(C).

In this embodiment mode, the structures of the driving TFT 191, the switching TFT 192 and the capacitor 193 are similar to those in Embodiment Mode 2.

In this embodiment mode, gate wirings 1143*a* and 1143*b* are formed simultaneously with the power source lines 162*a* and 162*b*, the source wiring 167 and the drain electrodes 163 and 169, unlike Embodiment Modes 2 to 5.

Specifically, as shown in FIG. 7(A), the first insulating film 123 is formed over the gate electrodes 121 and 122*a*. Over the first insulating film 123, gate wirings 1141*a* and 1141*b* are formed simultaneously with the source wiring 167, the drain electrode 163 of the driving TFT 191 and the power source lines 162*a* and 162*b*. In addition, the fourth semiconductor region 166 is formed.

Note that the gate wirings 1141*a* and 1141*b* are provided in each pixel, and do not intersect with the source wiring. Therefore, in the case of forming such electrodes and wirings by a droplet discharge method, they can be formed simultaneously, thereby the mass productivity can be improved.

Over all of the source wiring 167, the drain electrode 163 of the driving TFT 191, the power source lines 162*a* and 162*b*, and the gate wirings 1141*a* and 1141*b*, the second insulating film 171 and the third insulating film 172 are formed. Over the third insulating film 172, the conductive layer 1143*a* is formed to be connected to the gate wirings 1141*a* and 1141*b*. That is, the power source lines 162*a* and 162*b*, and the source wiring 167 intersect with the gate wirings 1141*a* and 1141*b*, and the conductive layers 1143*a* and 1143*b* with the second insulating film 171 and the third insulating film 172 interposed therebetween.

In addition, the fourth insulating film 174 is formed over the whole surface of the conductive layers 1143*a* and 1143*b* and third insulating film 172. Over the fourth insulating film, the pixel electrode 175 is formed.

EMBODIMENT MODE 7

In this embodiment mode, description is made with reference to FIG. 8 on an active matrix substrate having a different stacked-layer structure of a gate wiring and a source wiring from Embodiment Modes 6.

FIG. 8(A) is a view showing a stacked-layer structure of the driving TFT 191 and the gate wiring of the switching TFT 192, which corresponds to the cross-sectional structure along A-B of FIG. 8(C).

FIG. 8(B) is a view showing a connection structure of the switching TFT 192 and the driving TFT 191, which corresponds to the cross-sectional structure along C-D of FIG. 8(C).

In this embodiment mode, the structures of the driving TFT 191, the switching TFT 192 and the capacitor 193 are similar to those in Embodiment Mode 3.

Here, the gate wirings 1141*a* and 1141*b* do not intersect with each of the source wiring 167, the drain electrode 163 of the driving TFT 191 and the power source lines 162*a* and 162*b* similarly to Embodiment Mode 6. Therefore, in the case of forming these using a droplet discharge method, they can be formed simultaneously, thereby the mass productivity can be improved. In addition, the gate wirings 1141*a* and 1141*b* are formed in each pixel, and connected to the gate electrodes 122*a* and 122*b* which are provided in adjacent pixels. Therefore, the material of the gate wirings 1141*a* and 1141*b* is not specifically required to be a low-resistant material, and thus the selection range of the material can be widened.

In this embodiment mode, a second insulating layer 1154 is provided only in a region where the source wiring 167 and the power source line 162*b* intersect with the gate wirings 1141*a* and 1141*b*. Therefore, it is formed only partially unlike Embodiment Mode 2, Embodiment Mode 4 and Embodiment Mode 6. Thus, materials can be reduced as well as the cost reduction can be achieved.

Over the gate wirings 1141*a* and 1141*b* and the second insulating layer 1154, conductive layers 1153*a* and 1153*b* are formed. Note that the conductive layers 1153*a* and 1153*b* are connected to the gate wirings 1141*a* and 1141*b*.

Over the driving TFT 191, the switching TFT 192 and the capacitor 193, the third insulating film 1131 is provided as a passivation film. Over the third insulating film, the fourth insulating film 1112 is formed. In addition, the drain electrode 163 of the driving TFT 191 is connected to the pixel electrode 175 with the third insulating film 1111 and the fourth insulating film 1112 interposed therebetween.

The driving TFT 191 and the switching TFT 192 are covered with the pixel electrode 175 with the third insulating film 1111 and the fourth insulating film 1112 interposed therebetween.

EMBODIMENT MODE 8

In this embodiment mode, description is made with reference to FIG. 9 on an active matrix substrate having a different stacked-layer structure of a gate wiring and a source wiring.

FIG. 9(A) is a view showing a stacked-layer structure of the driving TFT 191 and the gate wiring of the switching TFT 192, which corresponds to the cross-sectional structure along A-B of FIG. 9(C).

FIG. 9(B) is a view showing a connection structure of the switching TFT 192 and the driving TFT 191, which corresponds to the cross-sectional structure along C-D of FIG. 9(C).

A shown in FIG. 9(A), after removing the first insulating film over the gate electrode 122*a* of the switching TFT 192, a second insulating film 1162*b* is formed over the gate electrode 122*a*. At this time, the second insulating film 1162*b* is preferably formed to expose opposite ends of the gate electrode 122*a*.

In etching the second insulating film 1162*b* over the gate electrode 122*a,* it is preferable to remove the gate insulating film in a region excluding the region where the driving TFT 191, the switching TFT 192 and the capacitor 193 are formed. Specifically, only a region of the gate insulating film that is surrounded by dashed lines 1166*a* and 1166*b* is preferably left while etching the gate insulating film outside the dashed lines 1166*a* and 1166*b*. According to this step, the contact area of each conductive layer is increased to suppress the contact resistance, thereby a switching TFT and a driving TFT capable of high speed operation can be formed.

Next, over the second insulating film 1162*b,* gate wirings 1161*a* and 1161*b* in contact with the gate electrode 122*a* are formed simultaneously with the power source lines 162*a* and 162*b* and the source wiring 167. With such a structure, the contact resistance of the gate electrode and the gate wiring can be suppressed. In addition, these power source lines and source wiring do not intersect with the gate wiring. Therefore, in the case of forming these using a droplet discharge method, they can be formed simultaneously, thereby the mass productivity can be improved.

Note that the connection structure of the gate electrode 122*a* and the gate wirings 1161*a* and 1161*b* as in this embodiment mode can be applied to each of Embodiment Mode 2 to 7.

In this embodiment mode, the gate wirings 1161*a* and 1161*b* formed in each pixel are electrically connected to each other through the gate electrodes 122*a* and 122*b*. In addition, the gate wiring intersects with the source wiring with the second insulating film 1162*b* formed over the gate electrode 122*a* interposed therebetween.

In this embodiment mode, the second insulating film 1162*b* is provided only in a region where the source wiring and the power source line intersect with the gate wirings. Therefore, it is formed only partially, and thus materials can be reduced as well as the cost reduction can be achieved.

EMBODIMENT MODE 9

In this embodiment mode, description is made with reference to FIG. 10 to FIG. 12 and FIG. 26 on fabrication steps of an active matrix substrate which uses an inversely staggered TFT having a crystalline semiconductor film as an element for driving a liquid crystal element.

As shown in FIG. 10(A), the first conductive layer 102 is formed over the substrate 101 similarly to Embodiment Mode 1, and the photosensitive materials 103 and 104 are applied or discharged onto the first conductive layer, and then dried and baked. Then, the photosensitive materials 103 and 104 are irradiated with the laser light 105 and 106 respectively to form the first masks 111 and 112 as shown in FIG. 10(B). Here, a laser beam direct writing system is used as a means for irradiating the photosensitive materials 103 and 104 with the laser light 105 and 106 respectively.

Then, as shown in FIG. 10(C), the first conductive layer 102 is etched using the first mask similarly to Embodiment Mode 1 to form the second conductive layers 121*a* and 122*a*. The second conductive layer 121*a* functions as a gate electrode and the second conductive layer 122*a* is a region connected to a gate wiring in a gate electrode (hereinafter denoted by a connection portion of the gate electrode). Note that in FIG. 10(C), the second conductive layers 121*a* and 122*a* are shown as being sectioned; however, they are actually connected to be in the same region as shown in FIG. 12(C).

Then, after removing the first mask similarly to Embodiment 1, the first insulating film 123 is formed with a thickness of 10 to 200 nm, or preferably 50 to 100 nm. Over the first insulating film, the first semiconductor region 124 with a thickness of 50 to 250 nm and the layer 125 containing a catalytic element are formed over the semiconductor film in this order.

Then, similarly to Embodiment Mode 1, the first semiconductor film is heated to form the first crystalline semiconductor film 131 as shown in FIG. 10(D). In this case, silicide is formed in a portion of the semiconductor film that is in contact with the metal element for promoting crystallization of the semiconductor film, and crystallization progresses with the suicide as a crystal nucleus. Here, after the heat treatment for dehydrogenation (400 to 550° C. for 0.5 to 2 hours), heat treatment for crystallization (550 to 650° C. for 1 to 24 hours) is performed. Alternatively, crystallization may be performed by RTA or GRTA. Here, by performing crystallization without performing laser irradiation, variations of crystallinity can be reduced, thereby variations in characteristics of TFTs formed later can be suppressed. In addition, since a ridge (depression/projection) which crystal-grows on the crystalline surface in a projecting manner is unlikely to be formed, the surface of the semiconductor region is relatively flat. Thus, a leak current which flows between the crystalline semiconductor film and the gate electrode with the gate insulating film interposed therebetween can be suppressed.

Then, similarly to Embodiment Mode 1, a channel doping step is performed wholly or selectively in which a Group 3 element (Group 13 element, hereinafter referred to as an acceptor element) or a Group 5 element (Group 15 element, hereinafter referred to as a donor element) is added at a low concentration into a region to be a channel forming region of a TFT. This channel doping step is a step for controlling the threshold voltage of a TFT.

Next, similarly to Embodiment Mode 1, the second semiconductor film 132 containing a donor element is formed with a thickness of 80 to 250 nm over the first crystalline semiconductor film 131. Here, it is deposited by a plasma CVD method using a silicon source gas into which a donor element such as phosphorus or arsenic is added. By forming the second semiconductor film with such a method, an interface is formed between the first crystalline semiconductor film and the second semiconductor film. Alternatively, the second semiconductor film 132 containing a donor element can be formed by forming a similar semiconductor film to the first semiconductor film and adding a donor element into the semiconductor film by an ion doping method or an ion implantation method. At this time, the phosphorus concentration in the second semiconductor film 132 is preferably $1\times10^{19}$ to $3\times10^{21}/cm^3$.

Further, the second semiconductor film 132 may be formed to have a stacked-layer structure by forming a low concentration region (hereinafter referred to as an $n^-$ region) on the side in contact with the first crystalline semiconductor film 131, and forming a high concentration region (hereinafter referred to as an $n^+$ region) thereover, by using the aforementioned plasma CVD method, ion doping method or ion implantation method. At this time, the concentration of the donor element in the $n^-$ region is preferably $1\times10^{17}$ to $3\times10^{19}/cm^3$, or preferably $1\times10^{18}$ to $1\times10^{19}/cm^3$ while the concentration of the donor element in the $n^+$ region is preferably 10 to 100 times higher than that of the donor element in the $n^-$ region. In addition, the $n^-$ region preferably has a thickness of 50 to 200 nm while the $n^+$ region preferably has a thickness of 30 to 100 nm, or preferably 40 to 60 nm. Here, in the second semiconductor film 132, a region between a dashed line and the first crystalline semiconductor film 131 is denoted by the $n^-$ region while a region on the surface thereof is denoted by the $n^+$ region.

The profile of the impurity of the second semiconductor film which contains a donor element at this time is similar to FIG. 26 shown in Embodiment Mode 1.

Note that in the second semiconductor film 132 containing a donor element, crystal lattice distortion is formed when a rare gas element, typically argon is added thereto. Therefore, a catalytic element can be gettered in the subsequent gettering step.

Then, similarly to Embodiment Mode 1, the first crystalline semiconductor film 111 and the second semiconductor film 122 are heated to move the catalytic element contained in the first crystalline semiconductor film 131 to the second semiconductor film 132 as shown by the arrows in FIG. 10(E), thereby gettering the catalytic element. According to this step, the concentration of the catalytic element in the first crystalline semiconductor film can be reduced to have no effect on the device characteristics, specifically the nickel concentration can be reduced to $1\times10^{18}/cm^3$ or lower, or desirably $1\times10^{17}/cm^3$ or lower. Such a film is denoted by the second crystalline semiconductor film 141. In addition, the second semiconductor film to which the gettered catalytic element has moved is similarly crystallized; therefore, it is denoted by a third crystalline semiconductor film 142. Note that in this embodiment mode, the donor element in the third crystalline semiconductor film 142 is activated along with the gettering step.

Then, similarly to Embodiment Mode 1, the second mask 143 is formed over the third crystalline semiconductor film 142 as shown in FIG. 11(A), and the third crystalline semiconductor film 142 and the second crystalline semiconductor film 141 are etched using the second mask, thereby forming the first semiconductor region 152 and the second semiconductor region 151 as shown in FIG. 11(B).

Next, similarly to Embodiment Mode 1, after removing the second mask, the third conductive layer 153 is deposited with a thickness of 500 to 1500 nm, or preferably 500 to 1000 nm as shown in FIG. 11(C). Then, a photosensitive material is applied or discharged onto the third conductive layer, which is then irradiated with laser light 155 using a laser beam direct writing system for light exposure and developed, thereby the third mask 161 as shown in FIG. 11(D) is formed. Here, a positive photosensitive material is used as the photosensitive material 154.

Then, similarly to Embodiment Mode 1, the third conductive layer 153 is etched into a desired shape using the third mask 161 to form the fourth conductive layers 162*a* and 163. The fourth conductive layers 162*a* and 163 function as a source electrode and a drain electrode. At this time, by performing etching so that the third conductive layer is sectioned to form the source electrode and the drain electrode as well as to narrow a width of the source wiring or drain wiring, the aperture ratio of a liquid crystal display device formed later can be increased.

Then, similarly to Embodiment Mode 1, an exposed portion of the first semiconductor region 152 is etched using the third mask 161 to form the third semiconductor regions 164 and 165 functioning as a source region and a drain region. At this time, the second semiconductor region 151 may be partially over-etched. The over-etched second semiconductor region is denoted by the fourth semiconductor region 166. The fourth semiconductor region 166 functions as a channel forming region.

Then, after removing the third mask, the second insulating film 171 functioning as a passivation film is preferably deposited with a thickness of 100 to 300 nm over the surface of the fourth conductive layers 162 and 163 and the fourth semiconductor region 166 as shown in FIG. 11(E).

After that, the fourth semiconductor region is preferably hydrogenated by heating in a hydrogen atmosphere or a nitrogen atmosphere. Note that in the case of heating in the nitrogen atmosphere, the third insulating film is preferably formed using an insulating film containing hydrogen.

According to the aforementioned steps, an inversely staggered TFT having a crystalline semiconductor film can be formed.

Then, similarly to Embodiment Mode 1, the third insulating film 172 is formed with a thickness of 500 to 1500 nm over the second insulating film 171.

Next, similarly to Embodiment Mode 1, after forming a fourth mask (not shown) over the third insulating film 172, the third insulating film 172 and the second insulating film 171 are partially etched to expose the connection portion 122*a* of the gate electrode. Then, after removing the fourth mask, the fifth conductive layer 173 is formed with a thickness of 500 to 1500 nm, or preferably 500 to 1000 nm.

Next, the fourth insulating film 174 is formed over the fifth conductive layer 173 and the third insulating film 172. The fourth insulating film 174 can be formed by appropriately using a similar material to the third insulating film 172. In the case of forming a reflective liquid crystal display device or a semi-transmissive liquid crystal display device, more light can be reflected to the outside by forming the fourth insulating film to have depressions/projections. In this case, by forming the third insulating film by a droplet discharge method, a printing method or the like, an insulating film having depressions/projections can be formed.

Then, after forming a fifth mask (not shown) over the fifth insulating film 174, the fifth insulating film 174, the fourth insulating film 172 and the second insulating film 171 are partially etched to partially expose the fourth conductive layer 163. Then, after removing the fifth mask, the sixth conductive layer 175 functioning as a pixel electrode is formed with a thickness of 100 to 200 nm. The fifth mask can be formed using similar method and material to the second mask 143. As a typical material of the sixth conductive layer 175, there is a light-transmissive conductive film or a reflective conductive film. As a material of the light-transmissive conductive film, there are indium tin oxide (ITO), zinc oxide (ZnO), indium zinc oxide (IZO), gallium-doped zinc oxide (GZO), indium tin oxide containing silicon oxide, and the like. Meanwhile, as a material of the reflective conductive film, there are metals such as aluminum (Al), titanium (Ti), silver (Ag) and tantalum (Ta), a metal material containing such metal and nitrogen at a concentration of the stoichiometric composition ratio or lower, nitride of such metals such as titanium nitride (TiN), tantalum nitride (TaN), or aluminum containing 1 to 20% of nickel. Further, in the case of a semi-transmissive liquid crystal display device, the sixth conductive layer may be formed using a light-transmissive conductive film and a reflective film.

As a method forming the sixth conductive layer 175, a droplet discharge method, a sputtering method, a vapor deposition method, a CVD method, a coating method or the like is appropriately used. By using the droplet discharge method, the sixth conductive layer can be formed selectively. In the case of using the sputtering method, the vapor deposition method, the CVD method, the coating method or the like, a mask is formed similarly to the second conductive layer, and then the sixth conductive layer is formed by etching the conductive film with the mask.

Note that although a conductive layer functioning as a gate wiring is formed as the fifth conductive layer 173, and a conductive layer functioning as a pixel electrode is formed as the sixth conductive layer, the invention is not limited to these. A conductive layer functioning as a gate wiring may be formed after forming a conductive layer functioning as a pixel electrode.

According to the aforementioned steps, an active matrix substrate can be formed.

An inversely staggered TFT formed in this embodiment mode has a gate electrode which is formed using a highly heat-resistant material. Meanwhile, wirings such as a source wiring and a gate wiring are formed using a low-resistant material after performing heat treatment such as an activation step, a gettering step and a crystallization step. Therefore, a TFT with crystallinity can be formed to have less impurity metal elements and low wiring resistance. In addition, in the display device of the invention, the pixel electrode can be formed over the insulating film, thereby the aperture ratio can be increased.

Since the inversely staggered TFT of this embodiment mode is formed using a crystalline semiconductor film, higher mobility can be obtained as compared to an inversely staggered TFT formed of an amorphous semiconductor film. In addition, a source region and a drain region contain a catalytic element in addition to a donor element. Therefore, a source region and a drain region having low contact resistance with a semiconductor region can be formed. As a result, a semiconductor device which requires high speed operation can be fabricated.

In addition, in comparison with a TFT formed of an amorphous semiconductor film, variations of the threshold are less likely to occur, which results in the decrease in variations of the TFT characteristics. Therefore, in comparison with a liquid crystal display device using a TFT formed of an amorphous semiconductor film as a switching element, display unevenness can be reduced, thereby a semiconductor device with high reliability can be fabricated.

Further, since the metal element mixed into the semiconductor film at the deposition phase is gettered by a gettering step, the off current can be reduced. By providing such a TFT as a switching element of the display device, the contrast can be improved.

Further, in this embodiment mode, a thin film material or a resist may be discharged to a predetermined position using a droplet discharge method without the need of forming a thin film over the whole surface of a substrate. Therefore, the throughput and yield can be improved as well as the cost reduction can be achieved.

EMBODIMENT MODE 10

In this embodiment mode, description is made with reference to FIG. 12 on a stacked-layer structure of a source wiring, a gate wiring and a pixel electrode of the active matrix substrate shown in Embodiment Mode 9.

FIG. 12(A) is a view showing a stacked-layer structure of an inversely staggered TFT of this embodiment mode and a fifth conductive layer functioning as a gate wiring, which corresponds to the cross-sectional structure along A-B of FIG. 11(E) and FIG. 12(C).

FIG. 12(B) is a view showing a stacked-layer structure of a fourth conductive layer functioning as a source wiring, a fifth conductive layer functioning as a gate wiring, a second conductive layer functioning as a connection portion of a gate electrode, and a sixth conductive layer functioning as a pixel electrode, which corresponds to the cross-sectional structure along C-D of FIG. 12(C). Hereinafter, the fourth conductive layer functioning as a source wiring is denoted by source wirings 162*a* and 162*b*, the fifth conductive layer functioning as a gate wiring is denoted by gate wirings 173*a* and 173*b*, the second conductive layer functioning as a connection portion of the gate electrode is denoted by connection portions 122*a* and 122*b* of the gate electrode, and the sixth conductive layer functioning as a pixel electrode is denoted by the pixel electrode 175.

As shown in FIG. 12(B), the first insulating film 123 is formed over the connection portion 122*b* of the gate electrode. Over the first insulating film 123, a capacitor wiring 180, the source wiring 162*b* and the drain electrode 163 are formed. Over all of the capacitor wiring 180, the source wiring 162*b*, the drain electrode 163 and the first insulating film 123, the second insulating film 171 and the third insulating film 172 are formed. Over the third insulating film 172, the gate wiring 173 is formed. That is, the source wiring and the drain electrode intersect with the gate wiring 173 with the second insulating film 171 and the third insulating film 172 interposed therebetween.

As shown in FIG. 12(B), the fourth insulating film 174 is formed over all of the gate wiring 173 and the third insulating film 172, and over the fourth insulating film, the pixel electrode 175 is formed. That is, the gate wiring 173 is partially covered with the pixel electrode 175 with the fourth insulating film interposed therebetween. The fourth insulating film 174 over which the pixel electrode 175 is formed is formed of a planarizing layer; therefore, irregularity of the orientation of liquid crystal materials which are later injected between the pixel electrodes can be suppressed, thereby the contrast of the liquid crystal display device can be improved.

Note that although the fourth insulating film 174 is formed over all of the gate wiring 173 and the third insulating film 172 here, it may be formed to cover only the gate wiring 173 and its peripheral third insulating film 172. In this case, the fourth insulating film is partially formed by a droplet discharge method or a printing method. In the case of such a structure, the fourth insulating film is formed partially; therefore, materials can be reduced as well as the cost reduction can be achieved.

In this embodiment mode, an edge of the pixel electrode is formed over the source wiring as shown by E-F of FIG. 12(C). Therefore, in the case of a transmissive liquid crystal display device, even if irregularity of the orientation of liquid crystal materials occurs at the edge of the pixel electrode, the region is covered with the source wiring; therefore, display unevenness can be reduced.

EMBODIMENT MODE 11

In this embodiment mode, description is made with reference to FIG. 13 on an active matrix substrate having a different stacked-layer structure of a gate wiring and a source wiring.

FIG. 13(A) is a view showing a stacked-layer structure of an inversely staggered TFT and a gate wiring in this embodiment mode, which corresponds to the cross-sectional structure along A-B of FIG. 13(C). Over the first insulating film 123, the fourth semiconductor region, the source wiring 162*a*, the fourth conductive layer functioning as a drain electrode (hereinafter referred to as a drain electrode) 163, the pixel electrode 1112 and the gate wiring 1113 are formed. The drain electrode 163 and the pixel electrode 1112 are connected to each other without interposing an interlayer insulating film therebetween. Meanwhile, the connection portion 122*a* of the gate electrode and the gate wiring 1113 are connected to each other with the first insulating film 123 interposed therebetween. Over the source wiring 162*a*, the drain electrode 163, the pixel electrode 1112, the first insulating film 123 and the gate wiring 1113, the insulating film 1114 functioning as a passivation film is formed.

FIG. 13(B) is a view showing a stacked-layer structure of the source wiring 162*b*, the gate wiring 1113, the connection portion 122*b* of the gate electrode and the pixel electrode 1112, which corresponds to the cross-sectional structure along C-D of FIG. 13(C).

As shown in FIG. 13(B), the first insulating film 123 is formed over the connection portion 122*b* of the gate electrode. Over the first insulating film 123, the capacitor wiring 180, the source wiring 162*b*, the drain electrode 163 and the pixel electrode 1112 connected to the drain electrode 163 are formed. Over the capacitor wiring 180, the source wiring 162*b* and a part of the first insulating film 123, a second insulating film 1111 is formed. Over the second insulating film 1111, the gate wiring 1113 is formed. That is, each of the source wiring and the drain electrode intersects with the gate wiring 1113 with the second insulating film 1111 interposed therebetween. Here, the second insulating film 1111 is formed by a droplet discharge method or a printing method.

In this embodiment mode, the second insulating film 1111 is formed only in the region where the source wiring and the capacitor wiring intersect with the gate wiring. Therefore, it is formed only partially unlike Embodiment Mode 10. Thus, materials can be reduced as well as the cost reduction can be achieved.

In addition, a third insulating film may be formed by a droplet discharge method or a printing method in a region where the gate wiring 1113 overlaps with the pixel electrode 1112. In such a case, the region for forming the pixel electrode can be increased, which can increase the aperture ratio.

EMBODIMENT MODE 12

In this embodiment mode, description is made with reference to FIG. 14 on an active matrix substrate having a different stacked-layer structure of a gate wiring and a source wiring.

FIG. 14(A) is a view showing a stacked-layer structure of an inversely staggered TFT and a gate wiring in this embodiment mode, which corresponds to the cross-sectional structure along A-B of FIG. 14(C).

FIG. 14(B) is a view showing a stacked-layer structure of the source wiring 162*b*, the gate wiring 1121*b*, the connection portion 122*b* of the gate electrode and the pixel electrode 1112, which corresponds to the cross-sectional structure along C-D of FIG. 14(C).

As shown in FIG. 14(B), the first insulating film 123 is formed over the connection portions 122*a* and 122*b* of the gate electrode. Over the first insulating film 123, the capacitor wiring 180, the source wiring 162*b* and the drain electrode 163 are formed. Over all of the capacitor wiring 180, the source wiring 162*b*, the drain electrode 163 and the first insulating film 123, the second insulating film 171 and the third insulating film 172 are formed, and over the third insulating film 172, the gate wiring 1121*b* is formed. That is, the source wiring 162*b* and the capacitor wiring 180 intersect with the gate wirings 1121*a* and 1121*b* with the second insulating film 171 and the third insulating film 172 interposed therebetween.

Note that as shown in FIG. 14(C), the gate wiring 1121*b* is formed in each pixel, and connected to the connection portions 112*a* and 112*b* of the gate electrode which are provided in adjacent pixels. Therefore, the material of the gate wiring 1121*b* is not specifically required to be a low-resistant material, and thus the selection range of the material can be widened.

Over the whole third insulating film 172, the fourth insulting film 174 is formed, and over the fourth insulating film, the pixel electrode 1122 is formed. That is, the gate wiring 1121*b* is partially covered with the pixel electrode 175 with the fourth insulating film interposed therebetween. The fourth insulating film 174 over which the pixel electrode 175 is formed is formed of a planarizing layer; therefore, irregularity of the orientation of liquid crystal materials which are later injected between the pixel electrodes can be suppressed, thereby the contrast of the liquid crystal display device can be improved.

Note that although the fourth insulating film 174 is formed over all of the gate wiring 1121*b* and the third insulating film 172 here, it may be formed to cover only the gate wiring 1121*b* and its peripheral third insulating film 172. In such a case, the fourth insulating film is formed partially by a droplet discharge method or a printing method. In the case of such a structure, the fourth insulating film is formed partially; therefore, materials can be reduced as well as the cost reduction can be achieved.

EMBODIMENT MODE 13

In this embodiment mode, description is made with reference to FIG. 15 on an active matrix substrate having a different stacked-layer structure of a gate wiring and a source wiring.

FIG. 15(A) is a view showing a stacked-layer structure of an inversely staggered TFT and a gate wiring in this embodiment mode, which corresponds to the cross-sectional structure along A-B of FIG. 15(C). Over the first insulating film 123, the fourth semiconductor region, the drain electrode 163, the pixel electrode 1132 and the gate wiring 1133*a* are formed. The drain electrode 163 and the pixel electrode 1132 are connected to each other without interposing an insulating film therebetween.

FIG. 15(B) is a view showing a stacked-layer structure of the source wiring 162*b*, the gate wiring 1133*b*, the connection portion 122*b* of the gate electrode and the pixel electrode 1132, which corresponds to the cross-sectional structure along C-D of FIG. 15(C).

As shown in FIG. 15(B), the first insulating film 123 is formed over the connection portion 122*b* of the gate electrode. Over the first insulating film 123, the capacitor wiring 180, the source wiring 162*b*, the drain electrode 163 and the pixel electrode 1132 connected to the drain electrode 163 are formed. Over the capacitor wiring 180, the source wiring 162*b* and a part of the first insulating film 123, the second insulating film 1131 is formed, and over the second insulating film 1131, the gate wiring 1133*b* is formed. That is, each of the source wiring 162*b* and the capacitor wiring 180 intersects with the gate wiring 1133*b* with the second insulating film 1131 interposed therebetween. Here, the second insulating film 1131 is formed by a droplet discharge method or a printing method.

In this embodiment mode, the second insulating film 1131 is formed only in the region where each of the source wiring and the capacitor wiring intersects with the gate wiring. Therefore, it is formed only partially unlike Embodiment Mode 12. Thus, materials can be reduced as well as the cost reduction can be achieved.

In addition, a third insulating film may be formed by a droplet discharge method or a printing method in a region where the gate wiring 1133*b* overlaps with the pixel electrode 1132. In such a case, a region for forming a pixel electrode can be increased, which can increase the aperture ratio.

EMBODIMENT MODE 14

In this embodiment mode, description is made with reference to FIG. 16 on an active matrix substrate having a different stacked-layer structure of a gate wiring and a source wiring.

FIG. 16(A) is a view showing a stacked-layer structure of an inversely staggered TFT and a fifth conductive layer functioning as a gate wiring in this embodiment mode, which corresponds to the cross-sectional structure along A-B of FIG. 16(C).

FIG. 16(B) is a view showing a stacked-layer structure of a source wiring 1148*b*, gate wirings 1145*a* and 1145*b*, the connection portion 122*b* of the gate electrode and a pixel electrode 1142, which corresponds to the cross-sectional structure along C-D of FIG. 16(C).

As shown in FIG. 16(B), the first insulating film 123 is formed over the connection portions 122*a* and 122*b* of the gate electrode. Over the first insulating film 123, the capacitor wiring 1144, the source wiring 1148*b*, the drain electrode 1147 and the gate wirings 1145*a* and 1145*b* are formed. Note that the gate wirings 1145*a* and 1145*b* are connected to the connection portions 122*a* and 122*b* of the gate electrode respectively with the first insulating film 123 interposed therebetween.

As shown in FIG. 16(C), the gate wirings 1145*a* and 1145*b* are provided in each pixel. Here, the gate wirings 1145*a* and 1145*b* do not intersect with the source wirings 1148*a* and 1148*b* and the capacitor wiring 1144. Therefore, in the case of forming these electrodes and wirings using a droplet discharge method, they can be formed simultaneously, thereby the mass productivity can be improved.

Over all of the gate wirings 1145*a* and 1145*b*, the source wiring 1148*b*, the drain electrode 1143*a* and the capacitor wiring 1144, the second insulating film 171 and the third insulating film 172 are formed. Over the third insulating film 172, conductive layers 1146*a* and 1146*b* are formed. The conductive layers 1146*a* and 1146*b* are connected to the gate wirings. 1145*a* and 1145*b* respectively with the second insulating film 171 and the third insulating film 172 interposed therebetween. Therefore, the gate wiring provided in each pixel is electrically to each other through the conductive layers 1146*a* and 1146*b*. The source wirings 1184*a* and 1148*b* and the capacitor wiring 1144 intersect with the gate wirings 1145*a* and 1145*b* and the conductive layers 1146*a* and 1146*b* with the second insulating film 171 and the third insulating film 172 interposed therebetween.

Note that the conductive layers 1146*a* and 1146*b* are formed in each pixel, and connected to the connection portions 122*a* and 122*b* of the gate electrode which are provided in adjacent pixels. Therefore, the selection range of the material for the conductive layers 1146*a* and 1146*b* can be widened.

Over the whole third insulating film 172, the fourth insulating film 174 is formed, and over the fourth insulating film, the pixel electrode 1142 is formed. That is, the conductive layer 1146*b* is partially covered with the pixel electrode 1142 with the fourth insulating film interposed therebetween. The fourth insulating film 174 over which the pixel electrode 175 is formed is formed of a planarizing layer; therefore, irregularity of the orientation of liquid crystal materials which are later injected between the pixel electrodes can be suppressed, thereby the contrast of the liquid crystal display device can be improved.

Note that although the fourth insulating film 174 is formed over all of the gate wiring 1121*b* and the third insulating film 172 here, it may be formed to cover only the gate wiring 1121*b* and its peripheral fourth insulating film 174.

EMBODIMENT MODE 15

In this embodiment mode, description is made with reference to FIG. 17 on an active matrix substrate having a different stacked-layer structure of a gate wiring and a source wiring.

FIG. 17(A) is a view showing a stacked-layer structure of an inversely staggered TFT and a gate wiring in this embodiment mode, which corresponds to the cross-sectional structure along A-B of FIG. 17(C). Over the first insulating film 123, the source wiring 1150*a*, the fourth semiconductor region, a drain electrode 1157, a pixel electrode 1152 and a gate wiring 1155*a* are formed. The drain electrode 163 and the pixel electrode 1132 are connected to each other without interposing an insulating film therebetween.

FIG. 17(B) is a view showing a stacked-layer structure of the source wiring 1153*b*, the gate wirings 1155*a* and 1155*b*, the connection portion 122*b* of the gate electrode and the pixel electrode 1152, which corresponds to the cross-sectional structure along C-D of FIG. 17(C).

As shown in FIG. 17(B), the first insulating film 123 is formed over the connection portion 122*b* of the gate electrode. Over the first insulating film 123, a capacitor wiring 1158, a source wiring 1150*b*, a drain electrode 1158*a*, the pixel electrode 1152 connected to the drain electrode 1158*a* and the gate wirings 1155*a* and 1155*b* are formed. Over the capacitor wiring 1158, the source wiring 1150*b* and a part of the first insulating film 123, a second insulating film 1151 is formed, and over the second insulating film 1151, a conductive layer 1156*b* is formed. The gate wirings 1155*a* and 1155*b* are provided in each pixel. Here, the gate wirings 1155*a* and 1155*b* do not intersect with the source wiring 1153*b* and the capacitor wiring 1158 respectively. Therefore, in the case of forming these using a droplet discharge method, they can be formed simultaneously, thereby the mass productivity can be improved.

The conductive layers 1156*a* and 1156*b* are connected to the gate wirings 1155*a* and 1155*b* respectively with the second insulating film 1151 interposed therebetween. Therefore, the gate wiring provided in each pixel is electrically connected to each other through the conductive layers 1156*a* and 1156*b*. The source wiring and the drain electrode intersect with the gate wirings 1155*a* and 1155*b* and the conductive layers 1156*a* and 1156*b* with the second insulating film 1151 interposed therebetween.

In this embodiment mode, the second insulating film 1151 is provided only in a region where the source wiring and the capacitor wiring intersect with the gate wirings. Therefore, it is formed only partially unlike Embodiment Mode 14. Thus, materials can be reduced as well as the cost reduction can be achieved.

In addition, a third insulating film may be formed by a droplet discharge method or a printing method in a region where the conductive layer 1151 overlaps with the pixel electrode 1152. In this case, a region for forming the pixel electrode can be increased, which can increase the aperture ratio.

EMBODIMENT MODE 16

In this embodiment mode, description is made with reference to FIG. 18 on an active matrix substrate having a different stacked-layer structure of a gate wiring and a source wiring.

FIG. 18(A) is a view showing a stacked-layer structure of an inversely staggered TFT and a gate wiring in this embodiment mode, which corresponds to the cross-sectional structure along A-B of FIG. 18(C). Over the first insulating film 123, the fourth semiconductor region 166, the drain electrode 1157 and the pixel electrode 1152 are formed. The drain electrode 1157 and the pixel electrode 1152 are connected to each other without interposing an insulating film therebetween. The first insulating film over the connection portion 122*a* of the gate electrode is removed, and a gate wiring 1165*a* is formed thereover. With such a structure, contact resistance between the connection portion of the gate electrode and the gate wiring can be suppressed. In addition, the connection structure of the connection portion 122*a* of the gate electrode and the gate wiring 1165 as in this embodiment mode can be applied to each of Embodiment Mode 10 to Embodiment Mode 15.

FIG. 18(B) is a view showing a stacked-layer structure of a source wiring 1163*b*, gate wirings 1165*a* and 1165*b*, a conductive layer 123*b* and the pixel electrode 1152, which corresponds to the cross-sectional structure along C-D of FIG. 18(C).

As shown in FIG. 18(B), the conductive layer 123*b* formed through similar steps to the gate electrode 121*a* and the connection portion 122*a* of the gate electrode is formed over the surface of the substrate. At removal of the first insulating film over the surface of the connection portion 122*a* of the gate electrode, the first insulating film over the surface of the conductive layer 123*b* is removed. After that, the second insulating film 1161 is formed over the conductive layer 123*b*. At this time, the second insulating film 1161 is preferably formed so as to expose opposite ends of the conductive layer 123*b*.

Then, a drain electrode is formed over the first insulating film simultaneously with the formation of gate wirings 1165*a* and 1165*b* over the conductive layers 123*a* and 123*b*. At the same time, the source wiring 1163*b* and a capacitor wiring 1164 are formed over the second insulating film 1161. Here, these conductive layers do not intersect with each other. Therefore, in the case of forming these using a droplet discharge method, they can be formed simultaneously, thereby the mass productivity can be improved.

In this embodiment mode, the gate wirings 1165*a* and 1165*b* formed in each pixel are connected to each other through the conductive layers 123*a* and 123*b*. In addition, the gate wirings 1165*a* and 1165*b* intersect with the source wirings 1163*a* and 1163*b* respectively with the second insulating film 1161 formed over the conductive layer 123*b*, interposed therebetween.

In this embodiment mode, the second insulating film 1161 is provided only in a region where the source wirings 1163*a* and 1163*b* and the capacitor wiring 1164 intersect with the gate wirings. Therefore, they are formed only partially, thus materials can be reduced as well as the cost reduction can be achieved.

In addition, a third insulating film may be formed by a droplet discharge method or a printing method in a region where the gate wirings 1165*a* and 1165*b*, the capacitor wiring 1164 and the source wirings 1163*a* and 1163*b* overlap with the pixel electrode 1152. In such a case, a region for forming the pixel electrode can be increased, which can increase the aperture ratio.

EMBODIMENT MODE 17

In this embodiment mode, description is made with reference to FIG. 19 on steps for forming a TFT by gettering a catalytic element using a semiconductor film containing a rare gas element instead of a semiconductor film containing a donor element.

As shown in FIG. 19(A) and FIG. 19(B), the first crystalline semiconductor film 131 is formed through similar steps to Embodiment Mode 1. Note that a channel doping step may be performed thereafter. Then, an oxide film may be formed with a thickness of 1 to 5 nm over the surface of the first crystalline semiconductor film. Here, the oxide film is formed by applying ozone water onto the surface of the crystalline semiconductor film.

Next, a second semiconductor film 232 containing a rare gas element is formed by a known method such as a PVD method or a CVD method over the first crystalline semiconductor film 131. The second semiconductor film 232 is preferably an amorphous semiconductor film.

Next, the first crystalline semiconductor film 131 and the second semiconductor film 232 are heated by a similar method to Embodiment Mode 1, thereby moving the catalytic element contained in the first crystalline semiconductor film 131 to the second semiconductor film 232 as shown by the arrows in FIG. 19(C) so that the catalytic element is gettered. According to this step, the catalytic element in the first crystalline semiconductor film may be reduced to have a concentration which has no effect on the device characteristics, specifically the catalyst concentration in the film can be reduced to $1\times10^{18}/cm^3$ or lower, preferably $1\times10^{17}/cm^3$ or lower similarly to Embodiment Mode 1. Such a film is denoted by the second crystalline semiconductor film 241. In addition, the second semiconductor film to which the gettered catalytic element has moved is similarly crystallized; therefore, it is denoted by a third crystalline semiconductor film 242.

Next, as shown in FIG. 19(D), after removing the third crystalline semiconductor film 242, a second semiconductor film 243 having conductivity is deposited. Here, the second semiconductor film is deposited by a plasma CVD method using a silicon source gas into which a gas containing a Group 13 or 15 element such as boron, phosphorus or arsenic is added. Note that the second semiconductor film may be formed of a film having any state selected from an amorphous semiconductor, an SAS, a crystalline semiconductor and μc. Note that in the case where the second semiconductor film is any of the amorphous semiconductor film, the SAS and the μc each having conductivity, heat treatment for activating the impurity is performed. Meanwhile, in the case where the second semiconductor film is a crystalline semiconductor having conductivity, heat treatment is not required. Here, after depositing an amorphous semiconductor film containing phosphorus to have a thickness of 100 nm by a plasma CVD method, it is heated at 550° C. for 1 hour to activate the impurity.

Next, as shown in FIG. 19(E), a first semiconductor region 252, a second semiconductor region 251 and the third conductive layer 153 are formed through similar steps to Embodiment Mode 1. Then, after applying a photosensitive material 254, the photosensitive material is partially irradiated with laser light 255 to form a mask 260 as shown in FIG. 19(F).

Next, as shown in FIG. 19(F), the third conductive layer 153 is etched using a mask to form fourth conductive layers 162 and 163 functioning as a source electrode and a drain electrode. In addition, through similar steps to Embodiment Mode 1, the first semiconductor region is etched to form a third semiconductor region 262 functioning as a source region and a drain region and a fourth semiconductor region 261 functioning as a channel forming region.

After that, through similar steps to Embodiment Mode 1, an inversely staggered TFT and an active matrix substrate can be formed. By using the TFT formed in this embodiment mode, a similar effect to Embodiment Mode 1 can be obtained. This embodiment mode can be applied to any of Embodiment Mode 1 to Embodiment Mode 16.

EMBODIMENT MODE 18

In this embodiment mode, description is made with reference to FIG. 20 on steps for forming an n-channel TFT and a p-channel TFT over the same substrate.

As shown in FIG. 20(A), second conductive layers 301 and 302 are formed over the substrate 101 similarly to Embodiment Mode 1. Over the second conductive layers, the first insulating film 123 is formed. Then, through similar steps to Embodiment Mode 1, a first crystalline semiconductor film and a second semiconductor film containing a donor element are formed in this order. Then, using a mask formed by a droplet discharge method or by applying a resist, exposing it to light with a laser beam direct writing system, and developing it, the first crystalline semiconductor film is etched into a desired shape to form a first semiconductor region. Then, the second semiconductor film is etched into a desired shape to form a second semiconductor region.

Next, the first semiconductor region and the second semiconductor region are heated to move a catalytic element contained in the second semiconductor region to the first semiconductor region as shown by the arrows in FIG. 20(A) so that the catalytic element is gettered. Here, the first semiconductor region to which the gettered catalytic element has moved is denoted by third semiconductor regions 311 and 312, and the second semiconductor region having a reduced concentration of metal element is denoted by fourth semiconductor regions 313 and 314. Note that the third semiconductor region and the fourth semiconductor region are each crystallized by heating for the gettering step.

Although the gettering step is performed after forming each semiconductor region in this embodiment mode, the gettering step of each semiconductor film may precede the etching of the semiconductor film into a desired shape to form each semiconductor region as in Embodiment Mode 1

Then, after forming an oxide film over the surface of the third semiconductor regions 311 and 312 and the fourth semiconductor regions 313 and 314, first masks 321 and 322 are formed as shown in FIG. 20(B) by a droplet discharge method or by applying a resist, exposing it to light with a laser beam direct writing system and developing it. The first mask 321 covers all of the third semiconductor region 311 and the fourth semiconductor region 313 to be an n-channel TFT later, whereas the mask 322 partially covers the third semiconductor region 312 to be a p-channel TFT later. At this time, the first mask 322 preferably has a shorter channel length than the p-channel TFT formed later.

Then, by adding an acceptor element into an exposed portion of the third semiconductor region 312, a p-channel impurity region 324 is formed. The region covered with the first mask 322 at this time remains as an n-type impurity region 325. At this time, by adding the acceptor element to have a concentration of 2 to 10 times higher than that of the third semiconductor region 312 containing a donor element, a p-type impurity region can be formed.

FIG. 27 shows profiles of an impurity element in the p-type impurity region.

FIG. 27(A) shows a profile of each element when an acceptor element is added after forming a second semiconductor film having an $n^-$ region concentration and an $n^+$ region concentration by a CVD method. The profile 150*a* of the donor element shows a first concentration and a second concentration similarly to FIG. 26(A). In a profile 603 of the acceptor element, a region in the vicinity of the surface of the second semiconductor film has a high concentration while a region closer to the fourth semiconductor region 314 has a lower concentration. A region containing the acceptor element at a concentration of 2 to 10 times higher than that of the donor element contained in the $n^+$ region is denoted by a $p^+$ region 602*a* while a region containing the acceptor element at a concentration of 2 to 10 times higher than that of the donor element in the $n^-$ region is denoted by a $p^-$ region 602*b*.

FIG. 27(B) shows a profile of each element when an acceptor element is added after forming a second semiconductor film having an $n^-$ region concentration and an $n^+$ region concentration which is obtained by forming a semiconductor film having any state selected from an amorphous semiconductor, an SAS, a microcrystalline semiconductor and a crystalline semiconductor, and adding a donor element into the semiconductor film by an ion doping method or an ion implantation method. The profile 150*b* of the donor element is similar to the profile 150*b* of the donor element in FIG. 26(B). A profile 613 of the acceptor element is similar to the profile 603 of the acceptor element in FIG. 27(A). A region containing the acceptor element at a concentration of 2 to 10 times higher than that of the donor element contained in the $n^+$ region is denoted by a $p^+$ region 612*a,* while a region containing the acceptor element at a concentration of 2 to 10 times higher than that of the donor element in the $n^-$ region is denoted by a $p^-$ region 612*b*.

Note that in the second semiconductor film 132 containing a donor element, crystal lattice distortion is formed when a rare gas element, typically argon is added thereto. Therefore, more catalytic element can be gettered in the subsequent gettering step.

Then, as shown in FIG. 20(B), after removing the first masks 321 and 322, the third semiconductor region 311, the p-type impurity region 324 and the n-type impurity region 325 are heated to activate the impurity element. As the heating step, LRTA, GRTA, furnace annealing or the like can be appropriately used. Here, heating is performed at 550° C. for 1 hour.

Then, as shown in FIG. 20(C), third conductive layers 331 and 332 are formed similarly to Embodiment Mode 1. Then, after applying a resist, it is exposed to light using a laser beam direct writing system and developed to form a mask 333, thereby forming fourth conductive layers 341 and 342 functioning as a source electrode and a drain electrode and fifth semiconductor regions 343 and 344 functioning as a source region or a drain region as shown in FIG. 20(D). Then, after removing the mask 333, a passivation film is preferably deposited over the surface of the fourth conductive layers 341 and 342 and the fifth semiconductor regions 343 and 344.

According to the aforementioned steps, an n-channel TFT and a p-channel TFT can be formed over the same substrate. By using the TFT formed in this embodiment, a similar effect to that in Embodiment Mode 1 can be obtained. In addition, in comparison with a driver circuit formed using a single-channel TFT, a CMOS capable of low voltage driving can be formed. Further, an acceptor element (for example, boron) has a small atomic radius as compared to a donor element (for example, phosphorus); therefore, the acceptor element can be added into the semiconductor film at a relatively low accelerating voltage and concentration. In this embodiment mode, only an acceptor element is added into the semiconductor film; therefore, fabrication with less energy in shorter time can be achieved as compared to the fabrication steps of a conventional CMOS circuit. As a result, the cost reduction can be achieved.

This embodiment mode can be applied to any of Embodiment Mode 1 to Embodiment Mode 16.

EMBODIMENT MODE 19

In this embodiment mode, description is made with reference to FIG. 21 on fabrication steps of an n-channel TFT and a p-channel TFT having a crystalline semiconductor film formed through a different gettering step from that of Embodiment Mode 18.

In accordance with Embodiment Mode 1, the second conductive layers 301 and 302 are formed over the substrate 101. Then, in accordance with Embodiment Mode 1, as shown in FIG. 1(C), a first crystalline semiconductor film containing a catalytic element is formed first, and then an insulating film is formed with a thickness of several nanometers over the surface of the first crystalline semiconductor film. Then, a first mask is formed by a droplet discharge method or by applying a resist, exposing it to light using a laser beam direct writing system and developing it. The first crystalline semiconductor film is etched into a desired shape to form first semiconductor regions 401 and 402.

Next, as shown in FIG. 21(B), a second mask is formed over the first semiconductor regions 401 and 402 by a droplet discharge method or by applying a resist, exposing it to light using a laser beam direct writing system and developing it. Then, a donor element 405 is added into exposed portions of the first semiconductor regions. At this time, regions into which the donor element is added are denoted by n-type impurity regions 406 and 407. Here, phosphorus is added by an ion doping method. The first semiconductor regions covered with the second mask contain a catalytic element though it is not added phosphorus.

Then, the first semiconductor regions are heated to move the catalytic element contained in the first semiconductor regions to the n-type impurity regions 406 and 407 as shown by the arrows in FIG. 21(C) so that the catalytic element is gettered. Here, the first semiconductor regions to which the gettered catalytic element has moved are denoted by source region and drain region 413 and 414 while the first semiconductor regions having a reduced concentration of metal element are denoted by channel forming regions 411 and 412. Note that the third semiconductor region and the fourth semiconductor region are each crystallized by heating for the gettering step, and the donor element contained in the source regions and the drain regions 413 and 414 is activated.

Then, third masks 421 and 422 are formed as shown in FIG. 21(D) by a droplet discharge method or by applying a resist, exposing it to light using a laser bean direct writing system and developing it. The third mask 421 covers all of the channel forming region 411 and the source region and the drain region 413 to be an n-channel TFT later while the third mask 422 covers a part of or the whole channel forming region 412 to be a p-channel TFT later. At this time, the third mask 422 preferably has a shorter channel length than the p-channel TFT to be formed later.

Next, an acceptor element 423 is added into exposed portions of the source region and the drain region 414 and the channel forming region 412, thereby forming a p-type source region and a p-type drain region 424. At this time, by adding the acceptor element to have a concentration of 2 to 10 times higher than that of the source region and the drain region 414, a p-type source region and a p-type drain region can be formed.

Next, after removing the third masks 421 and 422, the n-type source region and the n-type drain region 414 and the p-type source region and the p-type drain region 424 are heated to activate the impurity element. As a heating method, LRTA, GRTA, furnace annealing or the like may be appropriately used. Here, heating is performed at 550° C. for 1 hour.

Next, as shown in FIG. 21(D), the fourth conductive layers 341 and 342 are formed similarly to Embodiment Mode 18. After that, the channel forming regions 411 and 412 may be partially etched. Then, a passivation film is preferably deposited over the surfaces of the fourth conductive layers 341 and 342 and the channel forming regions 411 and 412.

According to the aforementioned steps, an n-channel TFT and a p-channel TFT can be formed over the same substrate. By using a TFT formed in this embodiment mode, a similar effect to Embodiment Mode 1 can be obtained. Further, as the number of the deposition steps can be reduced as compared to Embodiment Mode 18, the throughput can be improved.

Note that this embodiment mode can be applied to any of Embodiment Mode 1 to Embodiment Mode 16.

EMBODIMENT MODE 20

In this embodiment mode, description is made with reference to FIG. 22 on steps for forming an n-channel TFT and a p-channel TFT over the same substrate by using a crystalline semiconductor film which has been subjected to a gettering step in accordance with Embodiment Mode 17.

In accordance with Embodiment Mode 1, the second conductive layers 301 and 302 are formed over the substrate 101. Then, in accordance with Embodiment Mode 8, a first crystalline semiconductor film and a second semiconductor film containing a rare gas element are formed. Then, the first crystalline semiconductor film and the second semiconductor film are heated by a similar method to Embodiment Mode 1, thereby moving the catalytic element contained in the first crystalline semiconductor film to the second semiconductor film as shown by the arrows in FIG. 22(A) so that the catalytic element is gettered. The first crystalline semiconductor film of which catalytic element has been gettered is denoted by a second crystalline semiconductor film 501. In addition, the second semiconductor film to which the gettered catalytic element has moved is similarly crystallized; therefore, it is denoted by a crystalline semiconductor film 502.

Next, as shown in FIG. 22(B), the third crystalline semiconductor film 502 is etched, and an insulating film is deposited with a thickness of several nanometers over the surface of the second crystalline semiconductor film 501. Then, a first mask is formed by a droplet discharge method or by applying a resist, exposing it to light using a laser beam direct writing system and developing it, and the second crystalline semiconductor film is etched to form first semiconductor regions 511 and 512. Then, second masks 513 and 514 are formed by a droplet discharge method or by applying a resist, exposing it to light using a laser beam direct writing system and developing it. The second mask 513 covers a portion to be a channel forming region of an n-channel TFT later. Meanwhile, the second mask 514 covers the whole first semiconductor region 512 to be a p-channel TFT later. Then, a donor element 515 is added into an exposed portion of the first semiconductor region 511. At this time, a region into which the donor element is added is denoted by an n-type impurity region 516. Meanwhile, a region covered with the second mask 513 functions as a channel forming region 517.

Next, after removing the second masks 513 and 514, third masks 521 and 522 are formed by applying a resist, exposing it to light using a laser beam direct writing system and developing it. The third mask 521 covers the whole semiconductor region to be a channel forming region of a p-channel TFT and the whole n-type impurity region 511.

Next, an acceptor element 523 is added into an exposed portion of the first semiconductor region 512 to form a p-type impurity region 524. Then, a region covered with the third mask 522 functions as a channel forming region 525. Then, after removing the third masks 521 and 522, the n-type impurity region 516 and the p-type impurity region 524 are heated to activate the impurity element. As a heating method, LRTA, GRTA, furnace annealing or the like may be appropriately used.

Next, as shown in FIG. 22(D), the fourth conductive layers 341 and 342 are formed similarly to Embodiment Mode 18. After that, the channel forming regions 517 and 525 may be partially etched. Then, a passivation film is preferably deposited over the surface of the fourth conductive layers 341 and 342 and the channel forming regions 517 and 525.

According to the aforementioned steps, an n-channel TFT and a p-channel TFT can be formed over the same substrate. By using a TFT formed in this embodiment mode, a similar effect to Embodiment Mode 1 can be obtained.

Note that this embodiment mode can be applied to any of Embodiment Modes 1 to 16.

EMBODIMENT MODE 21

This embodiment mode is a modified example of Embodiment Mode 18, and description is made with reference to FIG. 23 on steps for forming an n-channel TFT and a p-channel TFT over the same substrate.

In accordance with Embodiment Mode 18, the third semiconductor regions 311 and 312 and fourth semiconductor regions 313 and 314 containing a catalytic element and a donor element are formed as shown in FIG. 23(A). Then, as shown in FIG. 23(B), after forming the first mask 321, an acceptor element 323 is added into the third semiconductor region 312 to form a p-type impurity region 601. At this time, by adding the acceptor element at a concentration of 2 to 10 times higher than that of the third semiconductor region 312, a p-type impurity region can be formed. In the case of using boron as the acceptor element, it is added to a further degree than the fourth semiconductor region since the molecular radius is small. Therefore, there may be a case where boron is added into an upper portion of the fourth semiconductor region depending on the doping conditions. After that, the third semiconductor region 311 and the p-type impurity region 601 are heated to activate the acceptor element and the donor element. Note here that the doping conditions are controlled so that the acceptor element is not added into the fourth semiconductor region 314.

Next, third conductive layers 331 and 332 are formed in accordance with Embodiment Mode 18. Then, using a mask 333 formed by applying a resist, exposing it to light using a laser beam direct writing system and developing it, exposed portions of the third conductive layers 331 and 332, the third semiconductor region 313 and the p-type impurity region 601 are etched, thereby fourth conductive layers 341 and 342 functioning as a source electrode or drain electrode, fifth semiconductor regions 343 and 621 functioning as a source region and a drain region and sixth semiconductor regions 345 and 622 functioning as channel forming regions can be formed. After that, a passivation film is preferably formed over the surfaces of the fourth conductive layers 341 and 342 and the sixth semiconductor regions 345 and 622.

According to the aforementioned steps, an n-channel TFT and a p-channel TFT can be formed over the same substrate. By using the TFT formed in this embodiment mode, a similar effect to Embodiment Mode 1 can be obtained. Further, since only an acceptor element is added into a semiconductor film similarly to Embodiment Mode 3, fabrication with less energy in shorter time can be achieved as compared to the fabrication steps of a conventional CMOS circuit. As a result, the cost reduction can be achieved.

This embodiment mode can be applied to any of Embodiment Mode 1 to Embodiment Mode 16.

EMBODIMENT MODE 22

In this embodiment mode, description is made with reference to FIG. 24 and FIG. 25 on a positional relationship between ends of a gate electrode and a source electrode and a drain electrode, that is the relationship between the width of a gate electrode and the channel length.

In a TFT shown in FIG. 24(A), ends of a source electrode and a drain electrode overlap with the gate electrode 121*a* by a length of z1. Here, a region where the gate electrode 121*a* overlaps with the source electrode and the drain electrode is called an overlapped region. That is, a width y1 of the gate electrode is larger than a channel length x1. The width z1 of the overlapped region is represented by (y1−x1)/2. An n-channel TFT having such an overlapped region preferably has an $n^+$ region and an $n^-$ region between the source and drain electrodes and a semiconductor region. With such a structure, an alleviating effect of an electric field is increased, thereby the hot carrier resistance can be increased.

In a TFT shown in FIG. 24(B), ends of the gate electrode 121*a* correspond to ends of a source electrode and a drain electrode. That is, a width y2 of the gate electrode is equal to a channel length x2.

In a TFT shown in FIG. 24(C), the gate electrode 121*a* is away from ends of a source electrode and a drain electrode by a length of z 3. Here, here, a region where the gate electrode 121*a* is away from the source electrode and the drain electrode is called an offset region. That is, a width y3 of the gate electrode is smaller than a channel length x3. A width z3 of the offset region is represented by (x3−y3)/2. A TFT having such a structure can have a smaller off current; therefore, in the case of using the TFT as a switching element of a display device, the contrast can be improved.

In a TFT shown in FIG. 25(A), a width y4 of a gate electrode is larger than a channel length x4. A first end of the gate electrode 121*a* corresponds to an end of a source electrode or a drain electrode, whereas a second end of the gate electrode 121*a* overlaps with the other end of the source electrode and the drain electrode by a length of z4. A width z4 of the overlapped region is represented by (y4−x4).

In a TFT shown in FIG. 25(B), a width y5 of a gate electrode is smaller than a channel length x5. A first end of the gate electrode 121*a* corresponds to an end of either a source electrode or a drain electrode, whereas a second end of the gate electrode 121*a* is away from an end of the other of the source electrode or the drain electrode by a length of z5. The width z5 of the offset region is represented by (x5−y5). By using, as a source electrode, an electrode having its end corresponding to the first end of the gate electrode 121*a,* and using, as a drain electrode, an electrode having the offset region, an alleviating effect in the vicinity of the drain electrode can be obtained.

Further, a TFT having a multi-gate electrode structure may be employed in which a semiconductor region covers a plurality of gate electrodes. A TFT having such a structure can have a smaller off current as well.

Note that this embodiment mode can be applied to any of Embodiment Modes 1 to 21.

EMBODIMENT MODE 23

Although the aforementioned embodiment mode shows a source electrode and a drain electrode having an end perpendicular to the surface of a channel forming region, the invention is not limited to such a structure. As shown in FIG. 28, cross sections of ends of a source electrode and a drain electrode may make an angle larger than 90 degrees but smaller than 180 degrees, or preferably an angle of 135 to 145 degrees with the surface of the channel forming region. Provided that an angle made by the cross section of the end of the source electrode with the surface of the channel forming region is θ1, and an angle made by the cross section of the end of the drain electrode with the surface of the channel forming region is θ2, θ1 may be either equal to or different from θ2. A source electrode and a drain electrode having such a shape can be formed by a dry etching method.

As shown in FIG. 29, ends of a source electrode and a drain electrode 2149*a* and 2149*b* may have curved surfaces 2150*a* and 2150*b* respectively.

Note that this embodiment mode can be applied to any of Embodiment Mode 1 to Embodiment Mode 23.

EMBODIMENT MODE 24

In this embodiment mode, description is made with reference to FIG. 30 and FIG. 31 on crystallization steps of a semiconductor film applicable to the aforementioned embodiment modes. As shown in FIG. 30(A), a mask 2701 formed of an insulating film is formed over the semiconductor film 124, and a catalytic element layer 2705 may be selectively formed to crystallize the semiconductor film. When the semiconductor film is heated, crystal growth is generated in the direction parallel to the surface of the substrate from a contact portion between the catalytic element layer and the semiconductor film as shown by the arrows in FIG. 30(B). Note that crystallization is not carried out in a portion far away from the catalytic element layer 2705, and thus an amorphous portion remains.

Alternatively, as shown in FIG. 31(A), the aforementioned crystallization may be carried out by selectively forming a catalytic element layer 2805 by a droplet discharge method without using a mask. FIG. 31(B) is a top view of FIG. 31(A). Similarly, FIG. 31(D) is a top view of FIG. 31(C). When crystallization of a semiconductor film is performed, crystal growth is generated in the direction parallel to the surface of the substrate from a contact portion between the catalytic element layer and the semiconductor film as shown in FIG. 31(C) and FIG. 31(D). Here, crystallization is not carried out either in a portion far away from the catalytic element layer 2805, and thus an amorphous portion 2807 remains.

In this manner, the crystal growth in the direction parallel to the substrate is termed lateral growth. By the lateral growth, crystal grains with a larger grain size can be formed. Therefore, a TFT having higher mobility can be formed.

This embodiment mode can be applied to any of Embodiment Mode 1 to 23.

EMBODIMENT 1

Next, description is made with reference to FIG. 32 to FIG. 34 on a fabrication method of an active matrix substrate and a display device having the same. FIG. 32 to FIG. 34 are longitudinal cross-sectional structural views of an active matrix substrate, which schematically illustrate a driver circuit portion A-A', a driving TFT B-B' of a pixel portion, a connection portion C-C' of a gate electrode of a switching TFT and a gate wiring.

As shown in FIG. 32(A), a first conductive film (not shown) is deposited with a thickness of 100 to 200 nm over a substrate 800. Here, a glass substrate is used as the substrate 800, over the surface of which an indium oxide containing silicon oxide is formed with a thickness of 150 nm by a sputtering method as a first conductive film. Then, a first mask is formed by discharging or applying a photosensitive material onto the first conductive film, exposing it to light using a laser beam direct writing system and then developing it. Using the first mask, the first conductive film is etched to form first conductive layers 801 to 804. Here, a tungsten film is etched by a dry etching method to form indium oxide layers containing silicon oxide as the first conductive layers 801 to 804. Note that the first conductive layers 801 and 802 each function as a gate electrode of a TFT constituting a driver circuit, the first conductive layer 803 functions as a gate electrode of a driving TFT, and the first conductive layer 804 functions as a gate electrode of a switching TFT.

Then, a first insulating film is formed over the surface of the substrate 800 and the first conductive layers 801 to 804. Here, a silicon nitride film 805 having a thickness of 50 to 100 nm and a silicon oxynitride film (SiON (O>N)) 806 having a thickness of 50 to 100 nm are stacked by a CVD method as the first insulating film. Note that the first insulating film functions as a gate insulating film. At this time, the silicon nitride film and the silicon oxynitride film are preferably deposited continuously only by switching a material gas without air exposure.

Next, an amorphous semiconductor film 807 is formed with a thickness of 10 to 100 nm over the first insulating film. Here, an amorphous silicon film is deposited with a thickness of 100 nm by a CVD method. Then, a solution 808 containing a catalytic element is applied onto the surface of the amorphous semiconductor film 807. Here, a solution containing 20 to 30 ppm of nickel catalyst is applied by a spin coating method. Then, the amorphous semiconductor film 807 is heated to form a crystalline semiconductor film 811 as shown in FIG. 32(B). Note that the crystalline semiconductor film 811 contains a catalytic element. Here, an electric furnace is used for heating at 500° C. for 1 hour to hydrogenate the semiconductor film, and then the semiconductor film is heated at 550° C. for 4 hours to form a crystalline silicon film containing nickel. Then, a channel doping step for adding a p-type or n-type impurity element at a low concentration is performed selectively or wholly to a region to be a channel region of the TFT later.

Next, a semiconductor film 812 containing a donor element is deposited with a thickness of 100 nm over the surface of the crystalline semiconductor film 811 containing a catalytic element. Here, an amorphous silicon film containing phosphorus is deposited by using a silane gas and 0.5% of a phosphine gas (flow ratio of silane/phosphine: 10/17).

Next, the crystalline semiconductor film 811 and the semiconductor film 812 containing a donor element are heated to getter the catalytic element and activate the donor element. That is, the catalytic element in the crystalline semiconductor film 811 containing the catalytic element is moved to the semiconductor film 812 containing the donor element. The crystalline semiconductor film having a reduced concentration of the catalytic element is denoted by 813 in FIG. 32(C). Here, it is a crystalline silicon film. In addition, the semiconductor film containing a donor element to which the catalytic element has moved becomes a crystalline semiconductor film. That is, it becomes a crystalline semiconductor film containing a catalytic element and a donor element, which is denoted by 814 in FIG. 32(C). Here, it becomes a crystalline silicon film containing nickel and phosphorus.

Next, after forming second masks over the crystalline semiconductor film 814 containing the catalytic element and the donor element as shown in FIG. 32(D), the crystalline semiconductor film is etched into a desired shape using the second masks. Second masks 815 to 817 can be formed by dropping an organic resin by a droplet discharge method, drying and baking it. Alternatively, similarly to the first mask, the second masks can be formed by exposing a photosensitive material to light using a laser beam direct writing system, and developing it. Here, the second masks are formed by selectively discharging polyimide by a droplet discharge method, baking and drying it. The etched crystalline semiconductor film containing a catalytic element and a donor element becomes first semiconductor regions 824 to 826 shown in FIG. 33(A) while the etched crystalline semiconductor film 813 becomes second semiconductor regions 821 to 823.

Then, a third mask 827 is formed in a region to be an n-channel TFT later. Here, the third mask 827 is formed by discharging polyimide by a droplet discharge method and drying it so as to cover the second semiconductor region 821 and the first semiconductor region 824 to be an n-channel TFT later. Though not shown, the third mask 827 is formed in a first semiconductor region and a second semiconductor region to be a switching TFT.

Then, an acceptor element 828 is added into the first semiconductor regions 825 and 826 to be p-channel TFTs later, thereby forming p-type semiconductor regions 831 and 832 as shown in FIG. 33(B).

Then, the first insulating films 805 and 806 formed over the first conductive layer 803 functioning as the gate electrode of the driving TFT (not shown) are partially etched to partially expose the first conductive layer 803 functioning as the gate electrode.

Then, second conductive layers 833 and 834 are formed with a thickness of 500 to 1000 nm over the surface of the first semiconductor region 824, the p-type semiconductor regions 831 and 832 and the second semiconductor regions 821 to 823. Here, an Ag paste is discharged by a droplet discharge method and baked to form a third conductive layer.

Then, a fourth mask is formed by applying a photosensitive material 835, irradiating the photosensitive material with laser light 836 using a laser beam direct writing system for light exposure, and then developing it. After that, the third conductive layer is etched to form fourth conductive layers 841 to 845 which function as a source wiring, a gate wiring, a power source line and a source electrode or a drain electrode.

Here, FIG. 25 is simultaneously referred to, which shows a top view of the pixel along B-B' and C-C'. According to the aforementioned steps, a fourth conductive layer 901 to function as a source wiring and a fourth conductive layer 902 to function as a drain electrode are formed, which are provided over a source region or a drain region of the driving TFT later. In addition, a fourth conductive layer 844 to function as a power source line and a fourth conductive layer 845 to function as a drain electrode are formed, which are provided over a source region or a drain region of the driving TFT later.

Note that the fourth conductive layer 902 functioning as a drain electrode of the switching TFT is connected to the first conductive layer 803 functioning as a gate electrode of the driving TFT in a contact hole 909.

In addition, FIG. 35 is simultaneously referred to, which shows a top view of the driver circuit along A-A'.

In this step, by performing etching in such a manner that the third conductive layer is sectioned to form each source wiring, power source line, gate wiring and drain wiring as well as to narrow a width of the drain wiring, the aperture ratio of the display device formed later can be increased. Here, a positive photosensitive material is used as the photosensitive material 835, which is irradiated with laser light 830 to form a fourth mask.

Then, the first semiconductor regions 824, 831 and 832 are etched while leaving the fourth mask to form source regions and drain regions 847 to 852. At this time, the second semiconductor regions 821 to 823 are also partially etched. The etched semiconductor regions which are the third semiconductor regions 854 to 856 function as the channel forming regions.

Here, description is made with reference to FIG. 37 on a case where a driver circuit is formed using TFTs having a single-channel structure, typically of an n-channel TFT. FIG. 37 shows a top view of an inverter formed using an n-channel TFT and a resistor 856. Note that the resistor 856 is formed to connect one of a source electrode and a drain electrode of an n-channel TFT to a gate electrode.

Over the first conductive layers 801 and 802 functioning as gate electrodes, the semiconductor regions 854 and 855 are formed respectively with a gate insulating film interposed therebetween. In addition, an n-type semiconductor region is formed in each semiconductor region, over which the fourth conductive layers 841 to 843 each functioning as a source electrode and a drain electrode are formed.

The fourth conductive layer 842 to function as a source electrode or a drain electrode is formed covering the semiconductor region 854 and the semiconductor region 855.

Over the semiconductor region 854, the conductive layer 842 functioning as a source electrode or a drain electrode is formed. Further, the fourth conductive layer 843 functioning as a source electrode and a drain electrode is formed over the semiconductor region 855. By forming the fourth conductive layer functioning as a source electrode and a drain electrode after exposing the first conductive layer 802 functioning as a gate electrode by partially etching the gate insulating film before forming the source electrode and the drain electrode, the fourth conductive layer 843 functioning as a source electrode and a drain electrode is connected to the first conductive layer 802 functioning as a gate electrode through a contact hole 850. Therefore, a resistor 866 can be formed. Thus, the adjacent TFT 865 and resistor 866 being connected to each other can constitute an inverter.

Note that the driver circuit may be formed using a p-channel TFT having a single-channel structure as well as the n-channel TFT having a single-channel structure.

Next, as shown in FIG. 33(C), after removing the fourth mask, a second insulating film 857 and a third insulating film 858 are formed over the surface of the fourth conductive layer and the third semiconductor region. Here, a silicon oxynitride film (SiON (composition ratio: O>N)) containing hydrogen is deposited with a thickness of 150 nm by a CVD method as the second insulating film 857. In addition, a silicon nitride film is deposited with a thickness of 200 nm by a CVD method as the third insulating film 858. The silicon nitride film functions as a protective layer for blocking impurities from outside.

Then, the third semiconductor regions 854 to 856 are heated to be hydrogenated. Here, by heating at 410° C. for 1 hour in a nitrogen atmosphere, hydrogen contained in the second insulating film 857 is added into the third semiconductor regions 854 to 856, thus they are hydrogenated.

Next, as shown in FIG. 34(A), a fourth insulating film 871 is formed over the third insulating film 858. Here, the fourth insulating film 871 is formed by applying acrylic and baking it. Then, after forming a fifth mask over the fourth insulating film 871, each of the fourth insulating film 871, the third insulating film 858 and the second insulating film 857 is etched to partially expose the first conductive layer 804 functioning as a gate electrode of a switching TFT. Then, a fifth conductive layer 872 functioning as a gate wiring is formed to be connected to the first conductive layer 804. Here, the fifth conductive layer 872 is formed by discharging an Ag paste by a droplet discharge method and baking it, and then partially etching the Ag paste using a mask which is formed using a laser beam direct writing system to narrow the wiring width.

According to the aforementioned steps, the driver circuit A-A' formed by a CMOS circuit in which the n-channel TFT 861 and the p-channel TFT 862 are connected to each other can be formed as well as a pixel portion having a driving TFT formed of the p-channel TFT 863 and a switching TFT formed of an n-channel TFT. Although the driver circuit is formed using the n-channel TFT and the p-channel TFT in this embodiment mode, the driver circuit and the pixel portion may be formed using only n-channel TFTs.

Next, a fifth insulating film 873 is formed. The fifth insulating film 873 can be formed using a similar material to the fourth insulating film. Here, acrylic is used for the fifth insulating film 873. Then, after forming a sixth mask over the fifth insulating film 873, the fifth insulating film to the second insulating film are etched to partially expose the fourth conductive layer 845.

Next, a sixth conductive layer is deposited with a thickness of 100 to 300 nm so as to be in contact with the fourth conductive layer 845. As a material of the sixth conductive layer, a light-transmissive conductive film or a reflective conductive film can be used. As a method for forming the sixth conductive layer, a droplet discharge method, a coating method, a sputtering method, a vapor deposition method, a CVD method or the like is appropriately used. Note that in the case of using the coating method, the sputtering method, the vapor deposition method, the CVD method or the like, the conductive layer is formed by forming a mask by a droplet discharge method or by light exposure using a laser beam direct writing system, or the like, and then etching a conductive film. Here, an alloy material containing highly reflective aluminum as a main component and containing at least one of nickel, cobalt, iron, carbon and silicon is used as a bottom layer, and indium tin oxide (ITO) containing silicon oxide is deposited thereover by a sputtering method, which are etched into a desired shape so as to form a sixth conductive layer 874 functioning as a pixel electrode.

In addition, FIG. 35 is simultaneously referred to, which shows a top view of the pixel portion along B-B'. The fifth conductive layer 872 is connected to the sixth conductive layer 874 functioning as a pixel electrode in a contact hole 911.

According to the aforementioned steps, an active matrix substrate can be fabricated. Note that a protection circuit for preventing electrostatic damage, typically a diode may be provided between a connection terminal and a source wiring (gate wiring) or in a pixel portion. In this case, by fabricating a diode through similar steps to the aforementioned TFT, and connecting a gate wiring layer of the pixel portion to a drain or source wiring layer of the diode, electrostatic damage can be prevented.

Then, as shown in FIG. 34(B), a sixth insulating film 881 for covering ends of the sixth conductive layer 874 is formed. Here, the sixth insulating film 881 is formed using a negative photosensitive material.

Then, a layer 882 containing a light-emitting substance is formed over the surface of the sixth conductive layer 874 and ends of the sixth insulating film 881 by a vapor deposition method, a coating method, a liquid droplet discharge method or the like. After that, a seventh conductive layer 883 functioning as a second pixel electrode is formed over the layer 882 containing a light-emitting substance. Here, ITO containing silicon oxide is deposited by a sputtering method. As a result, a light-emitting element 884 can be formed by the sixth conductive layer, the layer containing a light-emitting substance and the seventh conductive layer. Each material of the conductive layers and the layer containing a light-emitting substance which constitute the light-emitting element 884 are appropriately selected, and each film thickness is also controlled.

Note that before forming the layer 882 containing a light-emitting substance, moisture adsorbed in the sixth insulating film 881 or the surface thereof is removed by performing heat treatment at 200 to 350° C. in an atmospheric pressure. In addition, it is preferable to perform heat treatment under the low pressure at 200 to 400° C., or preferably 250 to 350° C. and then forming the layer 882 containing a light-emitting substance by a vacuum deposition method without air exposure or a droplet discharge method under the atmospheric pressure or the low pressure, a coating method or the like.

The layer 882 containing a light-emitting substance is formed using a charge injection transporting substance containing an organic compound or an inorganic compound and a light-emitting material, which includes one or more layers containing, depending on the number of molecules, a low molecular weight organic compound, a medium molecular weight organic compound (organic compound with no sublimation property which has chained molecules with a length of 10 μm or shorter; typically dendrimer, oligomer or the like) and a high molecular weight organic compound, which may be combined with an inorganic compound having an electron injection transporting property or a hole injection transporting property.

As the substance having a specifically high electron transporting property among the charge injection transporting substances, there is a metal complex having quinoline or benzoquinoline skeleton such as tris(8-quinolinolato) aluminum (abbreviated to $Alq_3$), tris(5-methyl-8-quinolinolato) aluminum (abbreviated to $Almq_3$), bis(10-hydroxybenzo[h]-quinolinato)beryllium (abbreviated to $BeBq_2$), or bis (2-methyl-8-quinolinolato)-4-phenylphenolato-aluminum (abbreviated to BAlq), or the like.

As the substance having a high hole transporting property, for example, there is an aromatic amine compound (namely, compound having benzene ring-nitrogen bonds) such as 4,4'-bis[N-(1-naphthyl)-N-phenyl-amino]-biphenyl (abbreviated to α-NPD), 4,4'-bis[N-(3-methylphenyl)-N-phenyl-amino]-biphenyl (abbreviated to TPD), 4,4',4"-tris(N,N-diphenyl-amino)-triphenylamine (abbreviated to TDATA), and 4,4',4"-tris[N-(3-methylphenyl)-N-phenyl-amino]-triphenylamine (abbreviated to MTDATA).

As the substance having a specifically high electron injection property among the charge injection transporting substances, there is a compound of alkaline metals or alkaline earth metals such as lithium fluoride (LiF), cesium fluoride (CsF), or calcium fluoride ($CaF_2$). Alternatively, a mixture of a substance having a superior electron transporting property such as $Alq_3$ and an alkaline earth metal such as magnesium (Mg) may be used.

As the substance having a superior hole injection property among the charge injection transporting substances, there is a metal oxide such as molybdenum oxide ($MoO_x$), vanadium oxide ($VO_x$), ruthenium oxide ($RuO_x$), tungsten oxide ($WO_x$) or manganese oxide ($MnO_x$). In addition, there is a phthalocyanine-based compound such as phthalocyanine (abbreviated to $H_2Pc$) or copper phthalocyanine (CuPC).

As the light-emitting layer, a structure for performing color display may be employed by forming a light-emitting layer having a different emission wavelength band in each pixel. Typically, a light-emitting layer corresponding to each color of R (Red), G (Green) and B (Blue) is formed. In this case also, color purity can be improved as well as the mirror-like surface (glare) of the pixel portion can be prevented by adopting a structure where a filter (colored layer) for transmitting light with the emission wavelength band is provided on the emission side of the pixel. By providing the filter (colored layer), a circular polarizing plate or the like which has been conventionally required can be omitted, thereby the loss of light emitted from the light-emitting layer can be recovered. Further, changes in color tone which are recognized when the pixel portion (display screen) is seen obliquely can be reduced.

As the light-emitting material for forming the light-emitting layer, various materials can be used. As a low molecular weight organic light-emitting material, there are 4-(dicyanomethylene)-2-methyl-6-[2-(1,1,7,7-tetramethyljulolidine-9-yl)ethenyl]-4H-pyran (abbreviated to DCJT), 4-(dicyanomethylene)-2-tert-butyl-6-[2-(1,1,7,7-tetramethyljulolidine-9-yl)ethenyl]-4H-pyran (abbreviated to DCJTB), periflanthene, 2,5-dicyano-1,4-bis[2-(10-methoxy-1,1,7,7-tetramethyljulolidine-9-yl)ethenyl]benzene, N,N'-dimethyl quinacridone (abbreviated to DMQd), Coumarin 6, Coumarin 545T, tris(8-quinolinolato) aluminum (abbreviated to $Alq_3$), 9,9'-biantolyl, 9,10-diphenylanthracene (abbreviated to DPA), 9,10-di(2-naphthyl)anthracene (abbreviated to DNA), and the like. Alternatively, other substances may be employed.

On the other hand, a high molecular weight organic light-emitting material has higher physical strength as compared to the low molecular weight organic light-emitting material, and thus is highly durable. In addition, since the material can be deposited by coating, fabrication of the element can be relatively facilitated. The light-emitting element using the high molecular weight organic light-emitting material has basically the same structure as the case of using the low molecular weight organic light-emitting material, in which a cathode, a layer containing a light-emitting substance and an anode are stacked in this order. However, in fabrication of the layer containing a light-emitting substance using the high molecular weight organic light-emitting material, it is difficult to form a stacked-layer structure similarly to the case of using the low molecular weight organic light-emitting material; therefore, a bi-layer structure is often adopted. Specifically, such a structure is adopted that a cathode, a light-emitting layer, a hole transporting layer and an anode are stacked in this order.

The emission color is determined by the material for forming the light-emitting layer; therefore, by selecting the material, a light-emitting element which exhibits desired luminescence can be formed. As the high molecular weight organic light-emitting material which can be used for forming the light-emitting layer, there is a polyparaphenylene vinylene, polyparaphenylene, polythiophene or polyfluorene-based compound.

As the polyparaphenylene vinylene-based light-emitting material, there are derivatives of poly(paraphenylene vinylene) [PPV] such as poly(2,5-dialkoxy-1,4-phenylene vinylene [RO-PPV], poly[2-(2'-ethylhexoxy)-5-methoxy-1,4-phenylene vinylene [MEH-PPV], and poly(2-(dialkoxyphenyl)-1,4-phenylene vinylene [ROPh-PPV]. As the polyparaphenylene-based light-emitting material, there are derivatives of polyparaphenylene [PPP] such as poly(2,5-dialkoxy-1,4-phenylene) [RO-PPP] and poly(2,5-dihexoxy-1,4-phenylene). As the polythiophene-based light-emitting material, there are derivatives of polythiophene [PT] such as poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], and poly[3-(4-octylphenyl)-2,2-bithiophene] [PTOPT]. As the polyfluorene-based light-emitting material, there are derivatives of polyfluorene [PF] such as poly(9,9-dialkylfluorene) [PDAF] and poly(9,9-diochtylfluorene) [PDOF].

Note that the hole injection property from the anode can be improved if a high molecular weight organic light-emitting material having a hole transporting property is formed to be interposed between the anode and the high molecular weight organic light-emitting material. In general, the material dissolved in water together with an acceptor material is applied by a spin coating method or the like. In addition, since the material is insoluble in organic solvent, it can be stacked with the aforementioned light-emitting material. As the high molecular weight organic light-emitting material having a hole transporting property, there are a mixture of PEDOT and camphorsulfonic acid (CSA) as an acceptor material, a mixture of polyaniline acid [PANI] and polystyrenesulphonic [PSS] as an acceptor material, and the like.

The light-emitting layer can be formed to have a structure to emit monochromatic light or white light. In the case of using a white-light-emitting material, color display can be achieved by adopting a structure where a filter (colored layer) for transmitting light with a specific wavelength is provided on the emission side of the pixel.

In order to form a light-emitting layer to emit white light, for example, white emission can be obtained by sequentially stacking $Alq_3$ which is partially doped with Nile Red as a red-light-emitting pigment, $Alq_3$, p-EtTAZ, and TPD (aromatic diamine) by a vapor deposition method. In addition, in the case of forming a light-emitting layer by a coating method using a spin coater, the light-emitting layer is desirably baked by vacuum heating after the coating. For example, the whole surface is coated with an aqueous solution of poly(ethylenedioxythiophene)/poly(styrenesulfonate) (PEDOT/PSS) which functions as a hole injection layer, and then baked. Subsequently, the whole surface is coated with a polyvinylcarbazole (PVK) solution doped with a luminescence center pigment (e.g., 1,1,4,4-tetraphenyl-1,3-butadiene (TPB), 4-(dicyano-methylene)-2-methyl-6-(p-dimethylaminostyryl)-4H-pyran (DCM1), Nile Red, or Coumarin 6) which functions as a light-emitting layer.

The light-emitting layer may be formed in a single layer, and it may be formed using polyvinylcarbazole (PVK) having a hole transporting property in which 1,3,4-oxadiazole derivatives (PBD) having an electron transporting property is dispersed. In addition, by dispersing 30 wt % of PBD as an electron transporting agent, and further dispersing four kinds of pigments (TPB, Coumarin 6, DCM1, and Nile Red) in appropriate quantities, white emission can be obtained. Not only the light-emitting element which provides white emission shown herein, but also a light-emitting element which provides red, green or blue emission can be fabricated by appropriately selecting the material for the light-emitting layer.

Further, the light-emitting layer may be formed using a singlet excitation light-emitting material as well as a triplet excitation light-emitting material including a metal complex. For example, among light-emitting pixels for red emission, green emission and blue emission, the light-emitting pixel for red emission which has a relatively short luminance half decay period is formed using a triplet excitation light-emitting material while the other light-emitting pixels are formed using a singlet excitation light-emitting material. The triplet excitation light-emitting material has high luminous efficiency, which is advantageous in that lower power consumption is required for obtaining the same luminance. That is, when the triplet excitation light-emitting material is applied to the red pixel, the amount of current supplied to the light-emitting element can be suppressed, resulting in the improvement of reliability. In view of lower power consumption, the light-emitting pixels for red emission and green emission may be formed using a triplet excitation light-emitting material while the light-emitting element for blue emission may be formed using a singlet excitation light-emitting material. When forming the light-emitting element for green emission which is highly visible to human eyes using the triplet excitation light-emitting material, even lower power consumption can be achieved.

As an example of the triplet excitation light-emitting material, there is the one using a metal complex as a dopant, which includes a metal complex having, as a central metal, platinum which is a third transition element or iridium, and the like. The triplet excitation light-emitting material is not limited to the aforementioned compounds, and it may be a compound having an element of Groups 8 to 10 in the periodic table as a central metal.

The aforementioned substances for forming the layer containing a light-emitting substance are only examples, and a light-emitting element can be formed by appropriately stacking each functional layer such as a hole injection transporting layer, a hole transporting layer, an electron injection transporting layer, an electron transporting layer, a light-emitting layer, an electron-blocking layer and a hole-blocking layer. In addition, a mixed-layer or mixed-junction structure combining such layers may be employed. The layer structure of the light-emitting layer may be changed, and the modification is possible without departing the broader spirit of the invention such that no specific electron injection region or light-emitting region is provided but an alternative electrode for this purpose is provided or a light-emitting material is dispersed.

The light-emitting element formed using the aforementioned materials emits light when a forward bias is applied thereto. Pixels of a display device formed with light-emitting elements may be driven by a passive matrix method or an active matrix method. In either case, the individual pixel is controlled to emit light with a forward bias being applied at specific timing, and it is controlled to emit no light in a certain period. By applying a reverse bias in the non-emission period, the reliability of the light-emitting elements can be improved. As a degradation mode of the light-emitting elements, there is a degradation that the luminance intensity is decreased under the constant drive conditions, or a degradation that the apparent luminance is decreased due to the non-emission region increased in the pixels. For this, by performing AC drive in which forward and reverse biases are applied, degradation speed can be slowed, resulting in the improvement of the reliability of the light-emitting device.

Next, a transparent protective layer for preventing the moisture intrusion is formed covering the light-emitting element. As the transparent protective layer, a silicon nitride film, a silicon oxide film, a silicon oxynitride film (SiNO film (composition ratio: N>O) or a SiON film (composition ratio: N<O)), a thin film containing carbon as a main component (for example, a DLC film or a CN film) or the like may be used.

According to the aforementioned steps, an active matrix substrate having light-emitting elements can be fabricated. Note that each of Embodiment Modes 1 to 24 can be applied to this embodiment.

EMBODIMENT 2

Description is made with reference to FIG. 39 on modes of a light-emitting element applicable to the aforementioned embodiments.

FIG. 39(A) is an example in which a light-transmissive conductive film having a high work function is used for a first pixel electrode 2011 while a conductive film having a low work function is used for a second pixel electrode 2017. The first pixel electrode 2011 is formed using a light-transmissive oxide conductive material, typically an oxide conductive material containing silicon oxide at a concentration of 1 to 15 atomic %. Over the first pixel electrode 2011, a layer 2016 containing a light-emitting substance is provided in which a hole injection layer/hole transporting layer 2041, a light-emitting layer 2042 and an electron transporting layer/electron injection layer 2043 are stacked. The second pixel electrode 2017 is formed to have a first electrode layer 2033 containing an alkaline metal or an alkaline earth metal such as LiF or MgAg and a second electrode layer 2034 formed of a metal material such as aluminum. A pixel having such a structure can emit light from the first pixel electrode 2011 side as shown by an arrow in the figure.

FIG. 39(B) is an example in which a conductive film having a high work function is used for the first pixel electrode 2011 while a light-transmissive conductive film having a low work function is used for the second pixel electrode 2017. The first pixel electrode 2011 is formed to have a stacked-layer structure of a first electrode layer 2035 formed of metals such as aluminum or titanium or a metal material containing the metal and nitrogen at a concentration of the stoichiometric composition ratio or lower, and a second electrode layer 2032 formed of an oxide conductive material containing silicon oxide at a concentration of 1 to 15 atomic %. Over the first pixel electrode 2011, the layer 2016 containing a light-emitting substance is provided in which the hole injection layer/hole transporting layer 2041, the light-emitting layer 2042 and the electron transporting layer/electron injection layer 2043 are stacked. The second pixel electrode 2017 is formed to have a third electrode layer 2033 containing an alkaline metal or an alkaline earth metal such as LiF or CaF, and a fourth electrode layer 2034 formed of a metal material such as aluminum. By forming each layer of the second electrode with a thickness of 100 nm or less to transmit light, light can be emitted from the second pixel electrode 2017 as shown by an arrow in the figure.

FIG. 39(E) is an example in which light is emitted in both directions, that is from the first electrode and the second electrode. A light-transmissive conductive film having a high work function is used for the first pixel electrode 2011 and a light-transmissive conductive film having a low work function is used for the second pixel electrode 2017. Typically, the first pixel electrode 2011 is formed using an oxide conductive material containing silicon oxide at a concentration of 1 to 15 atomic % while the second pixel electrode 2017 is formed to have the third electrode layer 2033 containing an alkaline metal or an alkaline earth metal such as LiF or CaF and the fourth electrode layer 2034 formed of a metal material such as aluminum each having a thickness of 100 nm or less, thereby light can be emitted from both sides of the first pixel electrode 2011 and the second pixel electrode 2017.

FIG. 39(C) is an example in which a light-transmissive conductive film having a low work function is used as the first pixel electrode 2011 while a conductive film having a high work function is used as the second pixel electrode 2017. A layer containing a light-emitting substance has a stacked-layer structure of the electron transporting layer/electron injection layer 2043, the light-emitting layer 2042 and the hole injection layer/hole transporting layer 2041 in this order. The second pixel electrode 2017 has a stacked-layer structure of the second pixel electrode 2032 formed of an oxide conductive material containing silicon oxide at a concentration of 1 to 15 atomic % and the first electrode layer 2035 formed of a metal such as aluminum or titanium or a metal material containing the metal and nitrogen at a concentration of the stoichiometric composition ratio or lower in this order from the layer 2016 containing a light-emitting substance. The first pixel electrode 2011 is formed to have the third electrode layer 2033 containing an alkaline metal or an alkaline earth metal such as LiF or CaF and the fourth electrode layer 2034 formed of a metal material such as aluminum. By forming each layer to have a thickness of 100 nm or less to transmit light, light can be emitted from the first pixel electrode 2011 as shown by an arrow in the figure.

FIG. 39(D) is an example in which a conductive film having a low work function is used for the first pixel electrode 2011 while a light-transmissive conductive film having a high work function is used for the second pixel electrode 2017. The layer containing a light-emitting substance has a stacked-layer structure of the electron transporting layer/electron injection layer 2043, the light-emitting layer 2042 and the hole injection layer/hole transporting layer 2041 in this order. The first pixel electrode 2011 has a similar structure to FIG. 39(A), and formed to thin enough to reflect light emitted from the layer containing a light-emitting substance. The second pixel electrode 2017 is formed of an oxide conductive material containing silicon oxide at a concentration of 1 to 15 atomic %. In this structure, by forming the hole injection layer/hole transporting layer 2041 using a metal oxide as an inorganic substance (typically, molybdenum oxide or vanadium oxide), oxygen introduced during the formation of the second electrode layer 2032 is supplied to improve the hole injection property, thereby a driving voltage can be lowered. In addition, by forming the second pixel electrode 2017 using a light-transmissive conductive layer, light can be emitted from both sides of the second pixel electrode 2017 as shown by an arrow in the figure.

FIG. 39(F) is an example in which light is emitted in both directions, that is from the first pixel electrode and the second pixel electrode. A transmissive conductive film having a low work function is used for the first pixel electrode 2011 and a transmissive conductive film is used for the second pixel electrode 2017. Typically, the first pixel electrode 2011 may be formed to have the third electrode layer 2033 containing an alkaline metal or an alkaline earth metal such as LiF or CaF and the fourth electrode layer 2034 formed of a metal material such as aluminum while the second pixel electrode 2017 may be formed of an oxide conductive material containing silicon oxide at a concentration of 1 to 15 atomic %.

EMBODIMENT MODE 3

Description is made with reference to FIG. 40 on a pixel circuit of the light-emitting display panel shown in the aforementioned embodiments and the operation thereof. As an operation structure of a light-emitting display panel using a digital video signal, there is a display device in which a video signal inputted to the pixel is determined by voltage and the one in which it is determined by current. The display device using a video signal determined by voltage includes the one in which a voltage applied to a light-emitting element is constant (CVCV) and the one in which a current applied to a light-emitting element is constant (CVCC). Meanwhile, the display device using a video signal determined by current includes the one in which a constant voltage is applied to a light-emitting element (CCCV) and the one in which a constant current is applied to a light-emitting element (CCCC). In this embodiment mode, pixels for performing the CVCV operation are described with reference to FIGS. 40(A) and 40(B). In addition, pixels for performing the CVCC operation are described with reference to the FIGS. 40(C) to 40(F).

In the pixels shown in FIGS. 40(A) and 40(B), a source wiring 3710 and a power source line 3711 are disposed in columns, and a gate wiring 3714 is disposed in rows. In addition, the pixel includes a switching TFT 3701, a driving TFT 3703, a capacitor 3702 and a light-emitting element 3705.

Note that the switching TFT 3701 and the driving TFT 3703 operate in the linear region when they are on, and the driving TFT 3703 functions to control whether to apply a voltage to the light-emitting element 3705. Both TFTs preferably have the same conductivity type in view of the fabrication steps. In this embodiment mode, an n-channel TFT is used for the switching TFT 3701 and a p-channel TFT is used for the driving TFT 3703. In addition, the driving TFT 3703 may be either an enhancement mode TFT or a depletion mode TFT. The ratio (W/L) of the channel width W to the channel length L of the driving TFT 3703 is preferably 1 to 1000 though it depends on the mobility of the TFT As the W/L is higher, the electric property of the TFT can be further improved.

In the pixels shown in FIGS. 40(A) and 40(B), the switching TFT 3701 controls a video signal input to the pixel. When the switching TFT 3701 is turned on, a video signal is inputted to the pixel. Then, a voltage of the video signal is held in the capacitor 3702.

In FIG. 40(A), when the power source line 3711 is at Vss while a counter electrode of the light-emitting element 3705 is at Vdd, namely in the case of FIGS. 40(C) and 40(D), a counter electrode of the light-emitting element is an anode while an electrode thereof connected to the driving TFT 3703 is a cathode. In this case, luminance unevenness caused by the characteristic variations of the driving TFT 3703 can be suppressed.

In FIG. 40(A), when the power source line 3711 is at Vdd while the counter electrode of the light-emitting element 3705 is at Vss, namely in the case of FIGS. 40(A) and 40(B), the counter electrode of the light-emitting element is a cathode while the electrode thereof connected to the driving TFT 3703 is an anode. In this case, by inputting a video signal having a higher voltage than Vdd to the source wiring 3710, the voltage of the video signal is held in the capacitor 3702, and the driving TFT 3703 operates in the linear region. Therefore, luminance unevenness caused by the variations of TFTs can be improved.

The pixels shown in FIG. 40(B) has basically the same pixel configuration as FIG. 40(A) except that a TFT 3706 and a gate wiring 3715 are additionally provided.

The TFT 3706 is controlled to be turned on/off by the gate wiring 3715 which is provided additionally. When the TFT 3706 is turned on, charges held in the capacitor 3702 are released, thereby the driving TFT 3703 is turned off. That is, the provision of the TFT 3706 can forcibly provide the state where no current flows to the light-emitting element 3705. Therefore, the TFT 3706 can be called an erasing TFT. Thus, in the configuration of FIG. 40(B), emission period can start simultaneously with or immediately after a writing period without awaiting the signal input to the whole pixels, which can improve the duty ratio of light emission.

In the pixel having the aforementioned configurations, the current value of the light-emitting element 3705 can be determined by the driving TFT 3703 which operates in the linear region. According to the aforementioned configurations, luminance unevenness of light-emitting elements due to the variations in characteristics of TFTs can be improved, thereby a display device with improved image quality can be provided.

Next, description is made with reference to FIGS. 40(C) to 40(F) on the pixel for performing the CVCC operation. The pixel shown in FIG. 40(C) corresponds to the pixel configuration shown in FIG. 40(A) additionally provided with a power source line 3712 and a current-controlling TFT 3704.

The pixel shown in FIG. 40(E) has basically the same pixel configuration as FIG. 40(C) except that the gate electrode of the driving TFT 3703 is connected to the power source line 3712 disposed in a row direction. That is, the pixels shown in FIGS. 40(C) and 40(E) are equivalent circuit diagrams to each other. However, the power source line 3712 is formed of a conductive film in a different layer in the case where the power source line 3712 is disposed in a column direction (FIG. 40(C)) and the case where the power source line 3712 is disposed in a row direction (FIG. 40(E)). Here, a wiring connected to the gate electrode of the driving TFT 3703 is considered and description is made separately in FIGS. 40(C) and 40(E) in order to show that the respective wirings are fabricated by using different layers.

Note that the switching TFT 3701 operates in the linear region while the driving TFT 3703 operates in the saturation region. In addition, the driving TFT 3703 functions to control a current value flowing to the light-emitting element 3705 while the current-controlling TFT 3704 operates in the saturation region and functions to control a current supply to the light-emitting element 3705.

The pixels shown in FIGS. 40(D) and 40(F) have basically the same configurations as the pixels shown in FIGS. 40(C) and 40(E) respectively except that an erasing TFT 3706 and a gate wiring 3715 are additionally provided.

Note that the pixels shown in FIGS. 40(A) and 40(B) can also perform the CVCC operation. In addition, in the pixels having the operation structures shown in FIGS. 40(C) to 40(F), Vdd and Vss can be appropriately changed depending on the direction of a current flow in the light-emitting element similarly to FIGS. 40(A) and 40(B).

In the pixels having the aforementioned configurations, the current-controlling TFT 3704 operates in the linear region; therefore, slight fluctuation of Vgs of the current-controlling TFT 3704 does not affect the current value of the light-emitting element 3705. That is, the current value of the light-emitting element 3705 can be determined by the driving TFT 3703 which operates in the saturation region. According to the aforementioned configurations, luminance unevenness of light-emitting elements due to the variations in characteristics of TFTs can be improved, thereby a display device with improved image quality can be provided.

Although the aforementioned examples show the configurations provided with the capacitor 3702, the invention is not limited to these, and the capacitor 3702 may be omitted if the gate capacitance or the like can substitute the capacitor for holding video signals.

Such an active matrix light-emitting device is considered advantageous when the pixel density is increased since TFTs are provided in each pixel and a low voltage drive can thus be achieved. On the other hand, a passive matrix light-emitting device in which TFTs are provided in each column can be formed as well. The passive matrix light-emitting device has no TFT in each pixel; therefore, it has high aperture ratio.

In such a light-emitting device of the invention, a driving method for image display is not specifically limited. For example, a dot-sequential driving method, a line-sequential driving method, an area sequential driving method or the like may be employed. Typically, a line-sequential driving method is employed, and a time division gray scale method or an area gray scale driving method may be appropriately employed. In addition, image signals inputted to source wirings of the display device may be either analog signals or digital signals. A driver circuit and the like may be designed in accordance with the image signals.

As set forth above, various pixel circuits can be applied to the semiconductor device of the invention.

EMBODIMENT 4

In this embodiment, description is made with reference to FIG. 38 on the exterior view of a light-emitting display panel as an example of a display panel. FIG. 38(A) is a top view of a panel which is obtained by sealing a first substrate and a second substrate with a first sealant 1205 and a second sealant 1206. FIG. 38(B) is a cross-sectional view along A-A' and B-B' of FIG. 38(A).

In FIG. 38(A), reference numeral 1202 indicated by a dashed line is a pixel portion and 1203 is a gate wiring driver circuit. In this embodiment, the pixel portion 1202 and the gate wiring driver circuit 1203 are located in the region sealed with the first sealant and the second sealant. In addition, reference numeral 1201 is a source wiring driver circuit, and the source wiring driver circuit in a chip form is provided over a first substrate 1200. The first sealant is preferably an epoxy resin having high viscosity including a filler. On the other hand, the second sealant is preferably an epoxy resin having low viscosity. It is desirable that the first sealant 1205 and the second sealant be materials which do not transmit moisture or oxygen as much as possible.

In addition, a drying agent may be provided between the pixel portion 1202 and the first sealant 1205. Further, a drying agent may be provided over the gate wiring or the source wiring in the pixel portion. The drying agent is preferably calcium oxide (CaO), barium oxide (BaO) or the like which is a substance adsorbing water ($H_2O$) by chemical adsorption such as the oxide of alkaline earth metals. However, the invention is not limited to these, and a substance which adsorbs water by physical adsorption such as zeolite or silica gel may be used as well.

The drying agent can be fixed on the second substrate 1204 in such a state that particulate substances of the drying agent are contained in a highly moisture-permeable resin. As the highly moisture-permeable resin, for example, an acrylic resin may be used such as ester acrylate, ether acrylate, ester urethane acrylate, ether urethane acrylate, butadiene urethane acrylate, special urethane acrylate, epoxy acrylate, amino resin acrylate or acrylic resin acrylate. Alternatively, an epoxy resin may be used such as bisphenol A liquid resin, bisphenol A hard resin, bromine-containing epoxy resin, bisphenol F resin, bisphenol AD resin, phenol resin, cresol resin, novolac resin, cycloaliphatic epoxy resin, Epi-Bis type epoxy resin, glycidyl ester resin, glycidyl amine resin, heterocyclic epoxy resin or modified epoxy resin. Other substances may be employed as well. For example, an inorganic substance such as siloxane polymers, polyimide, PSG (Phosphor Silicate Glass) or BPSG (Boron Phosphorus Silicon Glass) may be used.

The drying agent may be provided in a region overlapping with a gate wiring. Further, it may be fixed on the second substrate in such a state that particulate substances of the drying agent are contained in a highly moisture-permeable resin. By providing such drying agent, moisture intrusion to the display elements and the degradation caused thereby can be suppressed without lowing the aperture ratio. Therefore, variations in degradation of light-emitting elements in the peripheral portion and the central portion of the pixel portion 1202 can be suppressed.

Note that reference numeral 1210 denotes a connection wiring region for transmitting signals inputted to the source wiring driver circuit 1201 and the gate wiring driver circuit 1203, which receives video signals and clock signals from an FPC (Flexible Printed Circuit) 1209 through a connection wiring 1208.

Next, description is made with reference to FIG. 38(B) on the cross-sectional structure. Over the first substrate 1200, a driver circuit and a pixel portion are formed, which include a plurality of semiconductor elements typified by TFTs. The gate wiring driver circuit 1203 as a driver circuit and the pixel portion 1202 are shown here. Note that the gate wiring driver circuit 1203 is constituted by a CMOS circuit including an n-channel TFT 1221 and a p-channel TFT 1222.

In this embodiment, TFTs of the gate wiring driver circuit and the pixel portion are formed over the same substrate. Therefore, the volume of the light-emitting display panel can be reduced.

The pixel portion 1202 is constituted by a plurality of pixels each of which includes a switching TFT 1211, a driving TFT 1212 and a first pixel electrode (anode) 1213 formed of a reflective conductive film which is electrically connected to the drain electrode of the driving TFT 1212.

Agate electrode 1231 of the switching TFT is connected to a gate wiring 1214 with a first insulator 1232 and a gate insulating film interposed therebetween. Note that gate electrodes of the switching TFT and a TFT of the driver circuit are also connected to the gate wiring with the fist insulator and the gate insulating film interposed therebetween.

Over the first insulator 1232, a second insulator 1233 is formed, and the gate wiring 1214 and the first pixel electrode 1213 are formed with the second insulator 1233 interposed therebetween.

Over opposite ends of the first pixel electrode (anode) 1213, a third insulator (called a bank, a partition wall, an embankment or the like) is formed. In order to obtain an excellent coverage of a film formed over the third insulator 1234, a top end or a bottom end of the third insulator 1234 is formed to have a curved surface with a curvature. In addition, the surface of the third insulator 1234 may be covered with a protective film formed of an aluminum nitride film, an aluminum nitride oxide film, a thin film containing carbon as a main component or a silicon nitride film. Further, when the third insulator 1234 is formed using an organic material in which a black colorant or a material which absorbs visible light such as a pigment is dissolved or dispersed, stray light from a light-emitting element formed later can be absorbed, thereby the contrast of each pixel can be improved.

Over the first pixel electrode (anode) 1213, an organic compound material is vapor deposited to selectively form a layer 1215 containing a light-emitting substance. Further, a second pixel (cathode) is formed over the layer 1215 containing a light-emitting substance.

The layer 1215 containing a light-emitting substance may appropriately adopt the structure shown in Embodiment 2.

In this manner, a light-emitting element 1217 constituted by the first pixel electrode (anode) 1213, the layer 1215 containing a light-emitting substance and a second pixel electrode (cathode) 1216 is formed.

In order to seal the light-emitting element 1217, a protective stack layer 1218 is formed. The protective stack layer is formed to have stacked layers of a first inorganic insulating film, a stress alleviation film and a second inorganic insulating film. Then, the protective stack layer 1218 and a second substrate 1204 are attached to each other with the first sealant 1205 and the second sealant 1206. Note that the second sealant is preferably dropped using a system for dropping a sealant. After applying the sealant onto the active matrix substrate by dropping it from a dispenser or discharging it, the second substrate can be attached to the active matrix substrate in vacuum, and sealed by performing ultraviolet curing.

Over the surface of the second substrate 1204, an antireflection film 1226 is provided for preventing reflection of the external light on the substrate surface. One or both of a polarizing plate and a retardation plate may be provided between the second substrate and the antireflection film. By providing the polarizing plate and the retardation plate, reflection of the external light on the pixel electrode can be prevented. Note that if the first pixel electrode 1213 and the second pixel electrode 1216 are formed using light-transmissive conductive films or semi-light-transmissive conductive films while the second insulator 1233 and the third insulator 1234 are formed using a material absorbing visible light or an organic material in which a material absorbing visible light is dissolved or dispersed, the external light does not reflect on each pixel electrode; therefore, the polarizing plate and the retardation plate are not required.

The connection wiring 1208 and the FPC 1209 are electrically connected to each other with an anisotropic conductive film or an anisotropic conductive resin 1227. Further, it is preferable to seal a connection portion of each wiring layer and a connection terminal with a sealing resin. With such a structure, it can be prevented that moisture from a cross-sectional portion enters and degrades the light-emitting element.

Note that between the second substrate 1204 and the protective stack layer 1218, space filled with an inert gas, for example a nitrogen gas may be provided instead of the second sealant 1206, thereby intrusion of moisture and oxygen can be further prevented.

In addition, a colored layer may be provided between the second substrate and the polarizing plate. In this case, by providing light-emitting elements capable of white light emission in the pixel portion and separately providing colored layers showing RGB, full color display can be performed. Alternatively, by providing light-emitting elements capable of blue light-emission in the pixel portion and separately providing colored layers showing RGB, full color display can be performed. Further, light-emitting elements for emitting red color, green color and blue color respectively may be provided in each pixel portion while a colored layer may also be provided. Such a display module has high color purity of each RGB, thereby high resolution display can be enabled.

In addition, a light-emitting display module may be formed by using a film or a substrate such as a resin for one or both of the first substrate 1200 and the second substrate 1204. When sealing is carried out without using a counter substrate, weight saving, downsizing and thinner films of the display device can be improved.

Further, the surface or end of the FPC (Flexible Printed Wiring) 1209 to function as an external input terminal may be provided with an IC chip such as a controller, a memory or a pixel driver circuit to form a light-emitting display module.

Note that each of Embodiment Mode 1 to Embodiment Mode 24 may be applied to this embodiment.

EMBODIMENT 5

Next, description is made with reference to FIGS. 41 to 43 on a fabrication method of an active matrix substrate and a liquid crystal display device having the same. FIGS. 41 to 43 are longitudinal cross-sectional structural views of an active matrix substrate, which schematically illustrate a driver circuit portion A-A' and a pixel portion B-B'.

As shown in FIG, 41(A), a first conductive film is deposited with a thickness of 100 to 200 nm over the substrate 800. Then, a first mask is formed by discharging or applying a photosensitive material onto the first conductive film, exposing it to light using a laser beam direct writing system and then developing it. Using the first mask, the first conductive film is etched to form first conductive layers 801, 802, 1803 and 804. Note that the first conductive layers 801, 802 and 1803 each function as gate electrodes while the first conductive layer 804 functions as a connection portion of the gate electrode. Then, the first insulating films 805 and 806 are formed over the surface of the substrate 800 and the first conductive layers 801, 802, 1803 and 804. Then, the amorphous semiconductor film 807 is formed with a thickness of 10 to 100 nm over the first insulating film. Then, the solution 808 containing a catalytic element is applied onto the surface of the amorphous semiconductor film 807.

Then, similarly to Embodiment 1, the amorphous semiconductor film 807 is heated to form the crystalline semiconductor film 811 as shown in FIG. 41(B). Note that the crystalline semiconductor film 811 contains a catalytic element. Then, a channel doping step for adding a p-type or n-type impurity element at a low concentration is performed selectively or wholly to a region to be a channel region of the TFT later. Then, the semiconductor film 812 containing a donor element is deposited with a thickness of 100 nm over the surface of the crystalline semiconductor film 811 containing a catalytic element.

Then, similarly to Embodiment 1, the crystalline semiconductor film 811 and the semiconductor film 812 containing a donor element are heated to getter the catalytic element and activate the donor element. That is, the catalytic element in the crystalline semiconductor film 811 containing the catalytic element is moved to the semiconductor film 812 containing the donor element. The crystalline semiconductor film having a reduced concentration of the catalytic element is denoted by 813 in FIG. 41(C). Here, it is a crystalline silicon film. In addition, the semiconductor film containing a donor element to which the catalytic element has moved becomes a crystalline semiconductor film by heating. That is, it becomes a crystalline semiconductor film containing a catalytic element and a donor element, which is denoted by 814 in FIG. 41(C).

Then, as shown in FIG. 42(A), the crystalline semiconductor film 814 containing the catalytic element and the donor element, and the crystalline semiconductor film and 813 are etched into a desired shape using a second mask similarly to Embodiment 1. The second mask can be formed by dropping an organic resin by a droplet discharge method, and drying it. Alternatively, similarly to the first mask, the second mask can be formed by exposing a photosensitive material to light using a laser beam direct writing system, and developing it. The etched crystalline semiconductor film containing a catalytic element and a donor element becomes the first semiconductor regions 824 to 826 shown in FIG. 42(B) while the etched crystalline semiconductor film 813 becomes the second semiconductor regions 821 to 823.

Then, in order to connect the gate electrodes of several TFTs to the source electrodes or the drain electrodes thereof, the first insulating films 805 and 806 are partially etched using the third mask to form a contact hole 850 as shown in FIG. 46. Note that fourth conductive layers 1831 to 1833 are denoted by dashed lines. The third mask can be formed by appropriately using a similar formation method to the first mask or the second mask. By connecting the gate electrode 802 to the fourth conductive layer 1833 functioning as a source electrode or a drain electrode through the contact hole, a resistor can be formed, and by connecting the resistor to an adjacent TFT, an inverter can be formed.

Then, as shown in FIG. 42(B), similarly to Embodiment 1, second conductive layers 1827 and 1828 are formed with a thickness of 500 to 1000 nm over the surface of the first semiconductor regions 824 to 826 and the second semiconductor regions 821 to 823. Then, after forming a fourth mask by applying a photosensitive material 829, exposing it to light using a laser beam direct writing system and developing it, the third conductive layer is etched to form the fourth conductive layers 1831 to 1836 functioning as a source electrode and a source wiring and a drain electrode as shown in FIG. 42(C). In addition, by performing etching in this step in such a manner that the third conductive layer is sectioned to form a source electrode and a drain electrode as well as to narrow a width of the source wiring or drain wiring, the aperture ratio of the liquid crystal display device formed later can be increased.

Then, the first semiconductor regions 824 to 826 are etched while leaving the fourth mask similarly to Embodiment 1 to form source regions and drain regions 837 to 843. At this time, the second semiconductor regions 821 to 823 are partially etched. The etched semiconductor regions which correspond to the third semiconductor regions 844 to 846 function as the channel forming regions. Then, after removing the fourth mask, a second insulating film 851 and a third insulating film 852 are formed over the surface of the fourth conductive layer and the third semiconductor region. Then, the third semiconductor regions 844 to 846 are heated to be hydrogenated.

According to the aforementioned steps, an active matrix substrate of a liquid crystal display device can be formed which is constructed of the driver circuit A-A' formed of the n-channel TFTs 1861 and 1862, and the pixel portion B-B' having the n-channel TFT 1863 with the double gate electrode 1803. In this embodiment, the driver circuit is formed using n-channel TFTs; therefore, p-channel TFTs are not required to be formed, thus the number of steps can be reduced. Note that only p-channel TFTs may be used to form the TFTs 1861 and 1862 which constitute the driver circuit and a pixel TFT 1863 instead of using the n-channel TFTs Then, as shown in FIG. 43(A), the fourth insulating film 871 is formed over the third insulating film 852 similarly to Embodiment 1. Here, after forming a fifth mask over the fourth insulating film 871, each of the fourth insulating film 871, the third insulating film 852 and the second insulating film 851 is etched to partially expose the first conductive layer 804 functioning as a connection portion of a gate electrode. Then, the fifth conductive layer 872 functioning as a gate wiring is formed to be connected to the first conductive layer 804 which functions as a connection portion of the gate electrode. The fifth insulating film 873 may be formed by appropriately using a similar material to the fourth insulating film.

Then, similarly to Embodiment 1, a sixth conductive layer is formed with a thickness of 100 to 300 nm to contact the fourth conductive layer 843. As a material of the sixth conductive layer, a light-transmissive conductive film or a reflective conductive film can be used. As a material of the light-transmissive conductive film, there are indium tin oxide (ITO), zinc oxide (ZnO), indium zinc oxide (IZO), gallium-doped zinc oxide (ZnO), indium tin oxide containing silicon oxide and the like. As a material of the reflective conductive film, there are metals such as aluminum (Al), titanium (Ti), silver (Ag) and tantalum (Ta), a metal material containing the metal and nitrogen at a concentration of the stoichiometric composition ratio or lower, nitride of the metal such as titanium nitride (TiN) or tantalum nitride (TaN), or aluminum containing 1 to 20% of nickel. As a method for forming the sixth conductive layer, a droplet discharge method, a coating method, a sputtering method, a vapor deposition method, a CVD method or the like is appropriately used. Note that in the case of using the coating method, the sputtering method, the vapor deposition method, the CVD method or the like, the conductive layer is formed by forming a mask by a droplet discharge method or by light exposure using a laser beam direct writing system, or the like, and then etching a conductive film.

Then, as shown in FIG. 43, an insulating film is deposited so as to cover a silicon nitride film 853 by a printing method or a spin coating method and an orientation film 1881 is formed by rubbing. Note that by forming the orientation film 1881 by an oblique vapor deposition method, it can be formed at a low temperature, and the orientation film can be formed over a low-heat-resistant plastic.

Over a counter substrate 1882, a second pixel electrode (counter electrode) 1883 and an orientation film 884 are formed. Subsequently, a sealant is formed in closed loop over the counter substrate 1882. At this time, the sealant is formed on the periphery of the pixel portion by a droplet discharge method. Then, a liquid crystal material is dropped inside the closed loop formed by the sealant by a dispenser method (dropping method).

The sealant may be mixed with a filler, and further, a color filter or a shielding film (black matrix) or the like may be formed on the counter substrate 1882.

Then, the counter substrate 1882 provided with the orientation film 884 and the second pixel electrode (counter electrode) 1833 is attached to the active matrix substrate in vacuum, and then subjected to ultraviolet curing to form a liquid crystal layer 885 filled with a liquid crystal material. Note that instead of the dispenser method (dropping method), a dip method (soak method) may be employed for forming the light-transmissive conductive film 175, by which a liquid crystal material is introduced after attaching a counter substrate by utilizing a capillary action.

According to the aforementioned steps, a liquid crystal display panel can be fabricated. Note that a protection circuit for preventing electrostatic damage, typically a diode may be provided between a connection terminal and a source wiring (gate wiring) or in a pixel portion. In this case, by fabricating a diode through similar steps to the aforementioned TFT, and connecting a gate wiring layer of the pixel portion to a drain or source wiring layer of the diode, electrostatic damage can be prevented.

According to the aforementioned steps, a liquid crystal display device can be formed. Note that each of Embodiment Mode 1 to Embodiment Mode 24 may be applied to this embodiment mode.

EMBODIMENT 6

Next, description is made with reference to FIGS. 44, 45 and 47 on a fabrication method of an active matrix substrate of Embodiment 5 of which driver circuit is formed of a CMOS circuit and a liquid crystal display device having the same. FIG. 47 is a plain view of a driver circuit of an active matrix substrate. FIGS. 44 and 45 are longitudinal cross-sectional structural views of an active matrix substrate, which schematically illustrate a driver circuit portion A-A' and a pixel portion B-B'.

As shown in FIG, 44(A), the first conductive layers 801, 802, 1803 and 804 functioning as gate electrodes, the first insulating films 805 and 806, the first semiconductor regions 824 to 826 and the second semiconductor regions 821 to 823 are formed through similar steps to Embodiment 5. Then, a mask 891 is formed in a region to be an n-channel TFT. Here, the mask 891 is formed to cover the first semiconductor regions 824 and 826 and the second semiconductor regions 821 and 823 by discharging polyimide by a droplet discharge method and drying it.

Then, an acceptor element 892 is added into the second semiconductor region 825 to be a p-channel TFT later, thereby forming a p-type semiconductor region 893 as shown in FIG. 44(B).

After that, the fourth conductive layers 1831 to 1836 functioning as a source electrode, a source wiring and a drain electrode are formed through similar steps to Embodiment 5. In addition, the source regions and drain regions 837, 838, 841 to 843, 894 and 895, and the third semiconductor regions 844 to 846 functioning as channel forming regions are formed. FIG. 47 shows a top view at this time. Note that the fourth conductive layers 1831 to 1833 are denoted by dashed lines. After forming the second insulating film 851 and the third insulating film 852, the third semiconductor regions 844 to 846 are heated to be hydrogenated.

Then, as shown in FIG. 45(A), after forming the fourth insulating film 871, the first conductive layer 804 functioning as a gate electrode is partially exposed to form the gate wiring 872 connected to the gate electrode. Subsequently, similarly to Embodiment 1, after forming the fifth insulating film 873, the fifth conductive layer 874 connected to the fourth conductive layer 843 is formed.

According to the aforementioned steps, an active matrix substrate of a liquid crystal display device as shown in FIG. 45(A) can be formed, which is constructed of the driver circuit A-A' formed of a CMOS circuit having the n-channel TFT 1861 and the p-channel TFT 1862, and the pixel portion B-B' having the n-channel TFT 1863 with the double gate 803.

After that, a liquid crystal display device as shown in FIG. 45(B) can be formed through similar steps to Embodiment 5.

EMBODIMENT 7

In this embodiment, description is made with reference to FIG. 48 on the external view of a liquid crystal display panel which corresponds to one mode of the semiconductor device of the invention. FIG. 48(A) is a top view of a panel in which a first substrate 1600 and a second substrate 1604 are sealed with a first sealant 1605 and a second sealant 1606. FIG. 48(B) is a cross-sectional view corresponding to each of A-A' and B-B' of FIG. 48(A). The active matrix substrate formed in Embodiment 1 can be used for the first substrate 1600.

In FIG. 48(A), reference numeral 1602 indicated by a dashed line is a pixel portion, and 1603 is a gate wiring driver circuit. Reference numeral 1601 indicated by a solid line is a source wiring (gate wiring) driver circuit. In this embodiment, the pixel portion 1602 and the gate wiring driver circuit 1603 are located in a region sealed with the sealant 1605. Reference numeral 1601 is a source wiring (source wiring) driver circuit and the source wiring driver circuit is provided in a chip form over the first substrate 1600.

Reference numeral 1600 is a first substrate, 1604 is a second substrate, and 1605 is a sealant containing a gap material for holding the gap of the sealed space. The first substrate 1600 and the second substrate 1604 are sealed with the sealant 1605, and the space therebetween is filled with a liquid crystal material.

Next, description is made with reference to FIG. 48(B) on a cross-sectional structure. Over the first substrate 1600, a driver circuit and a pixel portion are formed, which includes a plurality of semiconductor elements typified by TFTs. Over the surface of the second substrate 1604, a color filter 1621 is provided. As a driver circuit, the gate wiring driver circuit 1603 and the pixel portion 1602 are shown. Note that the gate wiring driver circuit 1603 is constructed of a circuit including an n-channel TFT 1612. Note that the driver circuit may be constructed of a CMOS circuit similarly to Embodiment 6.

In this embodiment, TFTs of the gate wiring driver circuit and the pixel portion are formed over the same substrate; therefore, the volume of the liquid crystal display device can be reduced.

In the pixel portion 1602, a plurality of pixels are formed, and a liquid crystal element 1615 is formed in each pixel. The liquid crystal element 1615 is a portion where a first electrode 1616, a second electrode 1618 and a liquid crystal material 1619 interposed therebetween overlap with each other. The first electrode 1616 of the liquid crystal element 1615 is electrically connected to a TFT 1611 through a wiring 1617. A gate electrode 1625 is connected to a gate wiring 1626 through a contact hole. Although the first electrode 1616 is formed after forming the gate wiring 1626 here, the gate wiring 1626 may be formed after forming the first electrode 1616. The second electrode 1618 of the liquid crystal element 1615 is formed on the second substrate 1604 side. Over the surface of each pixel electrode, orientation films 1630 and 1631 are formed.

Reference numeral 1622 is a columnar gap holding material (spacer), and provided to control the distance (cell gap) between the first electrode 1616 and the second electrode 1618. It is formed by etching an insulating film into a desired shape. Note that a spherical spacer may be used as well. Each signal and potential supplied to the source wiring driver circuit 1601 or the pixel portion 1602 are supplied from an FPC 1609 through a connection wiring 1623. Note that the connection wiring 1623 and the FPC are electrically connected to each other with an anisotropic conductive film or an anisotropic conductive resin 1627. Note that a conductive paste such as solder may be used instead of the anisotropic conductive film or the anisotropic conductive resin.

Though not shown, a polarizing plate is fixed with an adhesive to one or both surfaces of the first substrate 1600 and the second substrate 1604. Note that a retardation plate may be provided in addition to the polarizing plate.

EMBODIMENT 8

In this embodiment, description is made on a display module. Here, a liquid crystal module is shown in FIG. 49 as an example of a display module.

FIG. 49(A) is a cross-sectional view of a liquid crystal module for performing color display using white light and a color filter, which is in a TN (Twisted Nematic) mode, an IPS (In-Plane-Switching) mode, an MVA (Multi-domain Vertical Alignment) mode, an ASM (Axial Symmetric alignment Micro-cell) mode or an OCB (Optical Compensated Bend) mode.

As shown in FIG. 49(A), an active matrix substrate 1301 is attached to a counter substrate 1302 with a sealant 1300. Between them, a pixel portion 1303 and a liquid crystal layer 1304 are provided to form a display region.

A colored layer 1305 is required for performing color display, and in the case of an RGB method, colored layers corresponding to the respective colors of red, green and blue are provided correspondingly to the respective pixels. Outside the active matrix substrate 1301 and the counter substrate 1302, polarizing plates 1306 and 1307 are disposed respectively. Over the surface of the polarizing plate 1306, a protective film 1316 is formed to alleviate external shocks.

A connection terminal 1308 provided on the active matrix substrate 1301 is connected to a wiring board 1310 through an FPC 1309. The wiring board 1310 incorporates an external circuit 1312 such as a pixel driver circuit (e.g., an IC chip or a driver IC), a control circuit and a power source circuit.

A cold-cathode tube 1313, a reflecting plate 1314, an optical film 1315 and an inverter (not shown) constitute a back light unit. With such light source, light is projected on the liquid crystal display panel. The liquid crystal panel, the light source, the wiring board, the FPC and the like are maintained and protected by a bezel 1317.

FIG. 49(B) is a cross-sectional view of a liquid crystal module capable of performing color display by using cold-cathode tubes or diodes which emit R (Red), G (Green) and B (Blue) light without using a color filter like a field sequential mode, and by composing images by a time-division method. In comparison with FIG. 49(A), no color filter is provided. In the reflecting plate 1314, cold-cathode tubes 1321 to 1323 for emitting R (Red), G (Green) and B (Blue) light respectively are provided. In addition, a controller (not shown) for controlling the emission of such cold-cathode tubes is provided. Further, a liquid crystal layer 1324 is filled with ferroelectric liquid crystals, and thus is capable of high-speed operation; therefore, images can be composed by the time-division method.

Note that any of Embodiment Mode 1 to Embodiment Mode 24 can be applied to this embodiment mode.

EMBODIMENT 9

In this embodiment mode, description is made with reference to FIG. 54 on structures of a gate wiring input terminal and a source wiring input terminal portion provided on the periphery of a substrate. FIGS. 54(A), (C) and (E) are top views of a peripheral portion of a substrate and FIGS. 54(B), (D) and (F) are longitudinal cross-sectional structural views along K-L and M-N of FIGS. 54(A), (C) and (E) respectively. Note that K-L is a longitudinal cross-sectional view of a gate wiring input terminal and M-N is a longitudinal cross-sectional view of a source wiring input terminal portion.

As shown in FIG. 54(A) and FIG. 54(B), a first substrate 11 and a second substrate 21 are sealed with a sealant 20, inside which a pixel portion is formed where a first pixel electrode 19 and a pixel TFT 1 are arranged. In addition, an insulator 27 for covering an edge of the first pixel electrode 19 is formed, and over the surface of the insulator 27 and the first pixel electrode 19, a layer 29 containing a light-emitting substance and a second pixel electrode 30 are formed, so that the first pixel electrode, the layer 29 containing a light-emitting substance and the second pixel electrode 30 constitute a light-emitting element. Note that a liquid crystal element may be provided instead of the light-emitting element. In this specification, a liquid crystal element corresponds to a portion having two electrodes and a liquid crystal material interposed therebetween.

In FIG. 54(A) and FIG. 54(B), a gate wiring input terminal 13 and a source wiring input terminal 26 are formed through similar steps to a gate electrode 12 of the TFT 1. The gate wiring input terminal 13 is connected to each gate electrode through a gate wiring 17 formed over a first interlayer insulating film 16. The source wiring input terminal 26 is connected to each of power source lines 14*a* and 14*b* and a source wiring 14*c*.

The first pixel electrode 19 is formed over a second interlayer insulating film 18 formed over the first interlayer insulating film 16. Note that the first pixel electrode 19 is connected to a drain electrode 15 with the first interlayer insulating film 16 and a second interlayer insulating film 18 interposed therebetween.

The gate wiring input terminal 13 and the source wiring input terminal 26 are connected to FPCs 24 and 25 through connection layers 22 and 23 respectively. Note that the connection layers 22 and 23 and the FPCs 24 and 25 are indicated by dashed lines in FIG. 54(A).

In FIG. 54(C) and FIG. 54(D), a gate wiring input terminal 33 is formed through similar steps to the power source lines 14*a* and 14*b* and the source wiring 14*c*, and the source wiring input terminal 26 is a part of the power source lines 14*a* and 14*b* and the source wiring 14*c*. The gate wiring input terminal 33 and the gate electrode 12 are connected to each other through the gate wiring 17 formed over the first interlayer insulating film 16.

Other structures are similar to those of FIG. 54(A) and FIG. 54(B).

In FIG. 54(E) and 54(F), a gate wiring input terminal 43 is a part of the gate wiring 43, and the source wiring input terminal 44 is formed simultaneously with the gate wiring 43. The source wiring input terminal 44 is formed after removing the first interlayer insulating film formed over the power source lines 14*a* and 14*b* and the source wiring 14*c*, over the exposed power source lines 14*a* and 14*b* and the source wiring 14*c*.

Other structures are similar to those of FIGS. 54(A) and 54(B).

Note that although description has been made on the structure of a TFT shown in Embodiment Mode 1, this embodiment can be appropriately applied to Embodiment Mode 2 to embodiment Mode 24.

EMBODIMENT 10

Description is made on an example of a protective circuit included in the semiconductor device of the invention. The protective circuit is constructed of one or more elements selected from a TFT, a diode, a resistor and a capacitor. Described below are several configurations of the protective circuit and the operation thereof. First, description is made below with reference to FIG. 55 on the configuration of an equivalent circuit diagram of a protective circuit which is disposed between an external circuit and an internal circuit and which corresponds to one input terminal. The protective circuit shown in FIG. 55(A) includes p-channel TFTs 7220 and 7230, capacitors 7210 and 7240 and a resistor 7250. The resistor 7250 is a resistor having two terminals, one of which is supplied with an input voltage Vin (hereinafter referred to as Vin) and the other of which is supplied with a low-potential voltage VSS (hereinafter referred to as VSS).

The protective circuit shown in FIG. 55(B) is an equivalent circuit diagram in which the p-channel TFTs 7220 and 7230 are substituted with rectifying diodes 7260 and 7270. A protective circuit shown in FIG. 55(C) is an equivalent circuit diagram in which the p-channel TFTs 7220 and 7230 are substituted with TFTs 7350, 7360, 7370 and 7380. In addition, a protective circuit having a different configuration from the aforementioned is shown in FIG. 55(D), which includes resistors 7280 and 7290 and an n-channel TFT 7300. A protective circuit shown in FIG. 55(E) includes resistors 7280 and 7290, a p-channel TFT 7310, and an n-channel TFT 7320. Note that an element constituting the aforementioned protective circuit is preferably formed of an amorphous semiconductor having high withstand voltage. This Embodiment can be freely combined with aforementioned Embodiment Modes.

EMBODIMENT 11

In this embodiment, description is made with reference to FIG. 50 on mounting of a driver circuit onto the display panel shown in the aforementioned embodiment.

As shown in FIG. 50(A), a source wiring driver circuit 1402 and gate wiring driver circuits 1403*a* and 1403*b* are mounted on the periphery of a pixel portion 1401. In FIG. 50(A), IC chips 1405 are mounted on a substrate 1400 as the source wiring driver circuit 1402 and the gate wiring driver circuits 1403*a* and 1403*b* by a mounting method using a known anisotropic conductive adhesive and an anisotropic conductive film, a COG method, a wire bonding method, reflow processing with solder or the like. Here, the COG method is used to connect the IC chip to an external circuit through an FPC (Flexible Printed Circuit).

Note that a part of the source wiring driver circuit 1402, for example an analog switch may be integrally formed over the substrate while the other parts thereof may be mounted as a separate IC chip.

Alternatively, as shown in FIG. 50(B), in the case of forming a semiconductor element typified by a TFT using an SAS or a crystalline semiconductor, there is a case where the pixel portion 1401 and the gate wiring driver circuits 1403*a* and 1403*b* are integrally formed over the substrate while the source wiring driver circuit 1402 or the like is mounted as a separate IC chip. In FIG. 50(B), the IC chip 1405 is mounted as the source wiring driver circuit 1402 on the substrate 1400 by the COG method. The IC chip is connected to an external circuit through the FPC 1406.

Note that a part of the source wiring driver circuit 1402, for example an analog switch may be integrally formed over the substrate while the other parts thereof may be mounted as a separate IC chip.

Further, as shown in FIG. 50(C), there is a case where the source wiring driver circuit 1402 or the like is mounted by the TAB method instead of the COG method. The IC chip is connected to an external circuit through the FPC 1406. Although the source wiring driver circuit is mounted by the TAB method in FIG. 50(C), the gate wiring driver circuit may be mounted by the TAB method.

When the IC chip is mounted by the TAB method, the pixel portion can be provided in a large area relatively to the substrate, thereby a narrower frame can be achieved.

Note that a part of the source wiring driver circuit 1402, for example an analog switch may be integrally formed over the substrate while the other parts thereof may be mounted as a separate IC chip.

Although the IC chip is formed using a silicon wafer, an IC in which a circuit is formed over a glass substrate (hereinafter referred to as a driver IC) may be provided instead of the IC chip. An IC chip is obtained from a circular silicon wafer; therefore, it has a restriction on shapes of the mother substrate. On the other hand, a driver IC uses glass as a mother substrate; therefore, it has no restriction on the shapes and the mass productivity can thus be increased. Therefore, the shape and dimension of the driver IC can be set freely. For example, when a driver IC is formed to have a long side of 15 to 80 nm, the number of the required ICs can be reduced as compared to the case of mounting IC chips. As a result, the number of the connection terminals can be reduced to improve the production yield.

A driver IC can be formed using a crystalline semiconductor formed over a substrate, and the crystalline semiconductor is preferably formed by irradiation of continuous wave laser light. A semiconductor film obtained by irradiation of continuous wave laser light has few crystal defects but has crystal grains of a large grain size. As a result, a transistor having such a semiconductor film has excellent mobility and response speed, and thus is capable of high-speed operation, which is suitable for a driver IC.

EMBODIMENT 12

As an electronic apparatus which incorporates the display device shown in the aforementioned embodiments into a housing, there are a television (also simply referred to as a TV or a television receiver), a camera such as a digital camera or a digital video camera, a portable phone apparatus (also simply referred to as a portable phone set or a portable phone), a portable information terminal such as a PDA, a portable game machine, a computer monitor, a computer, an audio reproducing device such as a car audio, an image reproducing device provided with a recording medium such as a home game machine or the like. Specific examples of them are described with reference to FIG. 24.

A portable information terminal shown in FIG. 52(A) includes a main body 9201, a display portion 9202 and the like. The display portion 9202 may adopt the display device shown in Embodiment Modes 1 to 24 and Embodiments 1 to 12. By using the display device as one aspect of the invention, a portable information terminal capable of performing high-quality display can be provided at low cost.

A digital video camera shown in FIG. 52(B) includes a display portion 9701, a display portion 9702 and the like. The display portion 9701 may adopt the display device shown in Embodiment Modes 1 to 24 and Embodiments 1 to 12. By using the display device as one aspect of the invention, a digital video camera capable of performing high-quality display can be provided at low cost.

A portable information terminal shown in FIG. 52(C) includes a main body 9101, a display portion 9102 and the like. The display portion 9102 may adopt the display device shown in Embodiment Modes 1 to 24 and Embodiments 1 to 12. By using the display device as one aspect of the invention, a portable information terminal capable of performing high-quality display can be provided at low cost.

A portable television shown in FIG. 52(D) includes a main body 9301, a display portion 9301, a display portion 9302 and the like. The display portion 9302 may adopt the display device shown in Embodiment Modes 1 to 24 and Embodiments 1 to 12. By using the display device as one aspect of the invention, a portable television capable of performing high-quality display can be provided at low cost. Such a television can be applied to those having various sizes in the range from a compact size mounted on a portable terminal such as a portable phone, a medium size for portable purpose to a large size (for example, 40 inches or larger).

A portable computer shown in FIG. 52(E) includes a main body 9401, a display portion 9402 and the like. The display portion 9402 may adopt the display device shown in Embodiment Modes 1 to 24 and Embodiments 1 to 12. By using the display device as one aspect of the invention, a portable computer capable of performing high-quality display can be provided at low cost.

A television shown in FIG. 52(F) includes a main body 9501, a display portion 9502 and the like. The display portion 9502 may adopt the display device shown in Embodiment Modes 1 to 24 and Embodiments 1 to 12. By using the display device as one aspect of the invention, a television capable of performing high-quality display can be provided at low cost.

Among the aforementioned electronic apparatuses, those using a secondary battery can operate for a longer period as the power consumption is reduced, and the secondary battery is not required to be charged.

A large-size television shown in FIG. 53 includes a main body 9601, a display portion 9602 and the like. A wall-hanging supporter is provided on the rear or top portion of the main body. FIG. 53 shows a wall-hanging television as a typical example of the large-size television. As shown in FIG. 53, display can be performed by hanging the television on a wall 9603. In addition, the television can be applied to various objects, in particular to a large-area display medium such as an information display board at the train station or airport or an advertising display board on the street. The display portion 9602 may adopt the display device shown in Embodiment Modes 1 to 24 and Embodiments 1 to 12. By using the display device as one aspect of the invention, a large-size television capable of performing high-quality display can be provided at low cost.

Figure 1:
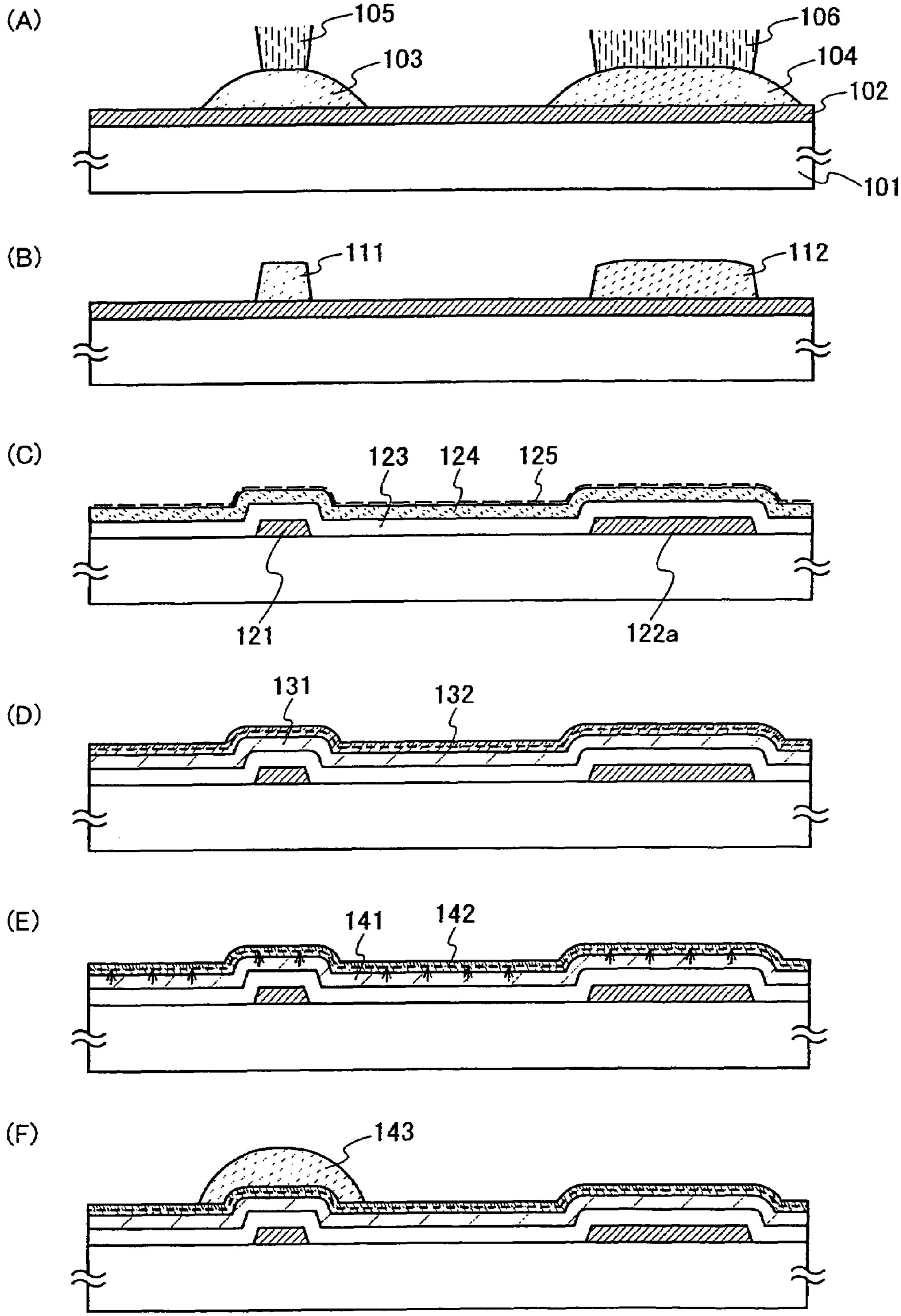
FIG. 1 shows cross-sectional views illustrating fabrication steps of a semiconductor device in accordance with the invention.
Figure 2:
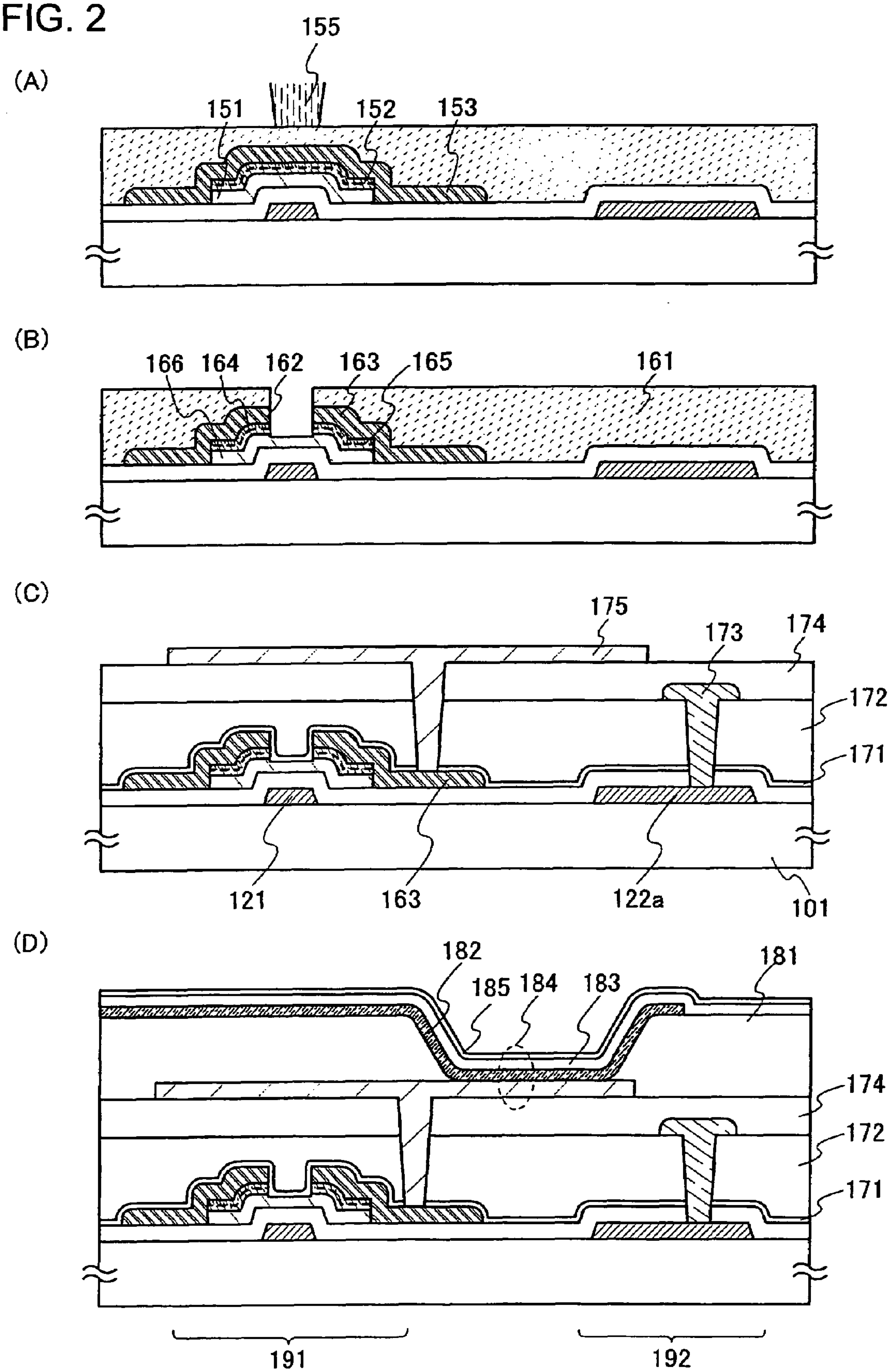
FIG. 2 shows cross-sectional views illustrating fabrication steps of a semiconductor device in accordance with the invention.
Figure 3:
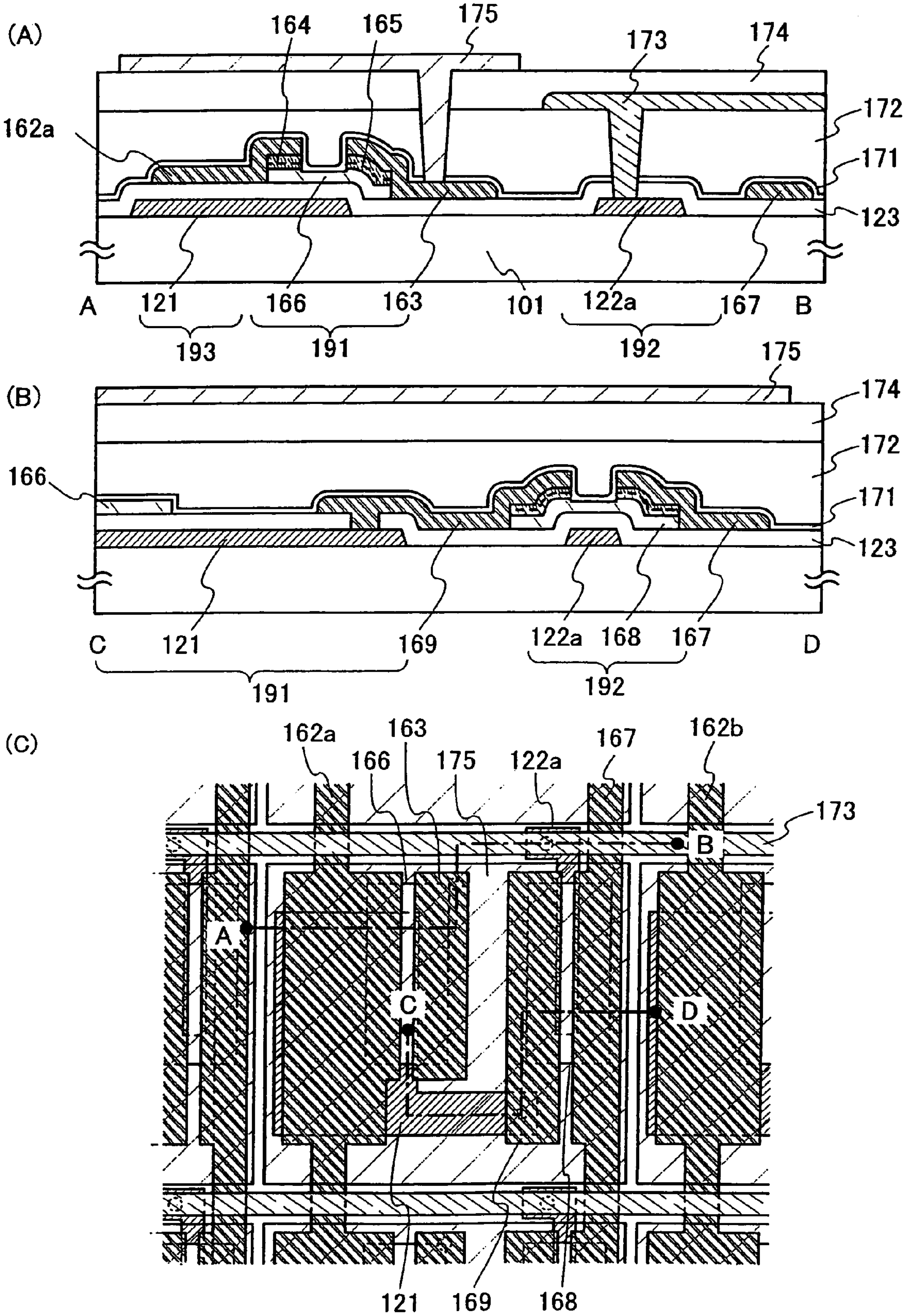
FIG. 3 shows a top view and cross-sectional views each illustrating a structure of a semiconductor device in accordance with the invention.
Figure 4:
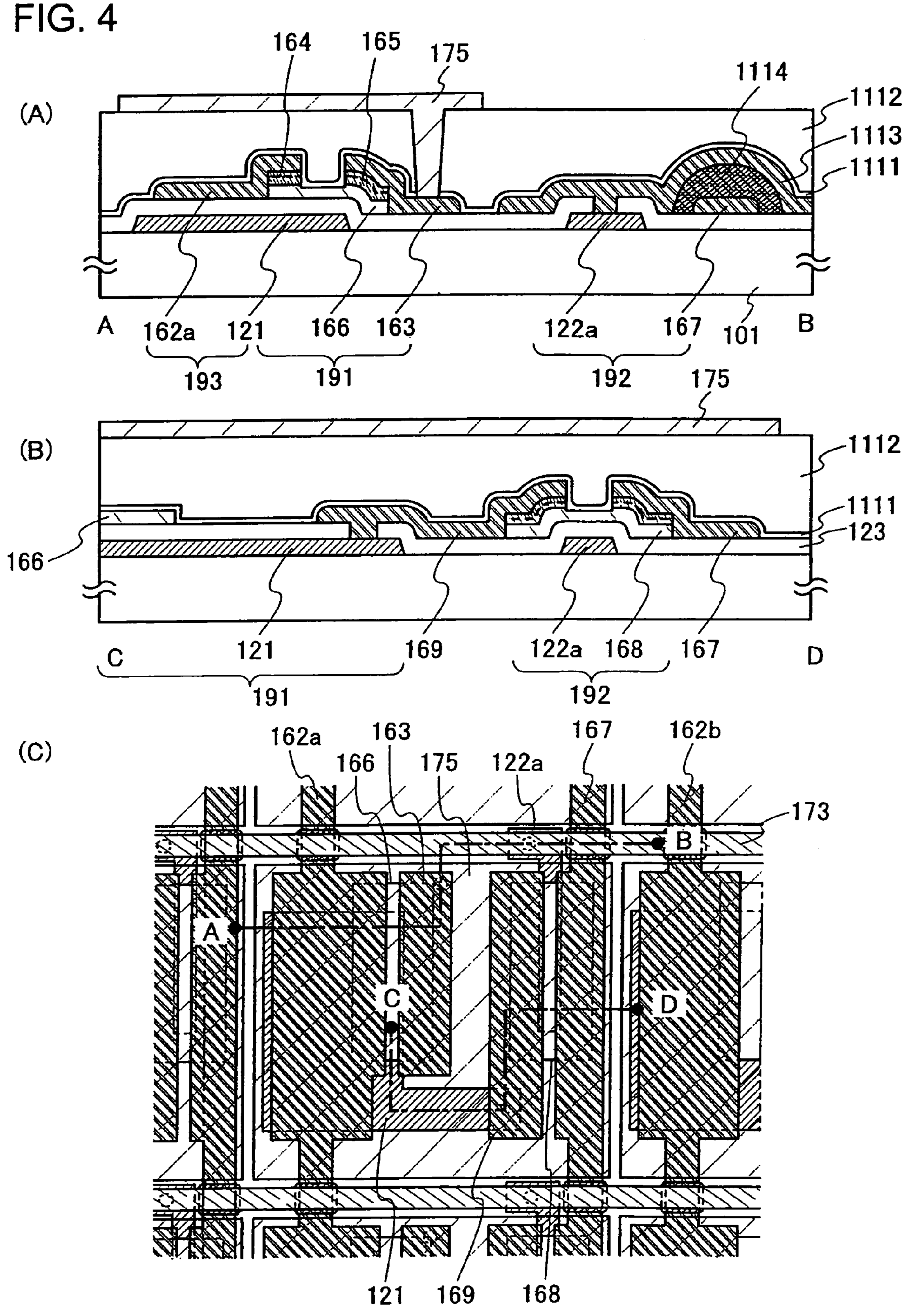
FIG. 4 shows a top view and cross-sectional views each illustrating a structure of a semiconductor device in accordance with the invention.
Figure 5:
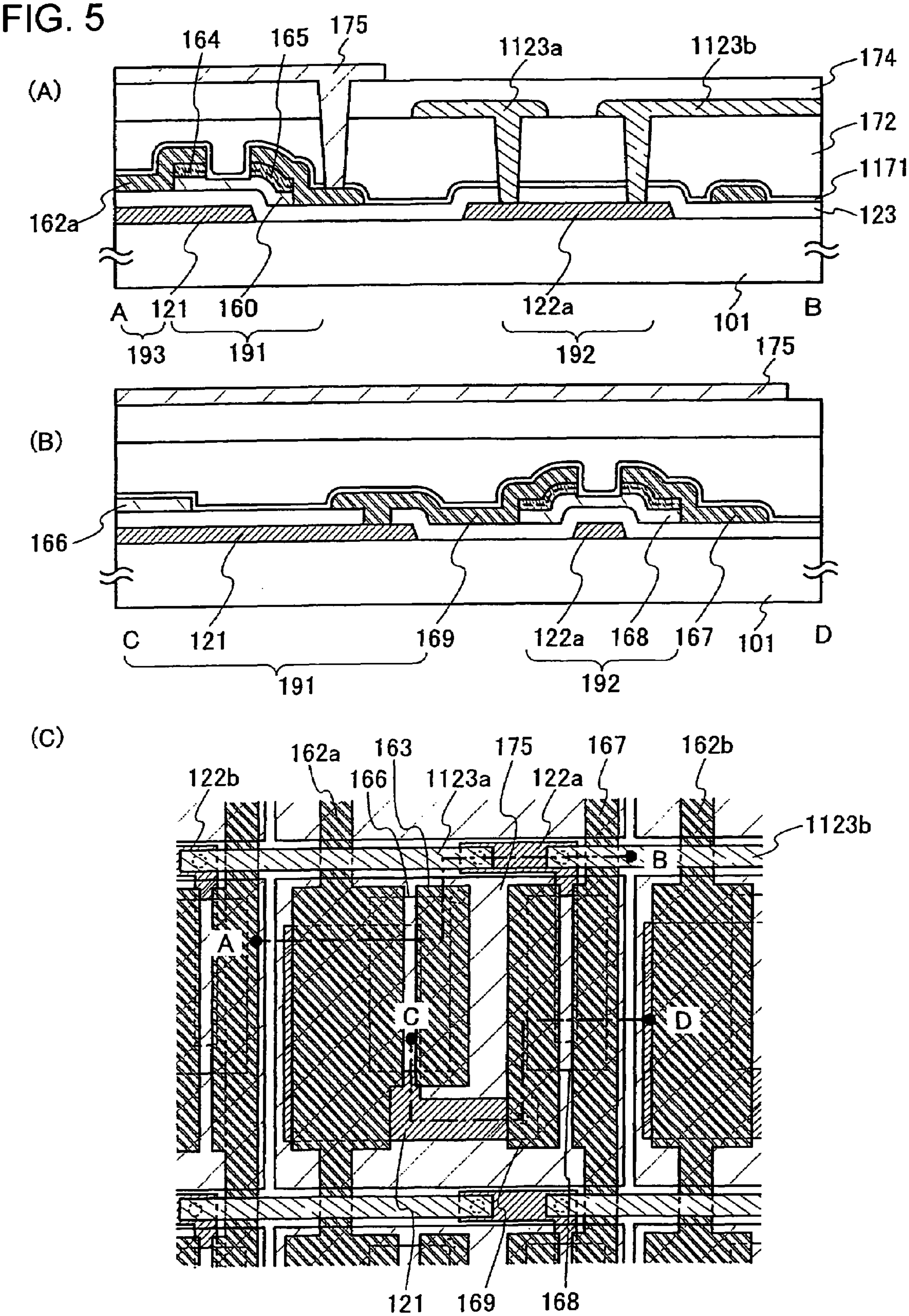
FIG. 5 shows a top view and cross-sectional views each illustrating a structure of a semiconductor device in accordance with the invention.
Figure 6:
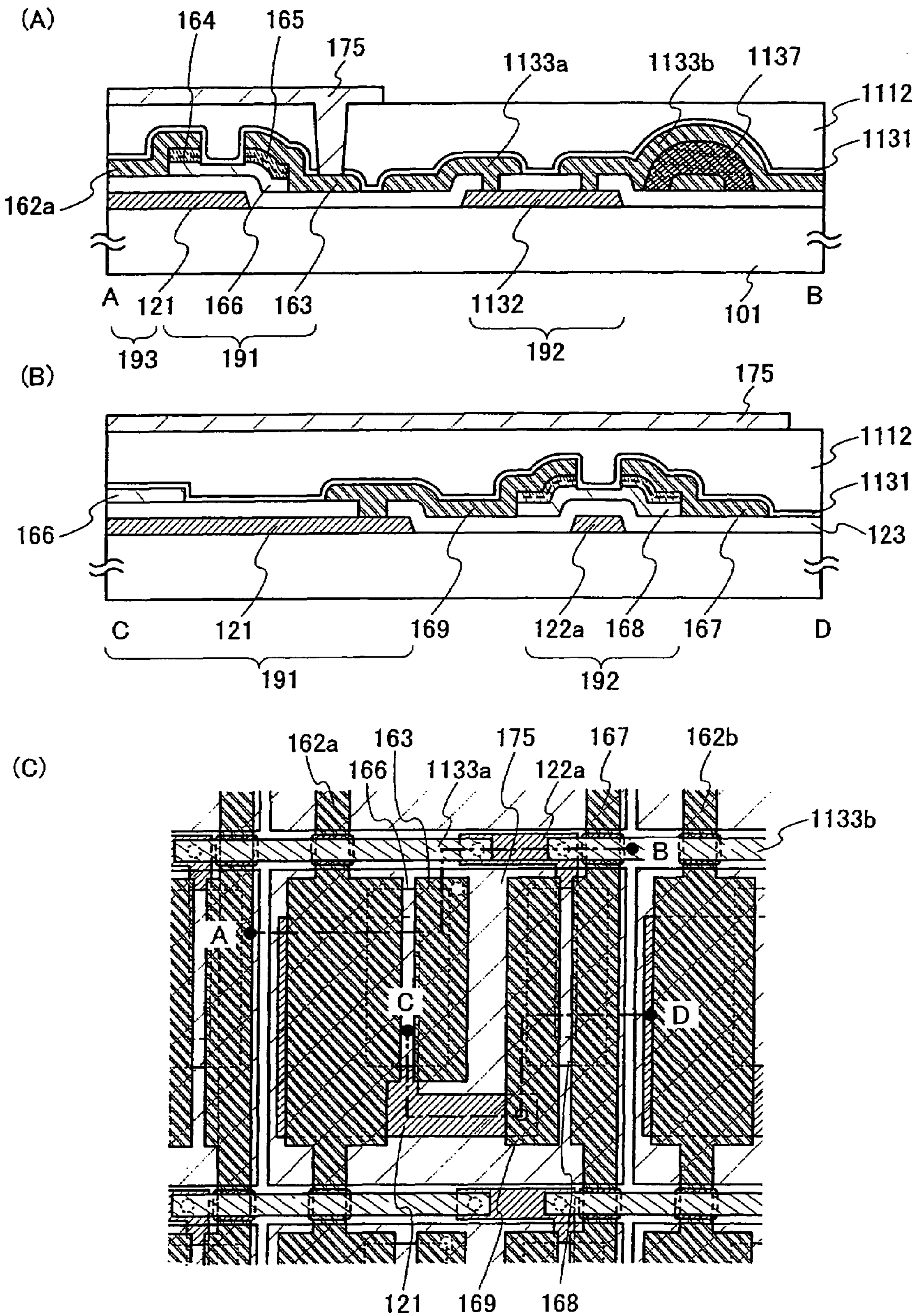
FIG. 6 shows a top view and cross-sectional views each illustrating a structure of a semiconductor device in accordance with the invention.
Figure 7:
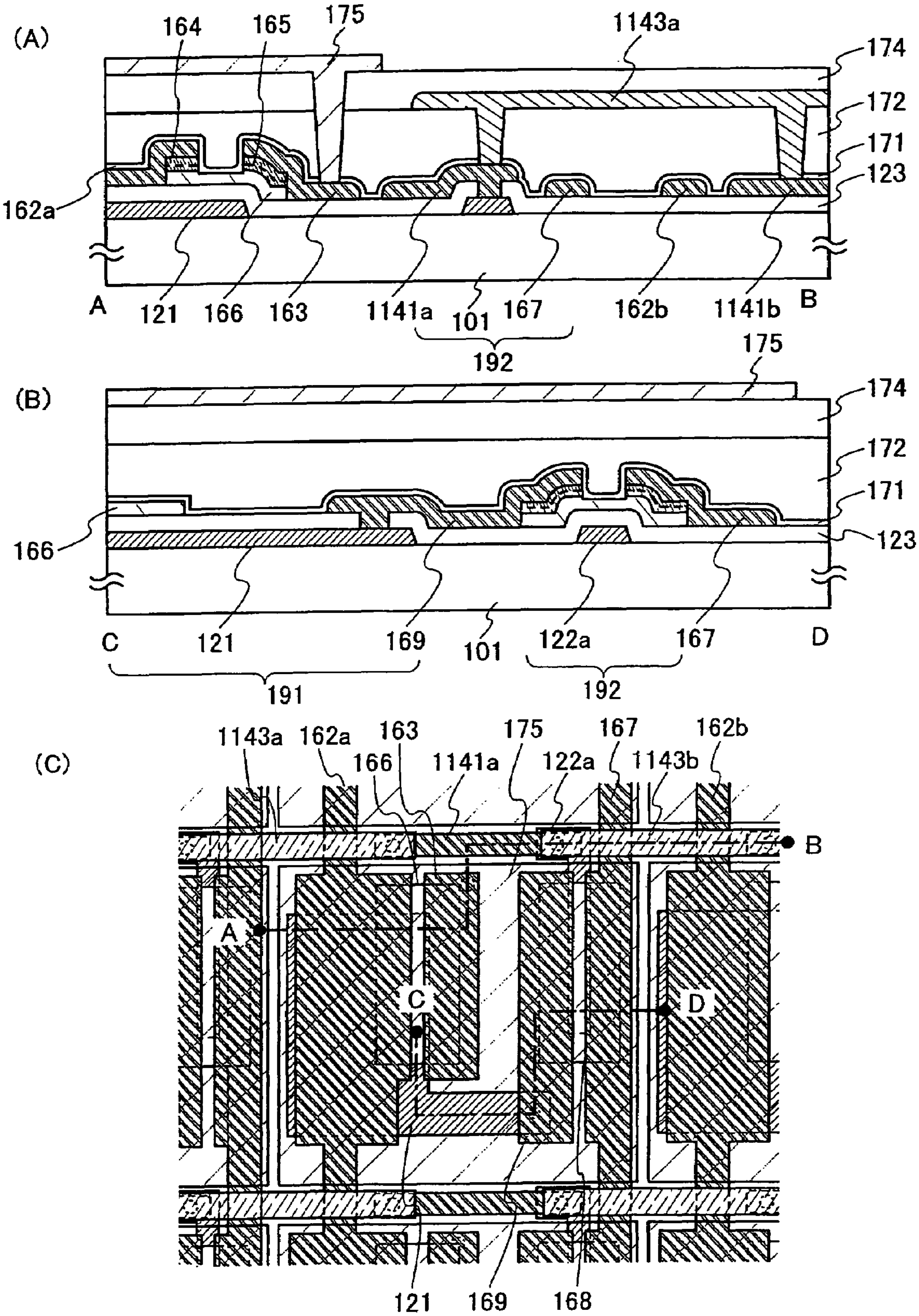
FIG. 7 shows a top view and cross-sectional views each illustrating a structure of a semiconductor device in accordance with the invention.
Figure 8:
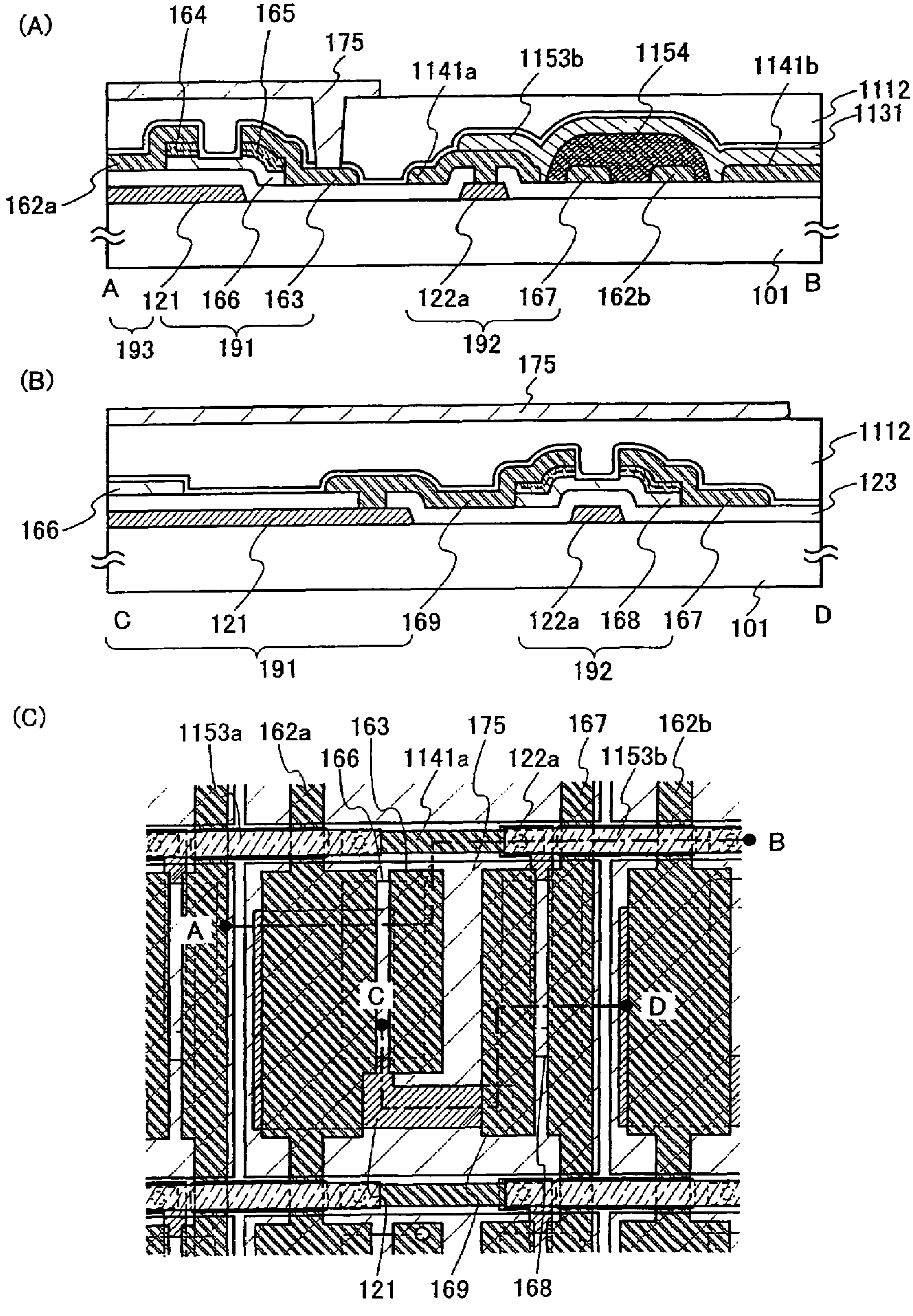
FIG. 8 shows a top view and cross-sectional views each illustrating a structure of a semiconductor device in accordance with the invention.
Figure 9:
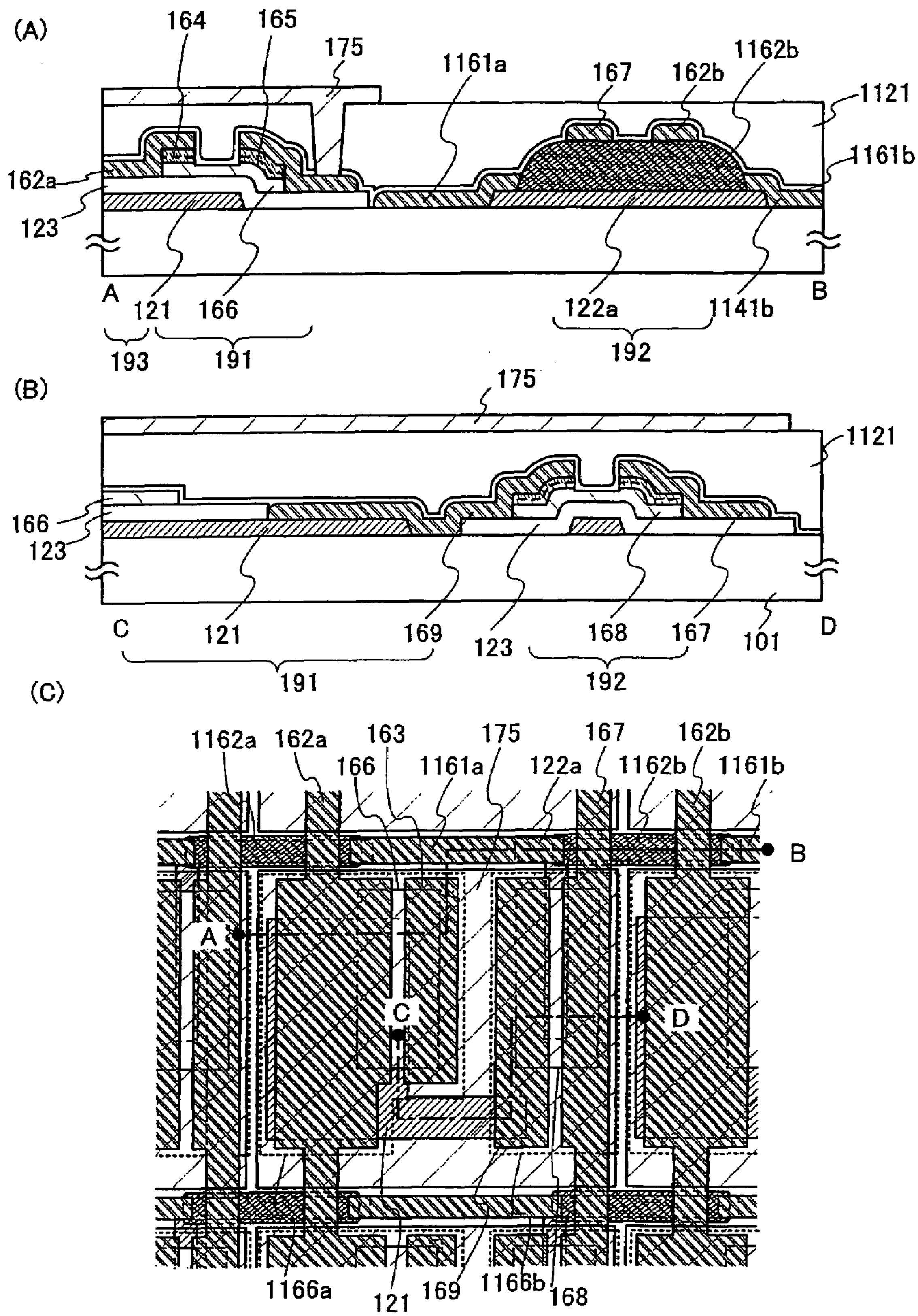
FIG. 9 shows a top view and cross-sectional views each illustrating a structure of a semiconductor device in accordance with the invention.
Figure 10:
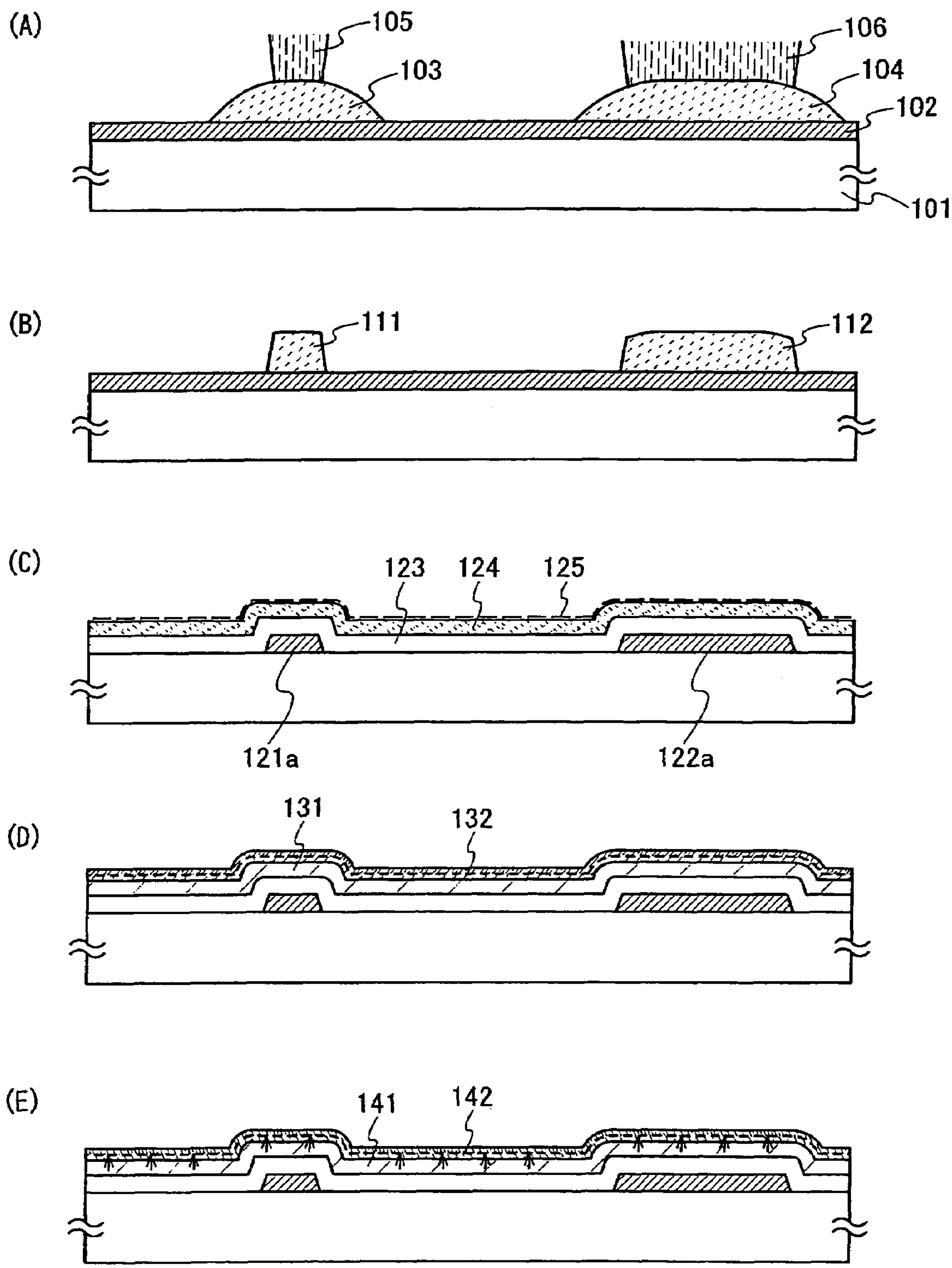
FIG. 10 shows cross-sectional views illustrating fabrication steps of a semiconductor device in accordance with the invention.
Figure 11:
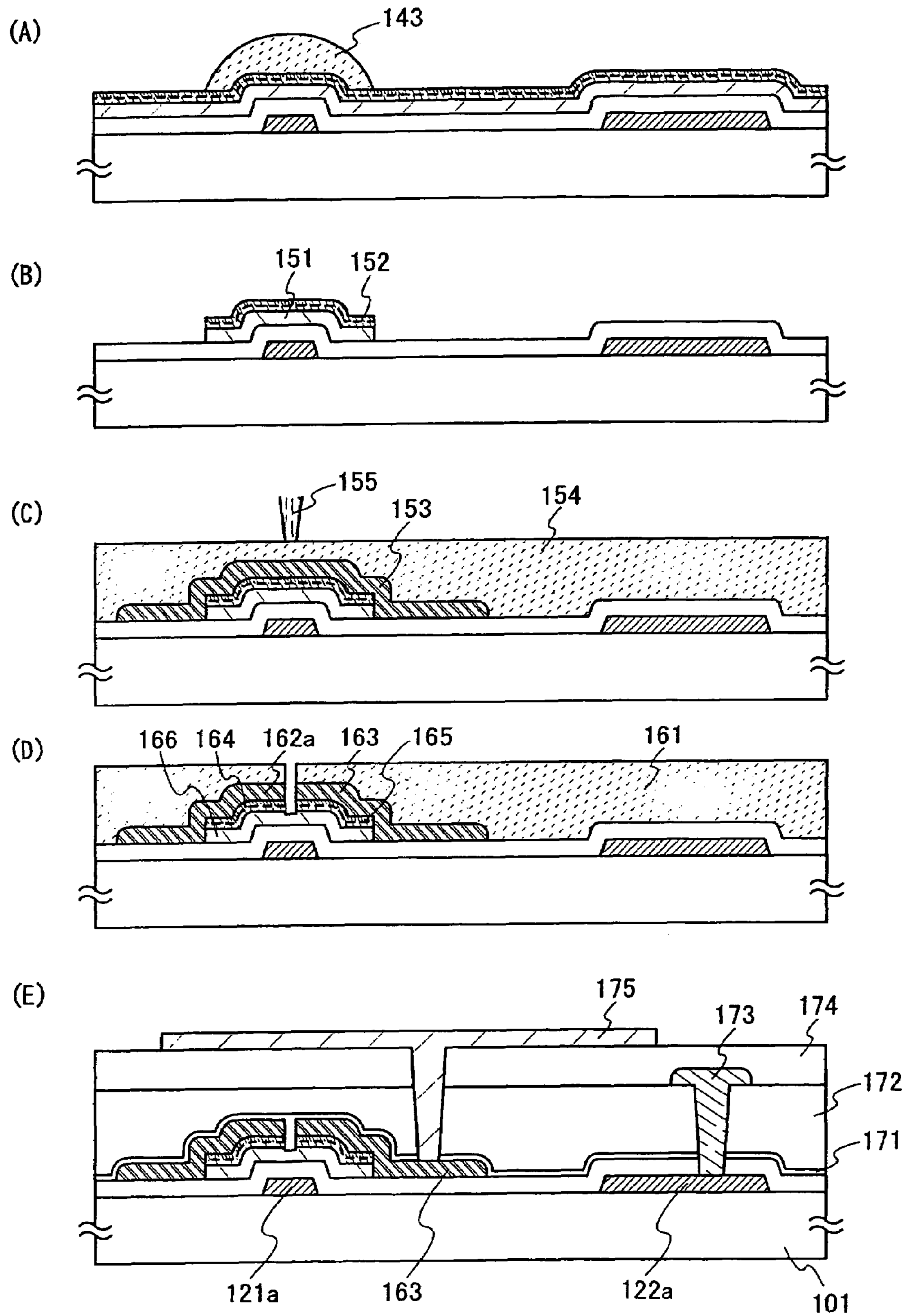
FIG. 11 shows a plan view and cross-sectional views each illustrating a structure of a semiconductor device in accordance with the invention.
Figure 12:
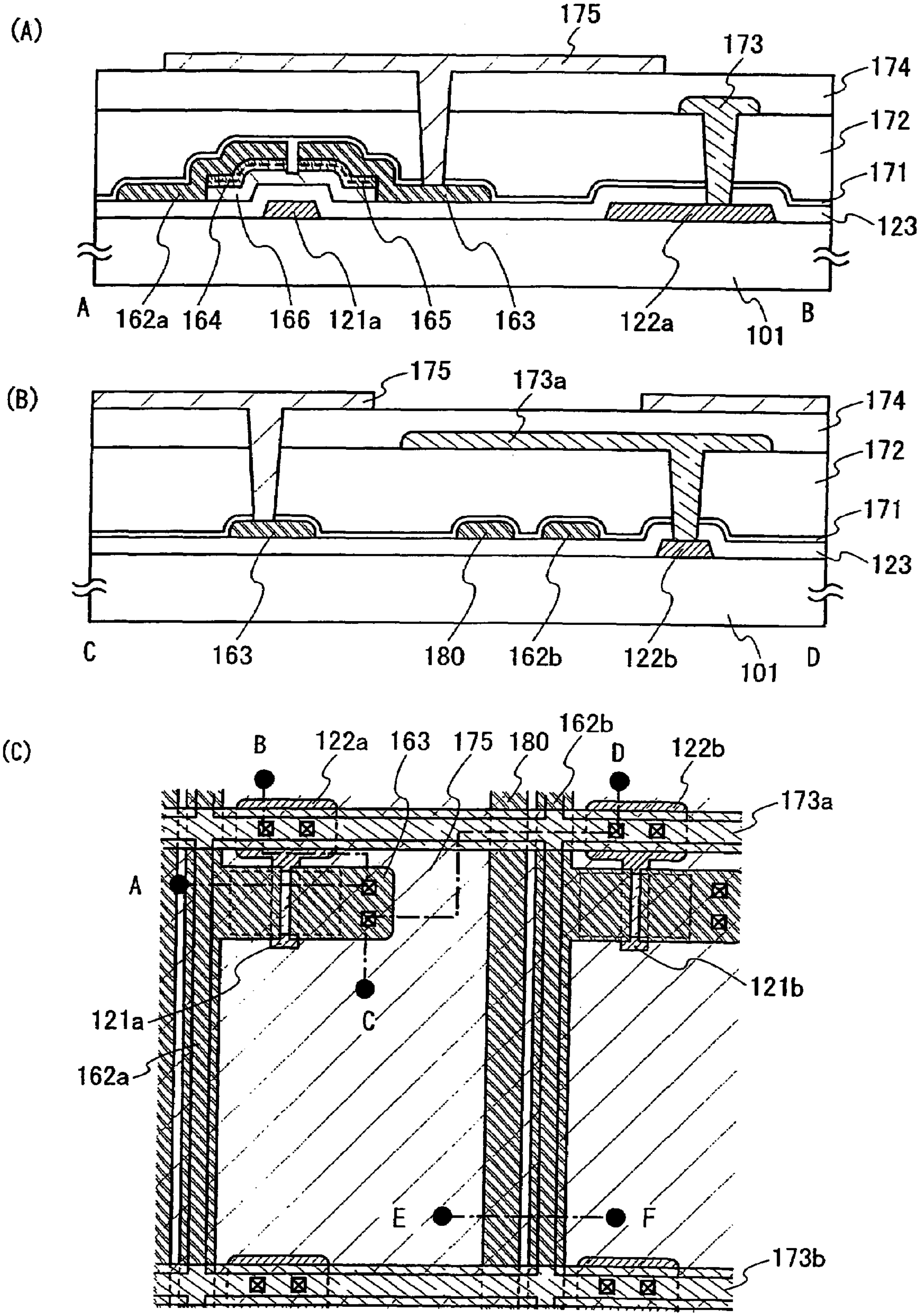
FIG. 12 shows a plan view and cross-sectional views each illustrating a structure of a semiconductor device in accordance with the invention.
Figure 13:
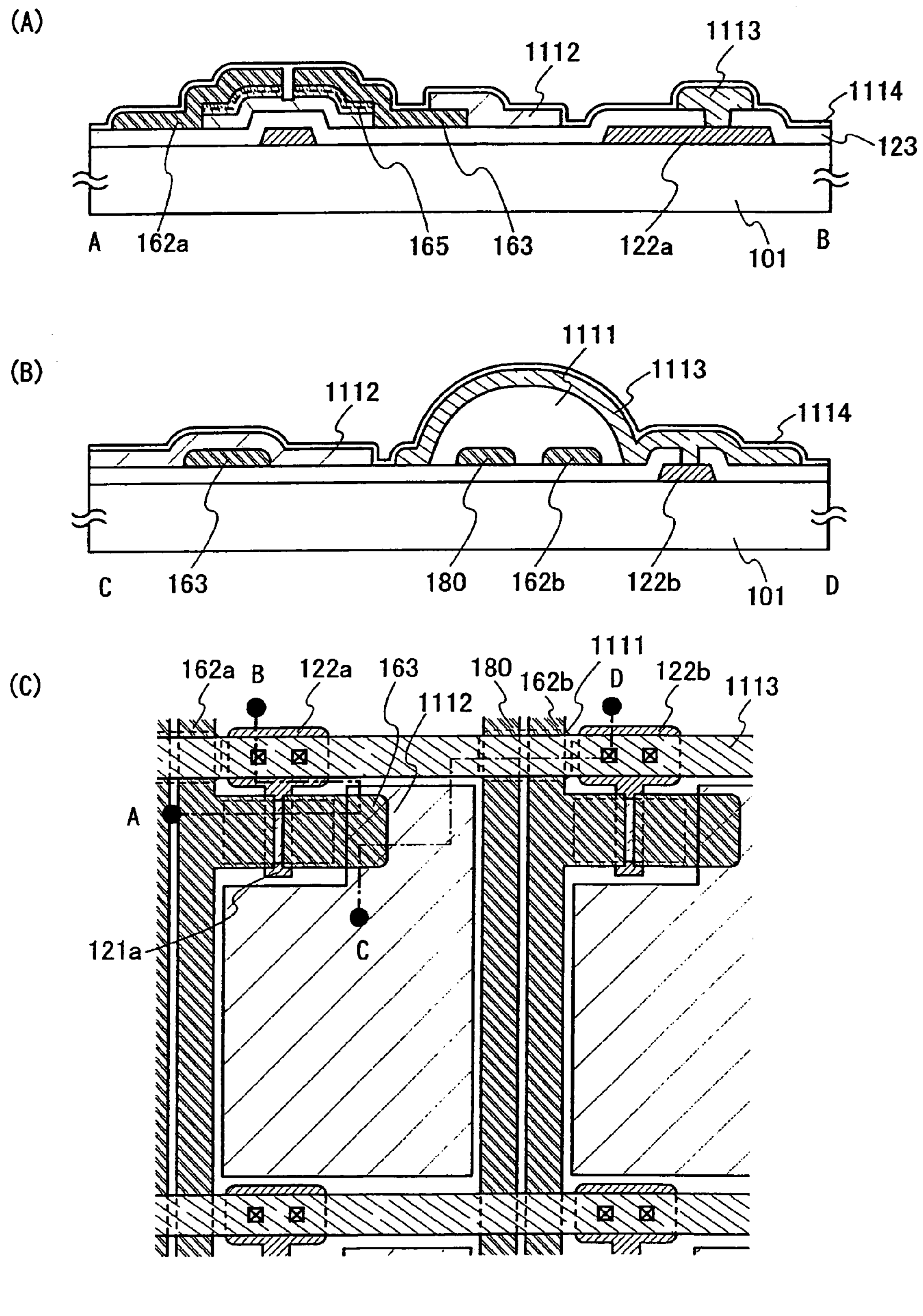
FIG. 13 shows a plan view and cross-sectional views each illustrating a structure of a semiconductor device in accordance with the invention.
Figure 14:
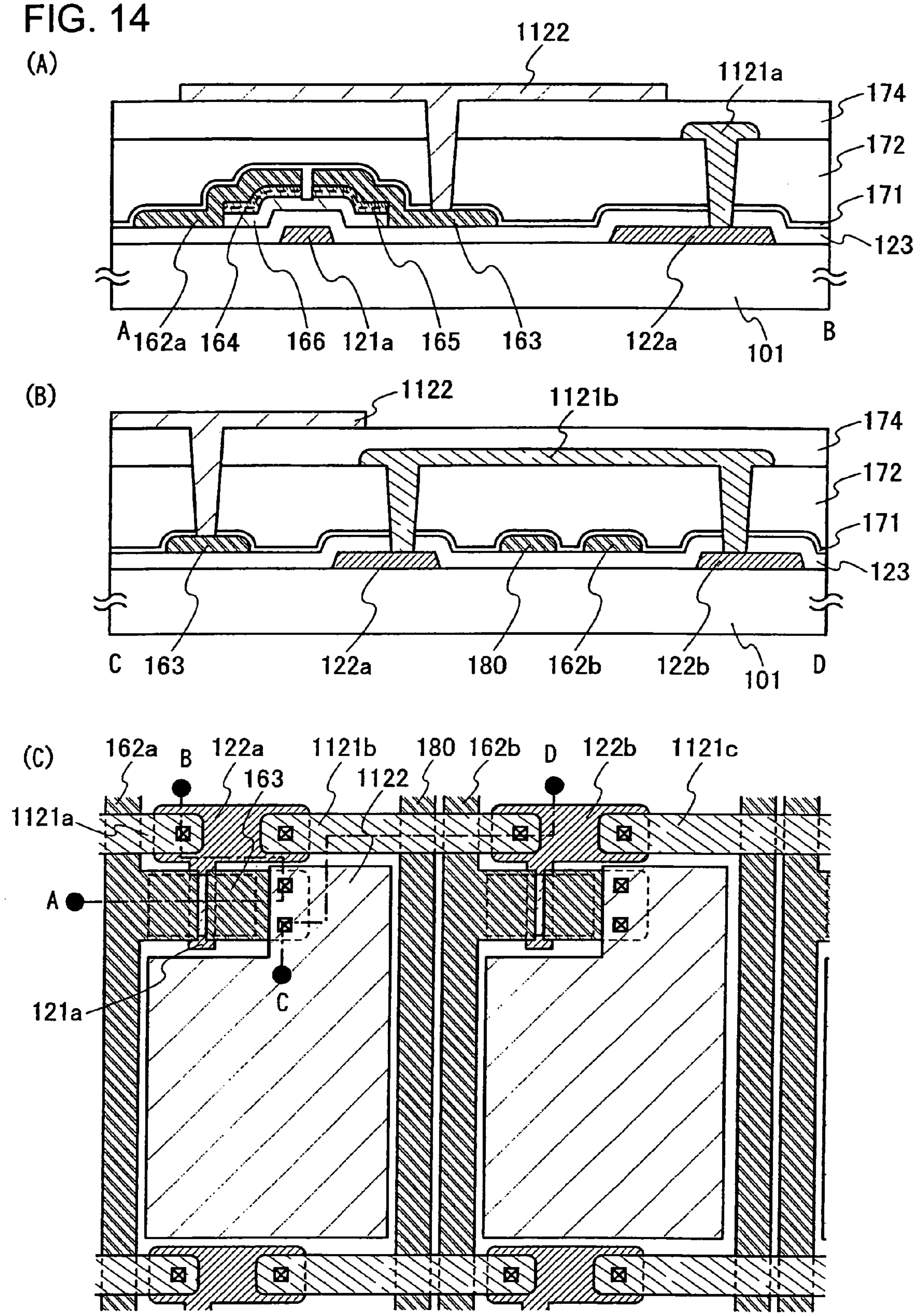
FIG. 14 shows a plan view and cross-sectional views each illustrating a structure of a semiconductor device in accordance with the invention.
Figure 15:
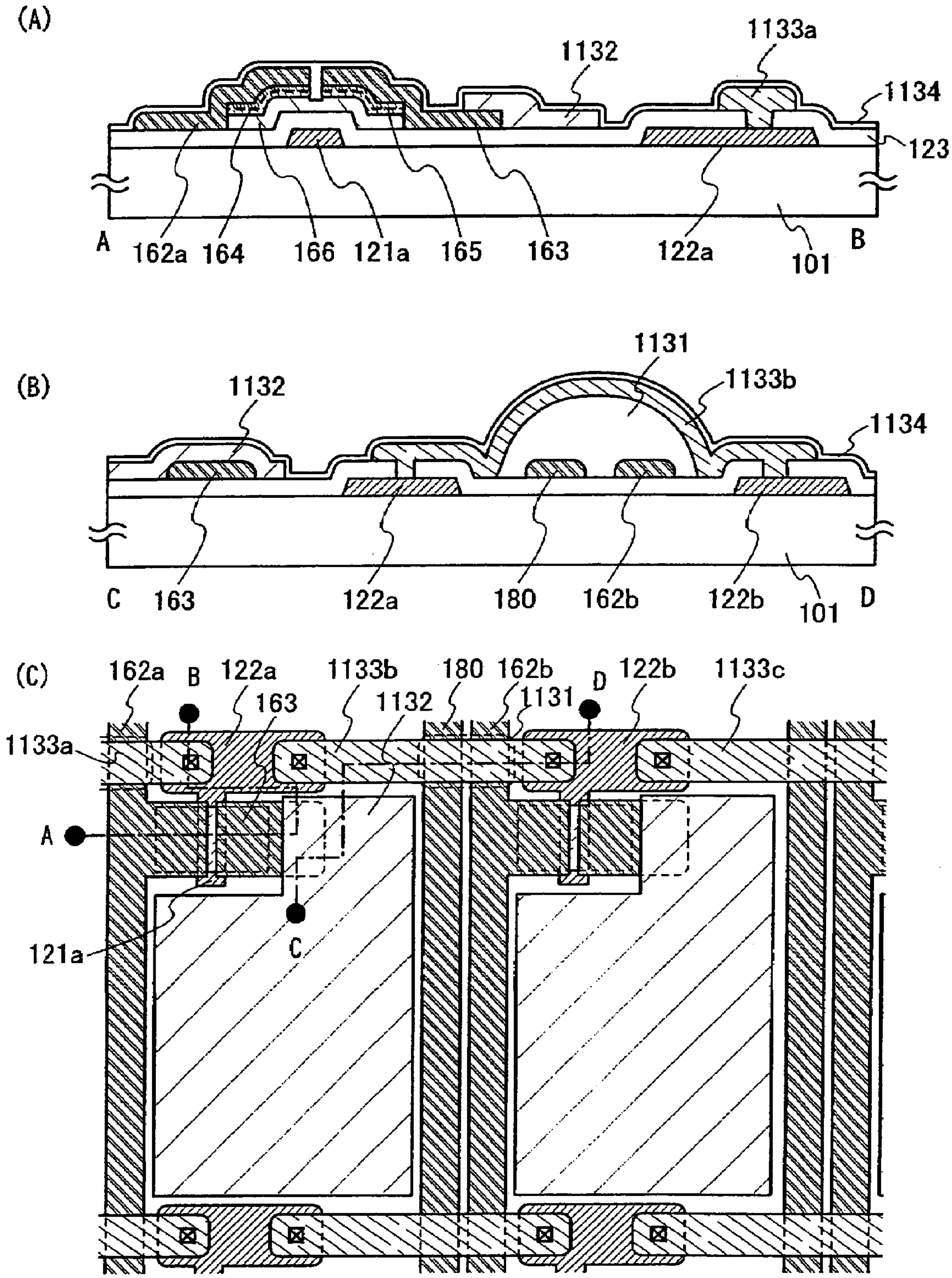
FIG. 15 shows a plan view and cross-sectional views each illustrating a structure of a semiconductor device in accordance with the invention.
Figure 16:
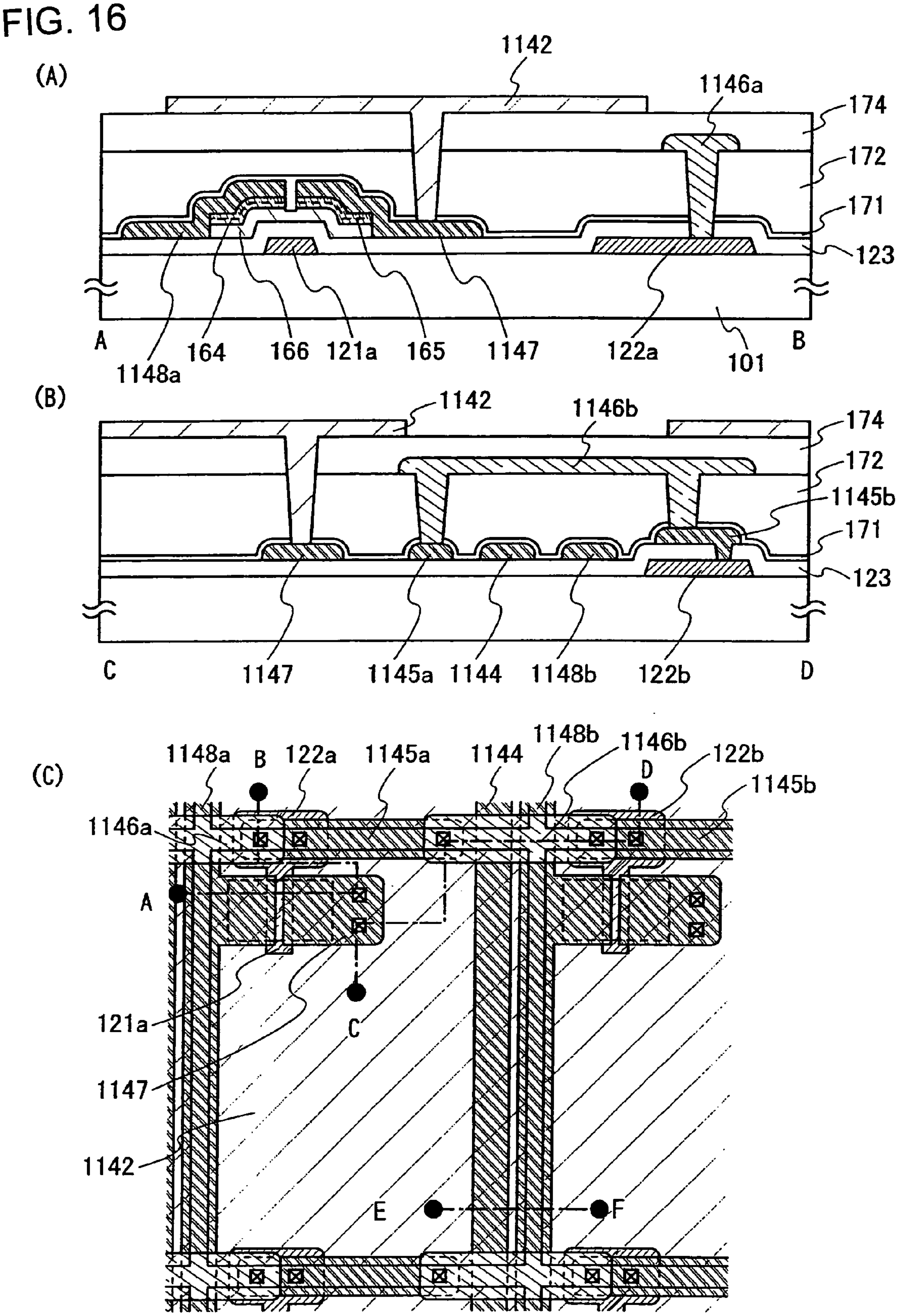
FIG. 16 shows a plan view and cross-sectional views each illustrating a structure of a semiconductor device in accordance with the invention.
Figure 17:
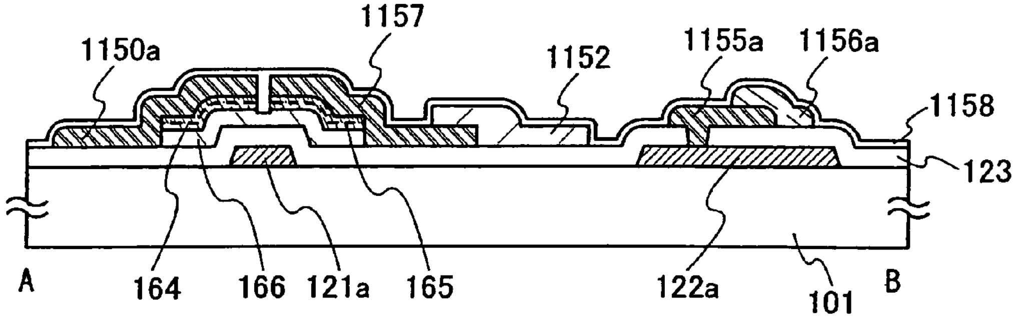
FIG. 17 shows a plan view and cross-sectional views each illustrating a structure of a semiconductor device in accordance with the invention.
Figure 17:
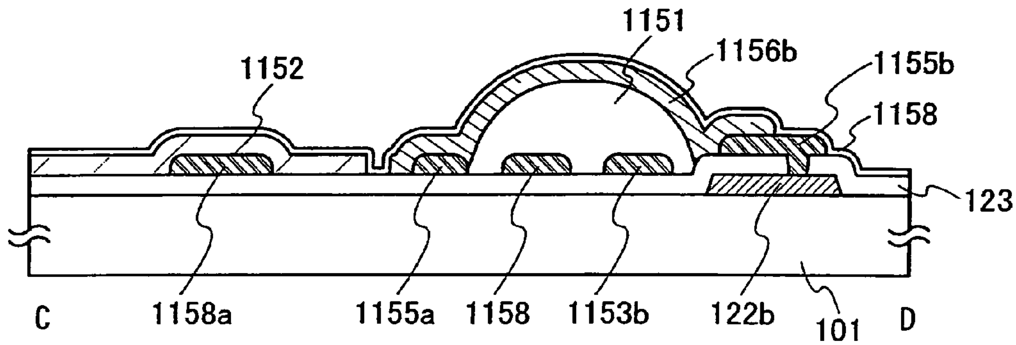
Figure 17:
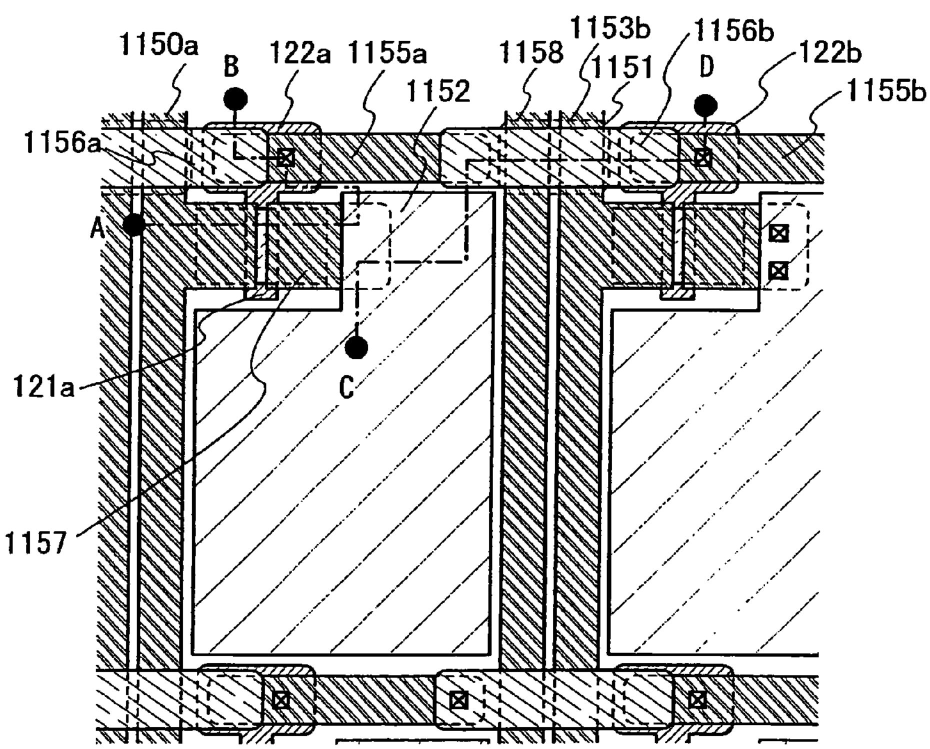
Figure 18:
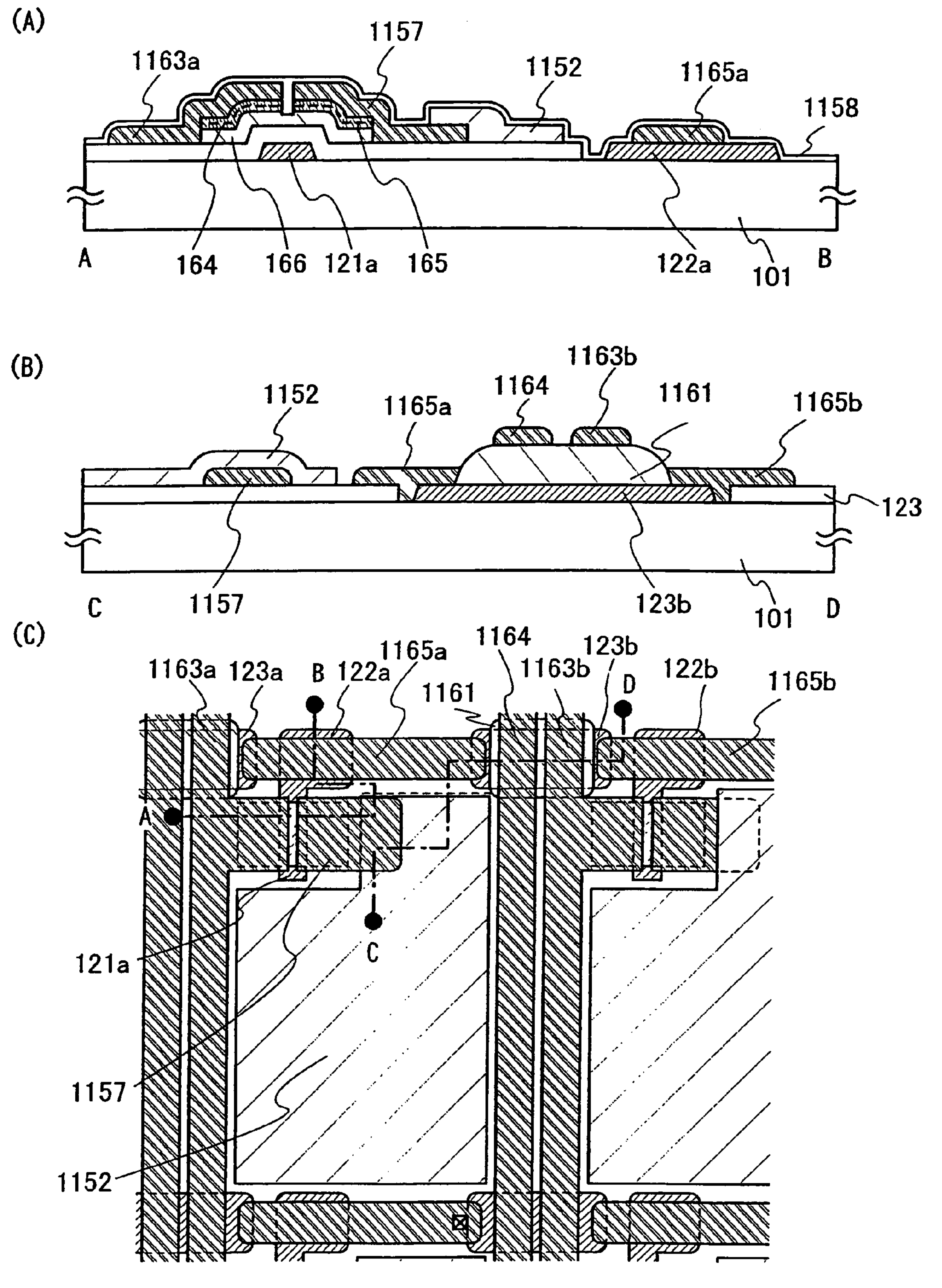
FIG. 18 shows a plan view and cross-sectional views each illustrating a structure of a semiconductor device in accordance with the invention.
Figure 19:
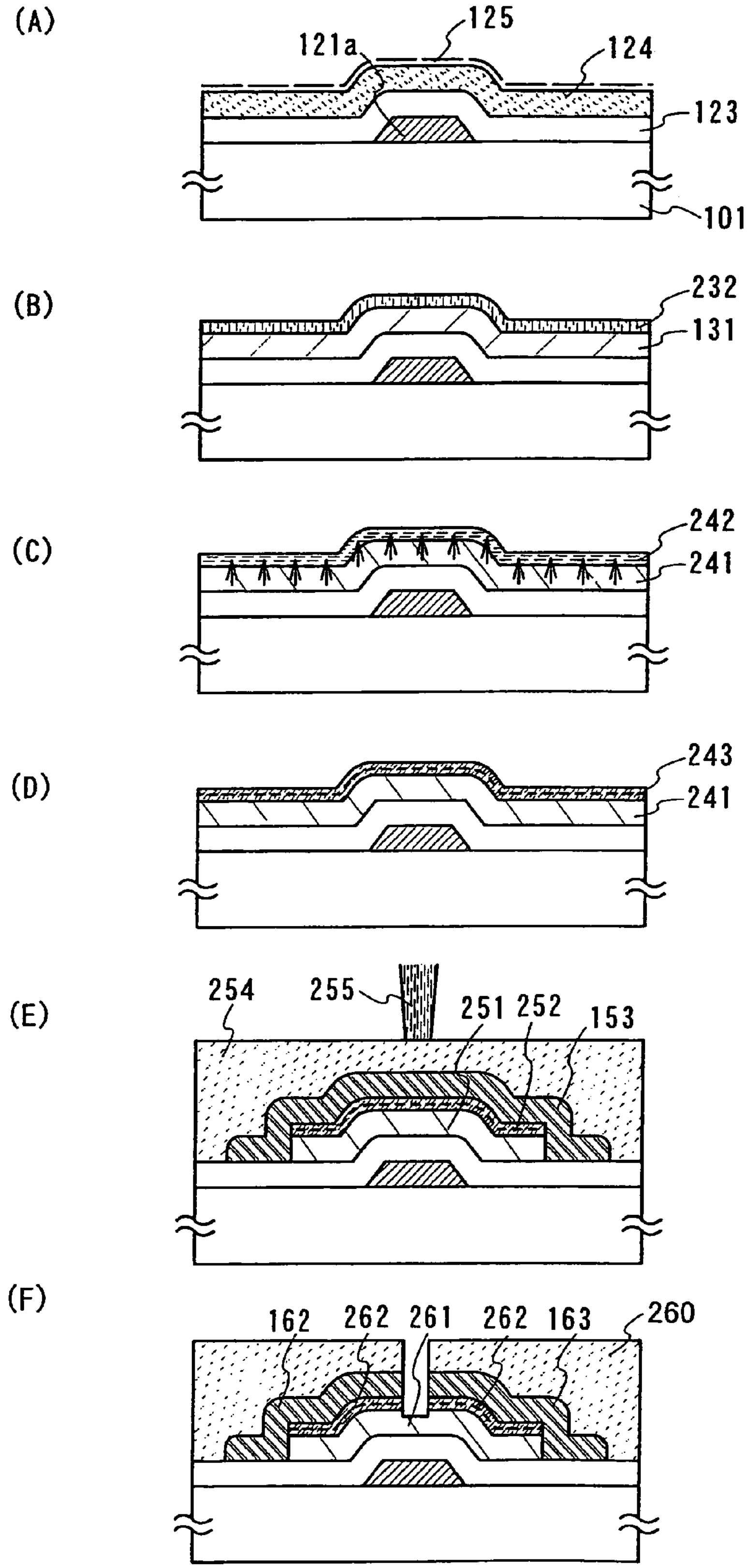
FIG. 19 shows cross-sectional views illustrating fabrication steps of a semiconductor device in accordance with the invention.
Figure 20:
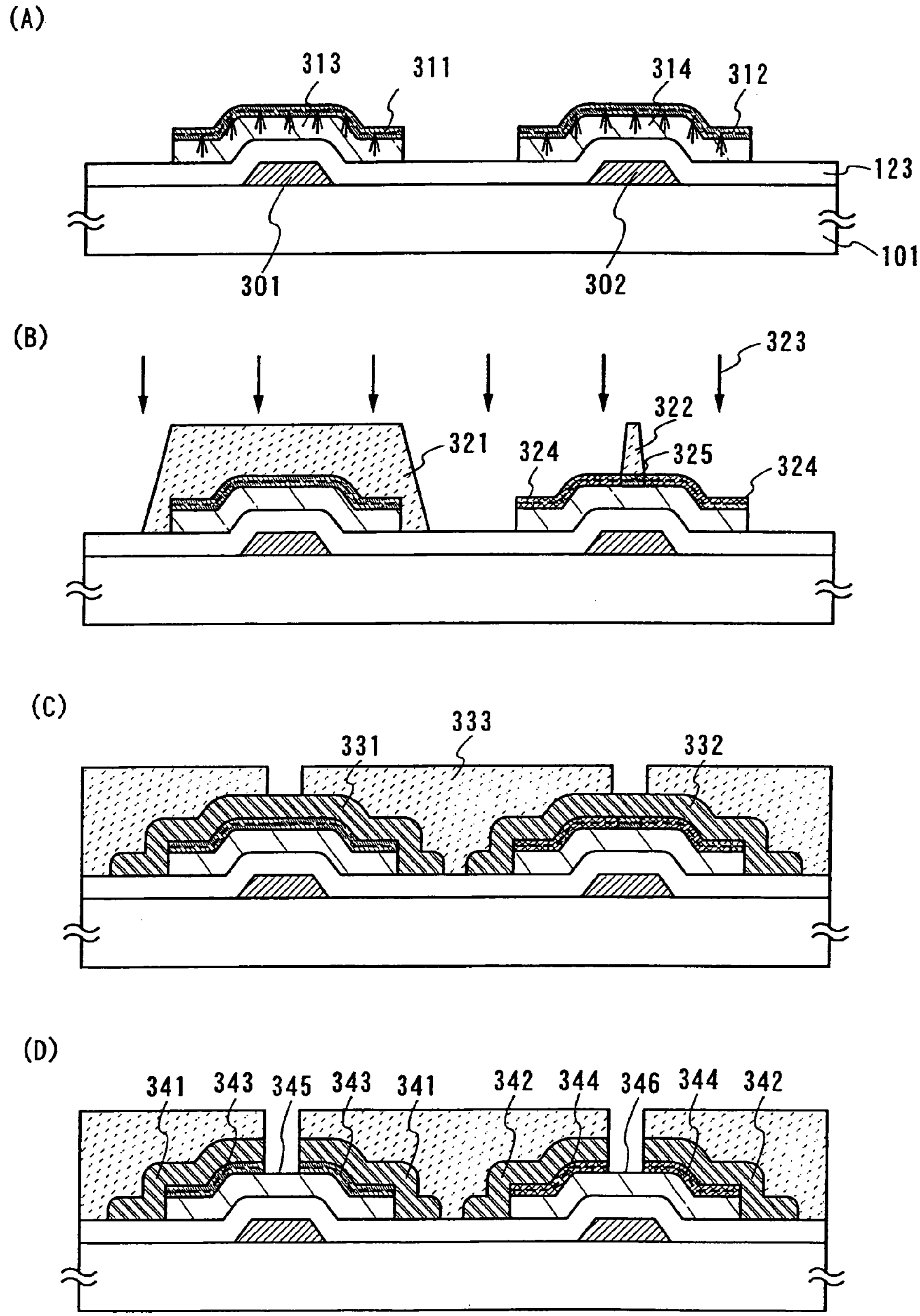
FIG. 20 shows cross-sectional views illustrating fabrication steps of a semiconductor device in accordance with the invention.
Figure 21:
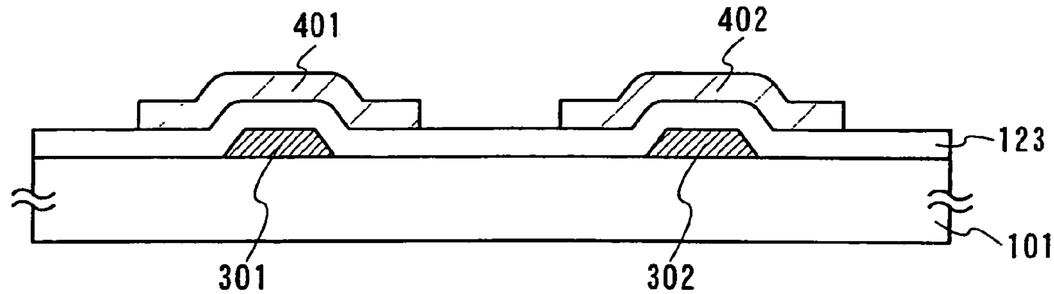
FIG. 21 shows cross-sectional views illustrating fabrication steps of a semiconductor device in accordance with the invention.
Figure 21:
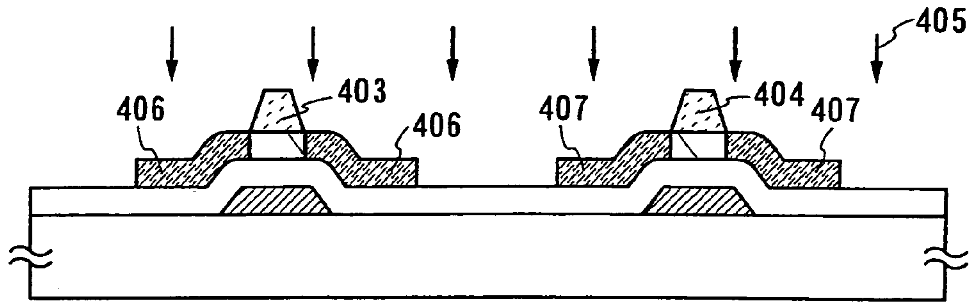
Figure 21:
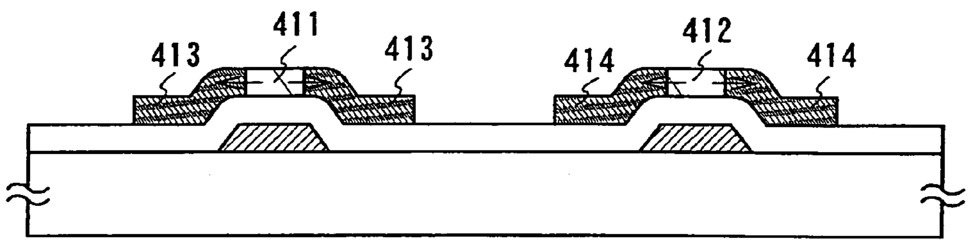
Figure 21:
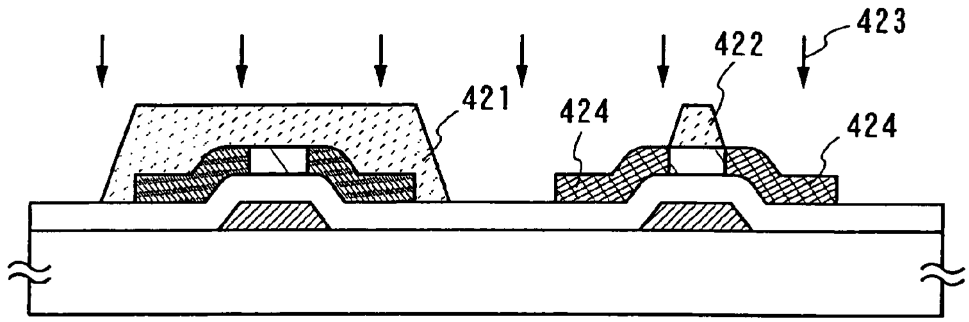
Figure 21:
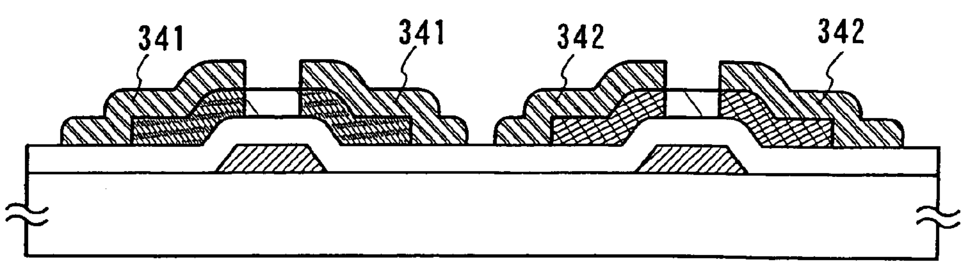
Figure 22:
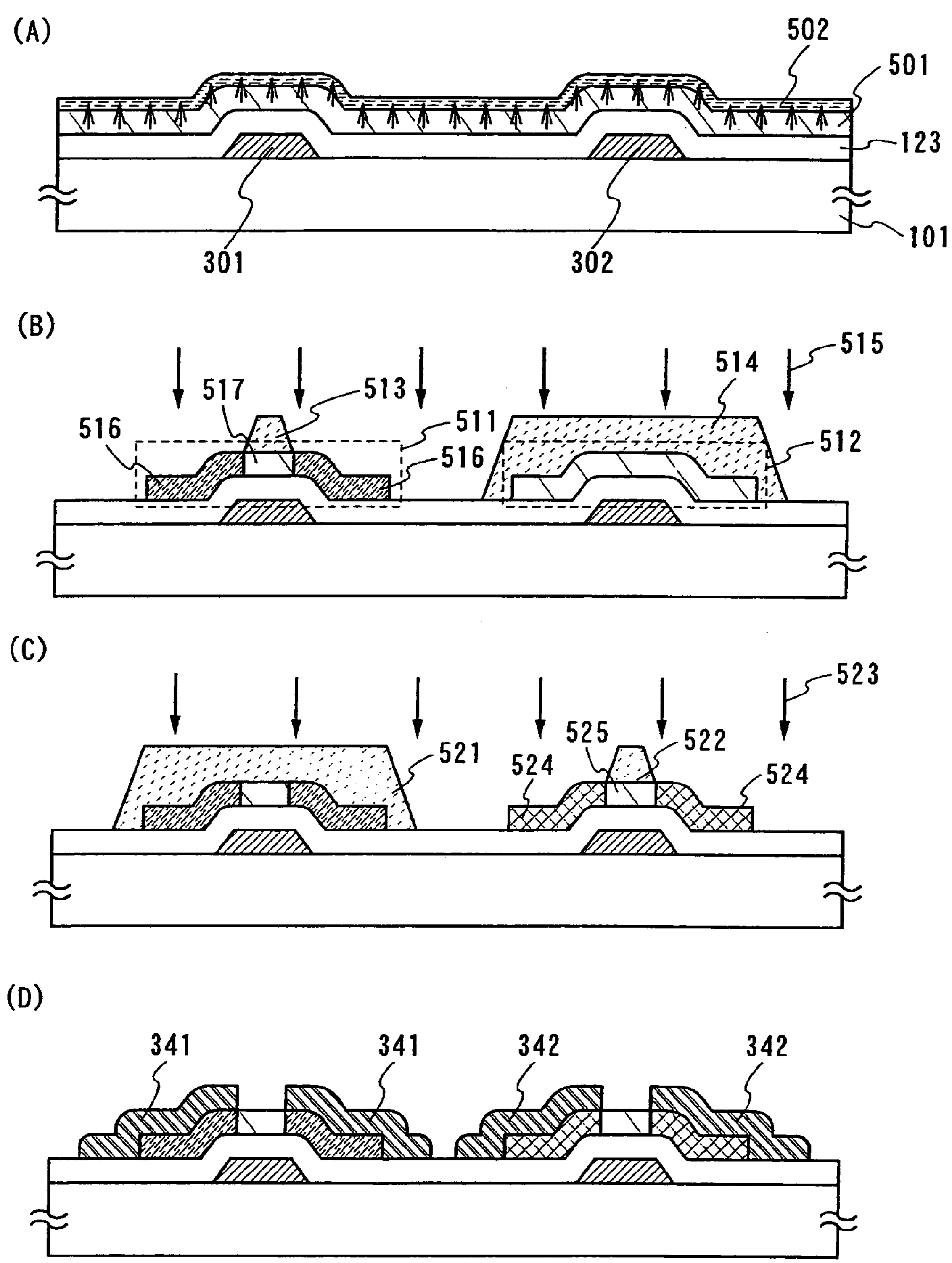
FIG. 22 shows cross-sectional views illustrating fabrication steps of a semiconductor device in accordance with the invention.
Figure 23:
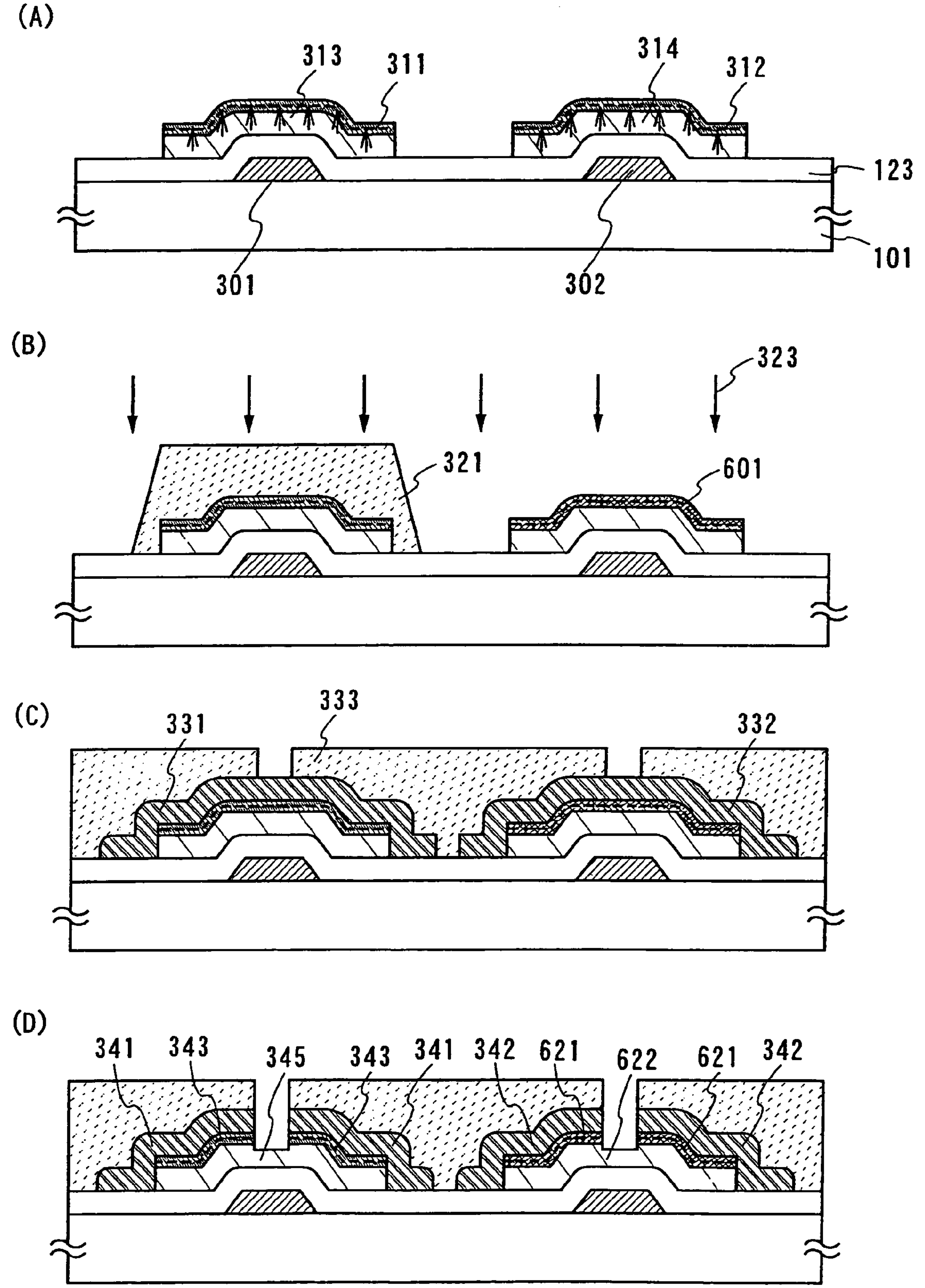
FIG. 23 shows cross-sectional views illustrating fabrication steps of a semiconductor device in accordance with the invention.
Figure 24:
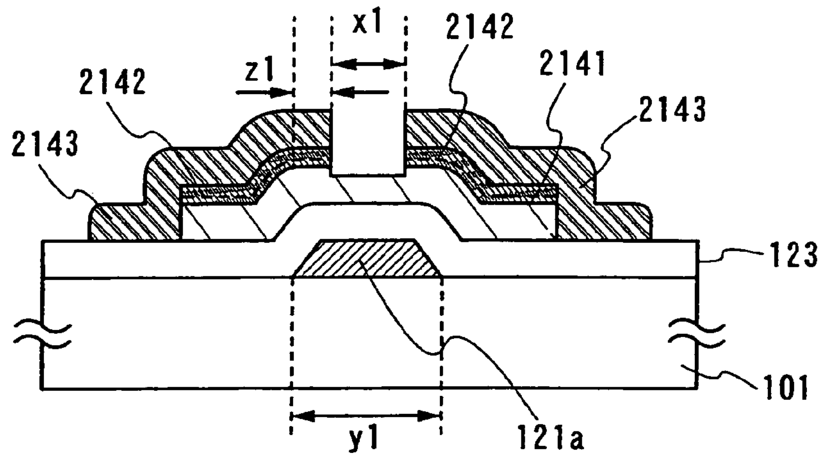
FIG. 24 shows cross-sectional views each illustrating a structure of a semiconductor device in accordance with the invention.
Figure 24:
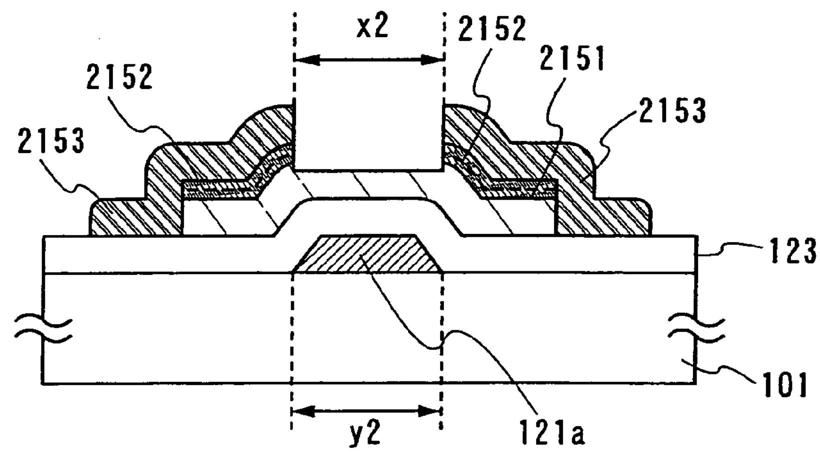
Figure 24:
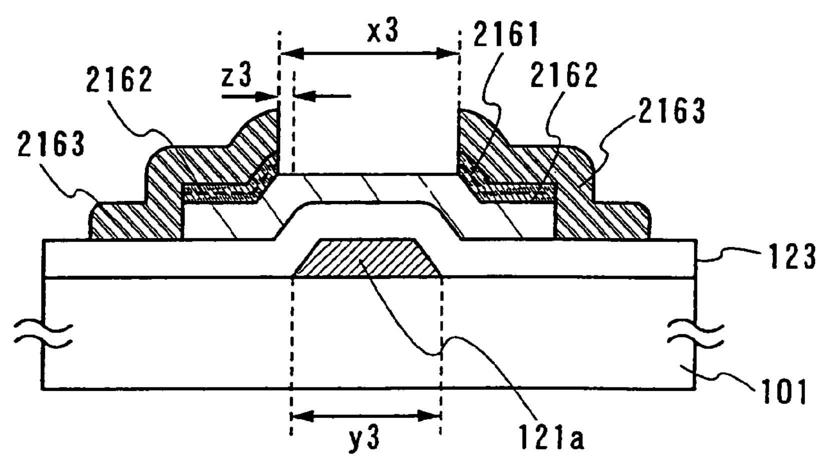
Figure 25:
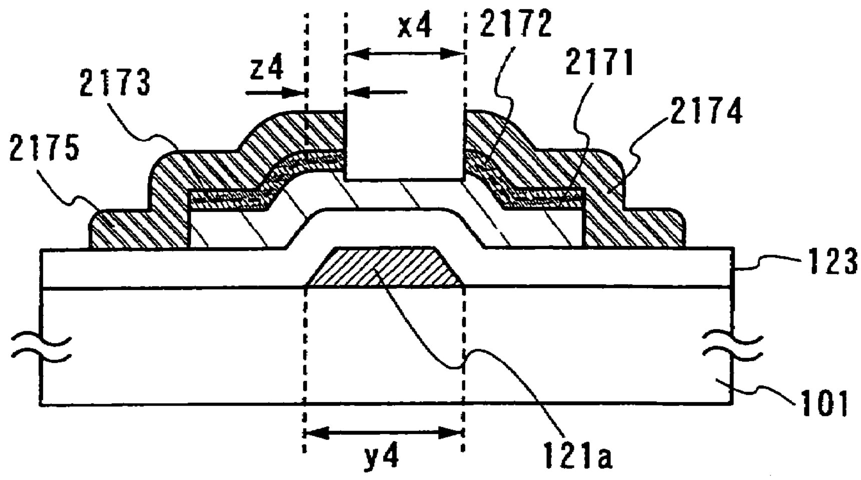
FIG. 25 shows cross-sectional views each illustrating a structure of a semiconductor device in accordance with the invention.
Figure 25:
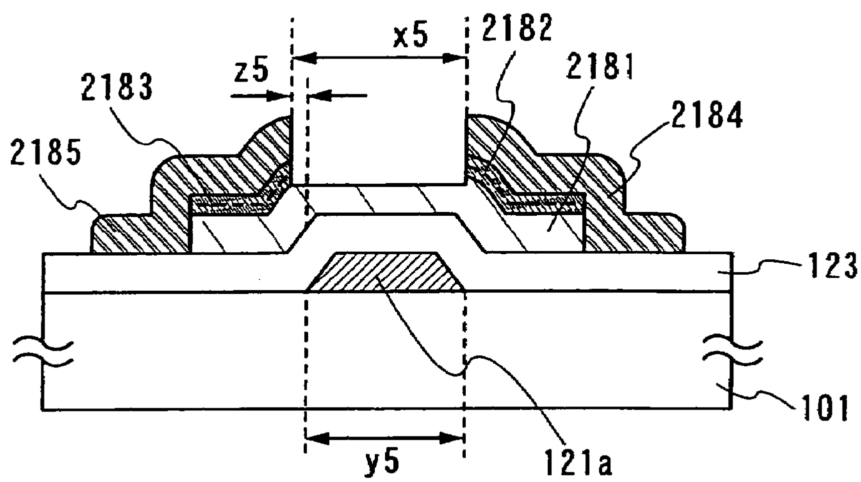
Figure 26:
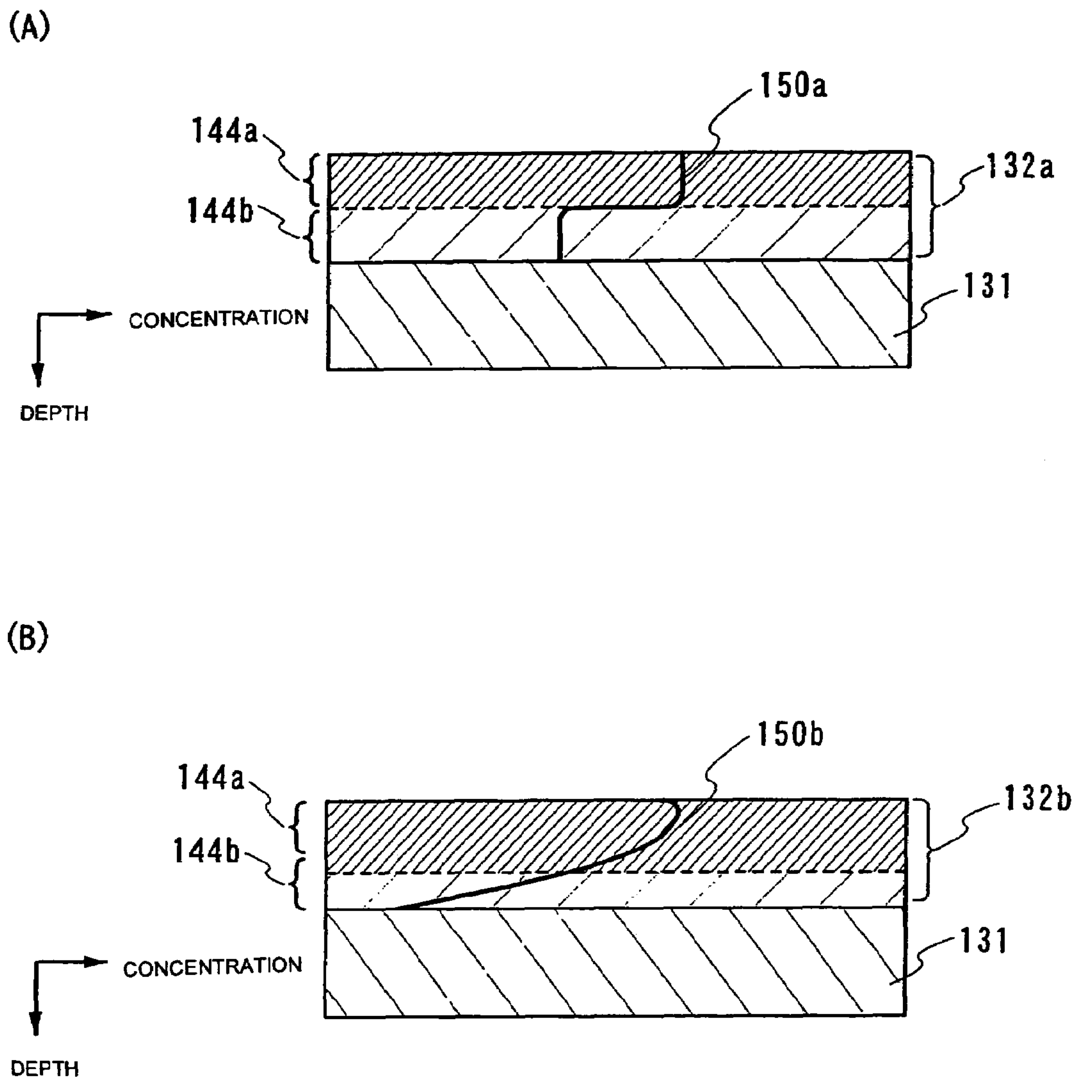
FIG. 26 shows cross-sectional views each illustrating an impurity concentration in a semiconductor region of a semiconductor device in accordance with the invention.
Figure 27:
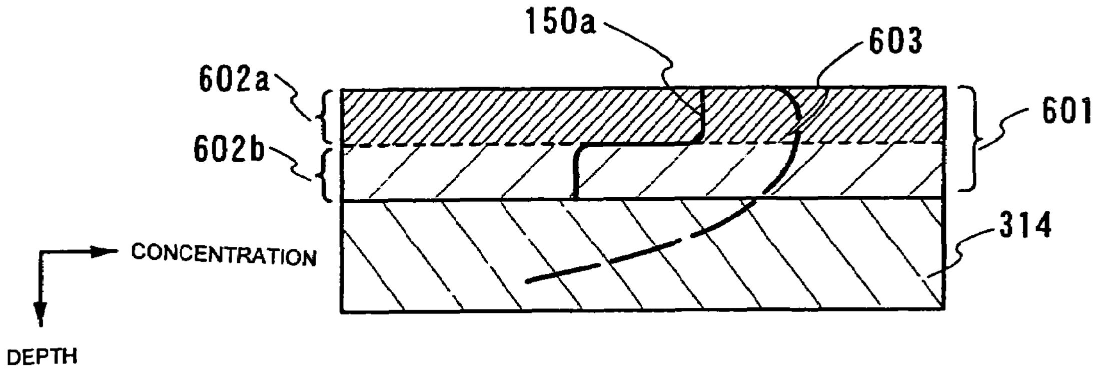
FIG. 27 shows cross-sectional views each illustrating an impurity concentration in a semiconductor region of a semiconductor device in accordance with the invention.
Figure 27:
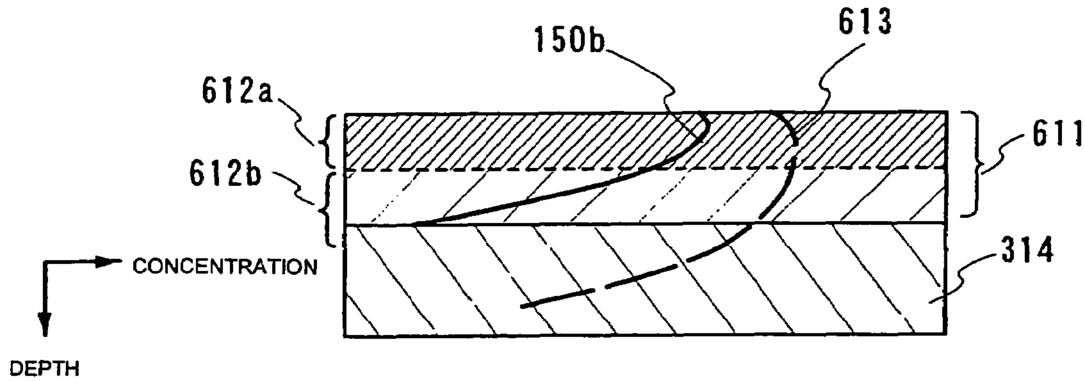
Figure 28:
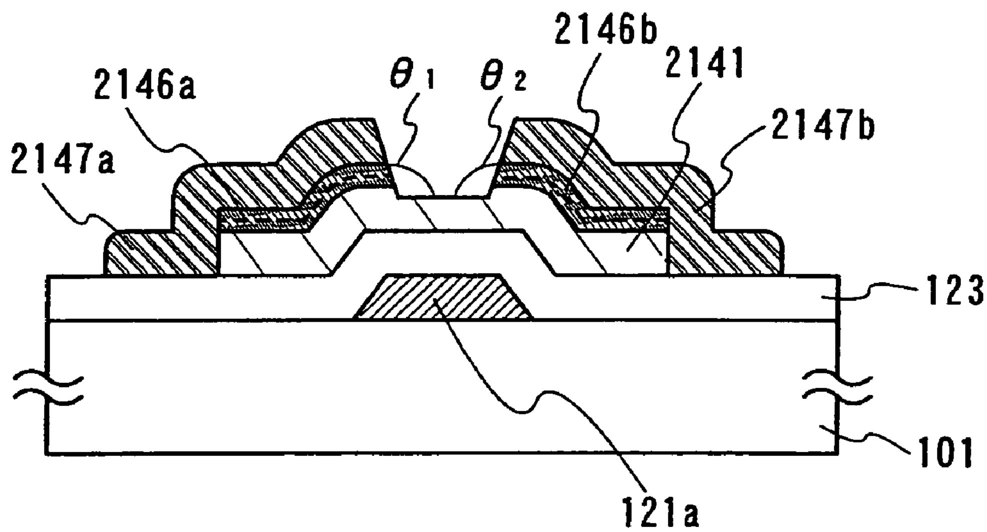
FIG. 28 shows a cross-sectional view illustrating a structure of a semiconductor device in accordance with the invention.
Figure 29:
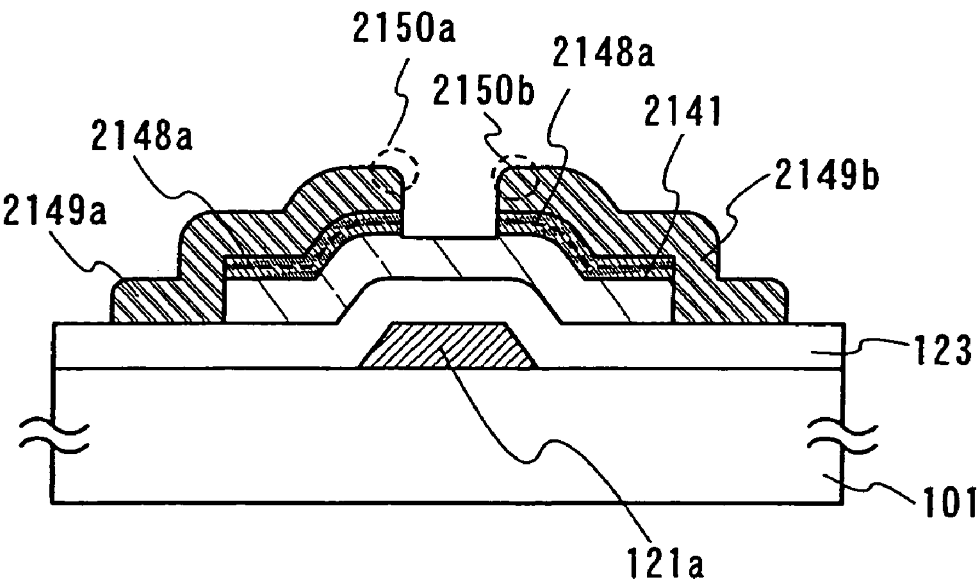
FIG. 29 shows a cross-sectional view illustrating a structure of a semiconductor device in accordance with the invention.
Figure 30:
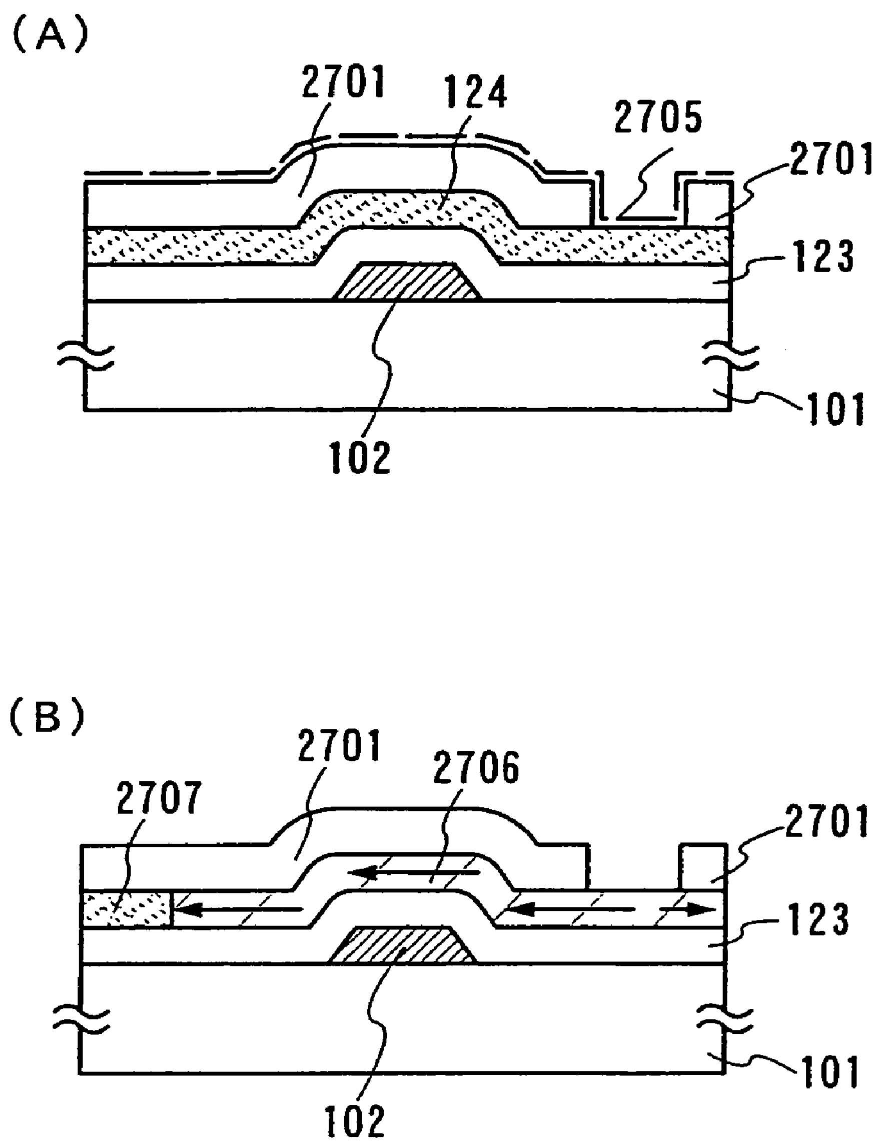
FIG. 30 shows cross-sectional views illustrating fabrication steps of a semiconductor device in accordance with the invention.
Figure 31:
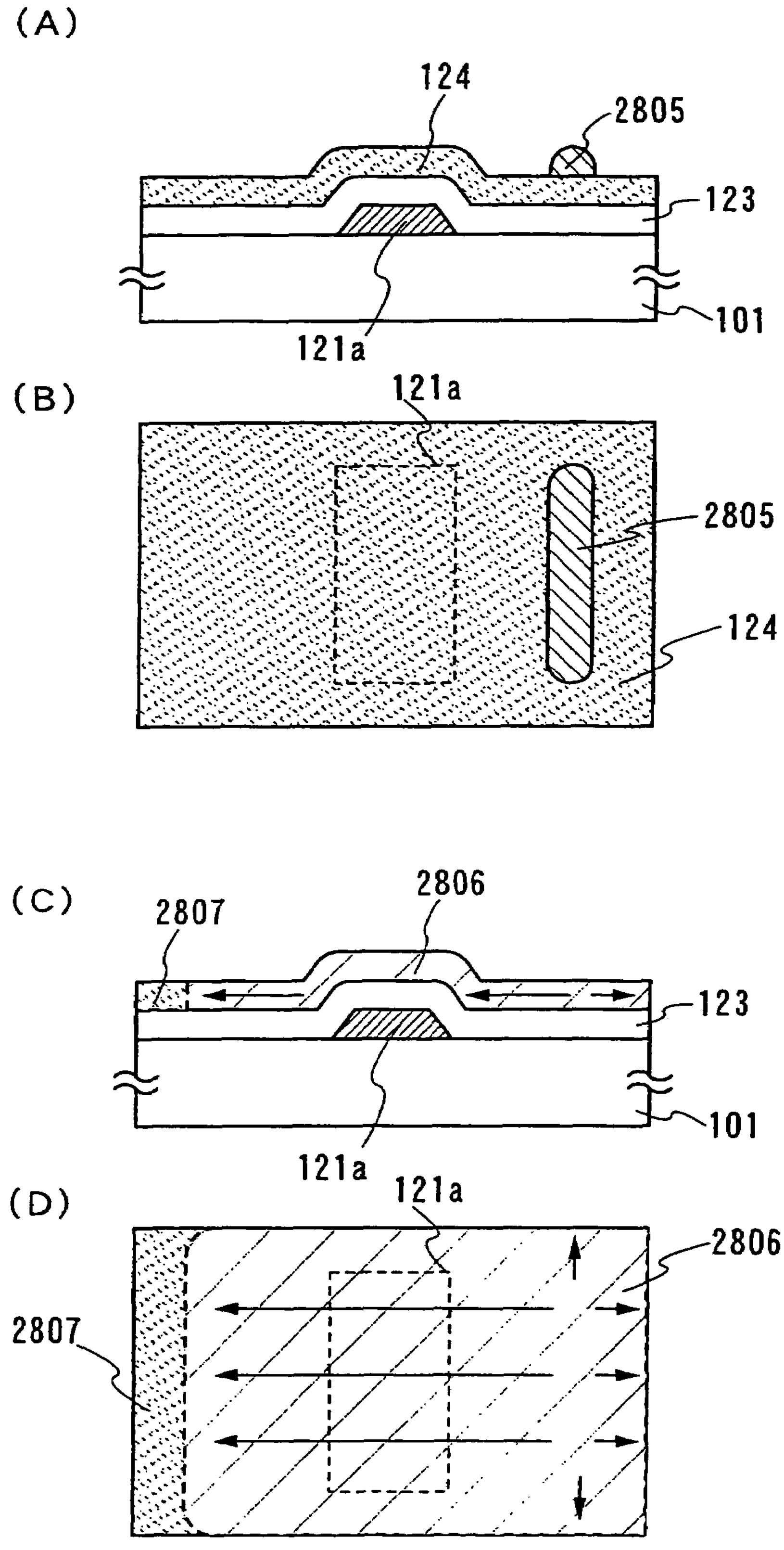
FIG. 31 shows cross-sectional views illustrating fabrication steps of a semiconductor device in accordance with the invention.
Figure 32:
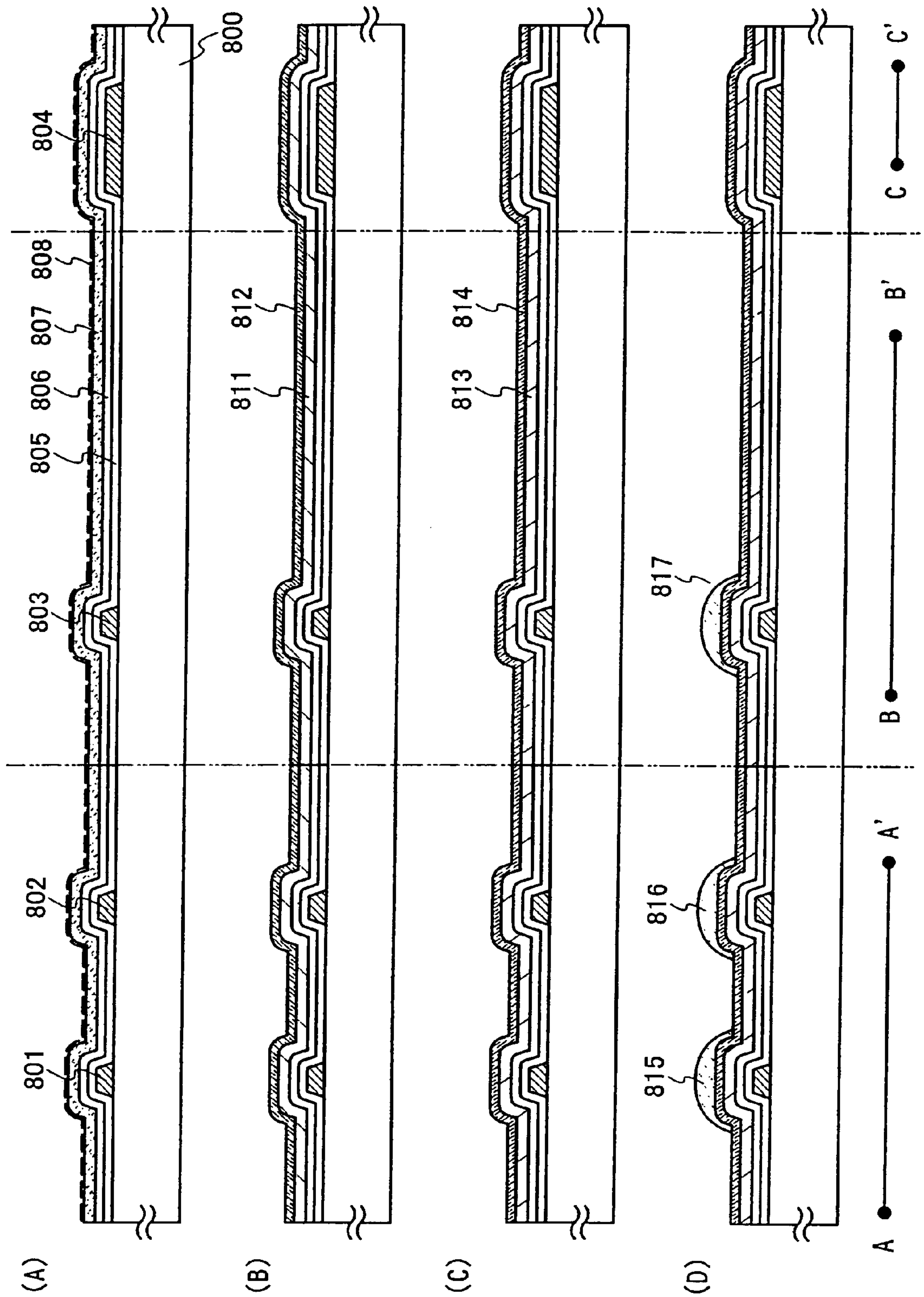
FIG. 32 shows cross-sectional views illustrating fabrication steps of a semiconductor device in accordance with the invention.
Figure 33:
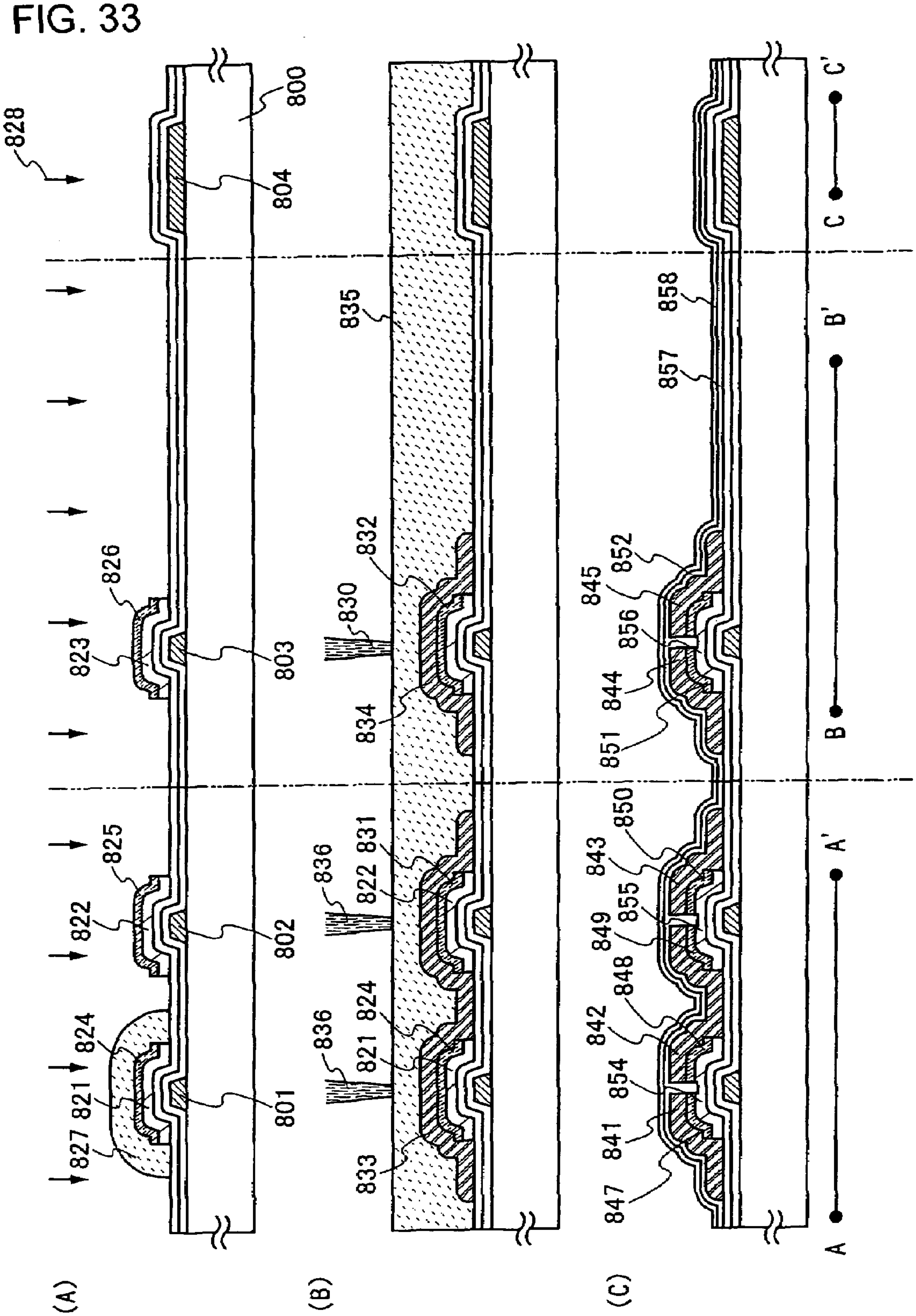
FIG. 33 shows cross-sectional views illustrating fabrication steps of a semiconductor device in accordance with the invention.
Figure 34:
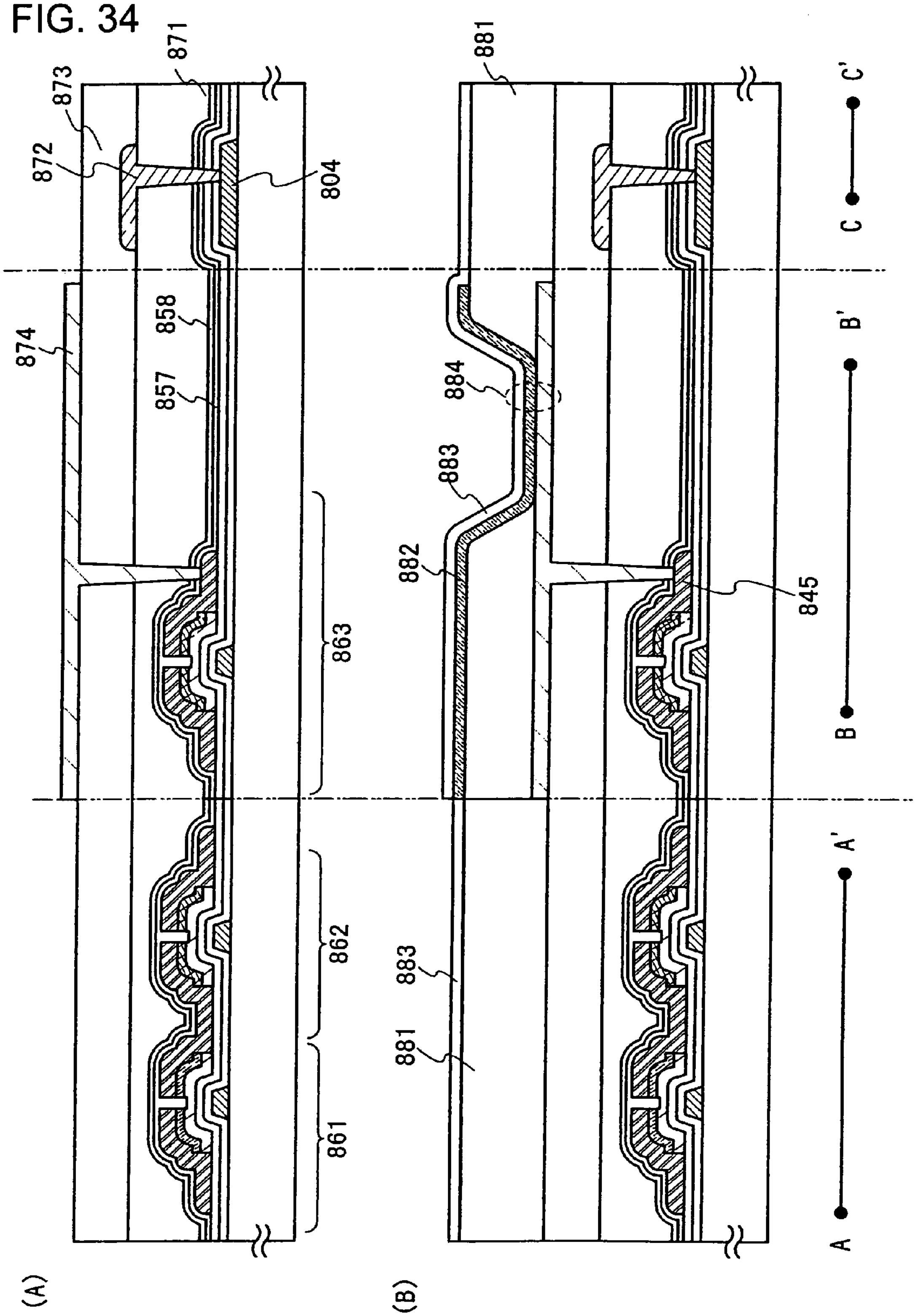
FIG. 34 shows cross-sectional views illustrating fabrication steps of a semiconductor device in accordance with the invention.
Figure 35:
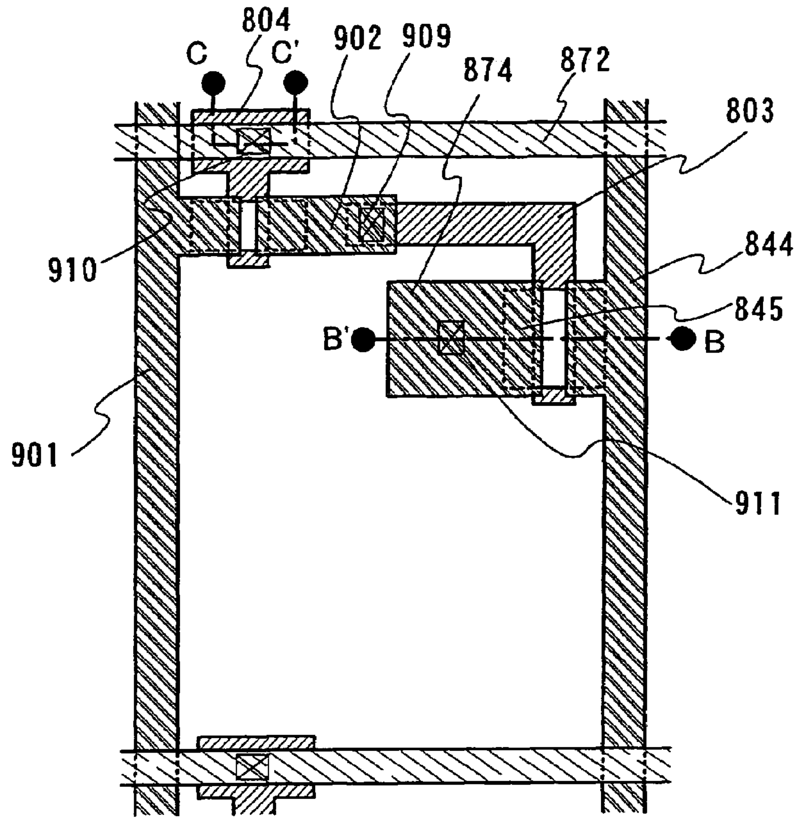
FIG. 35 shows a top view illustrating a structure of a pixel of a semiconductor device in accordance with the invention.
Figure 36:
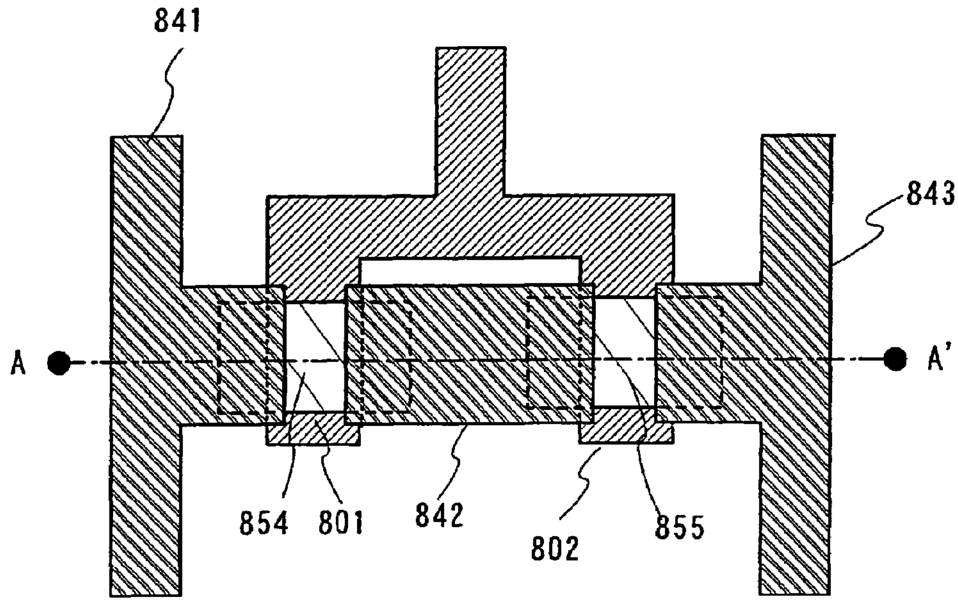
FIG. 36 is a top view illustrating a structure of a driver circuit of a semiconductor device in accordance with the invention.
Figure 37:
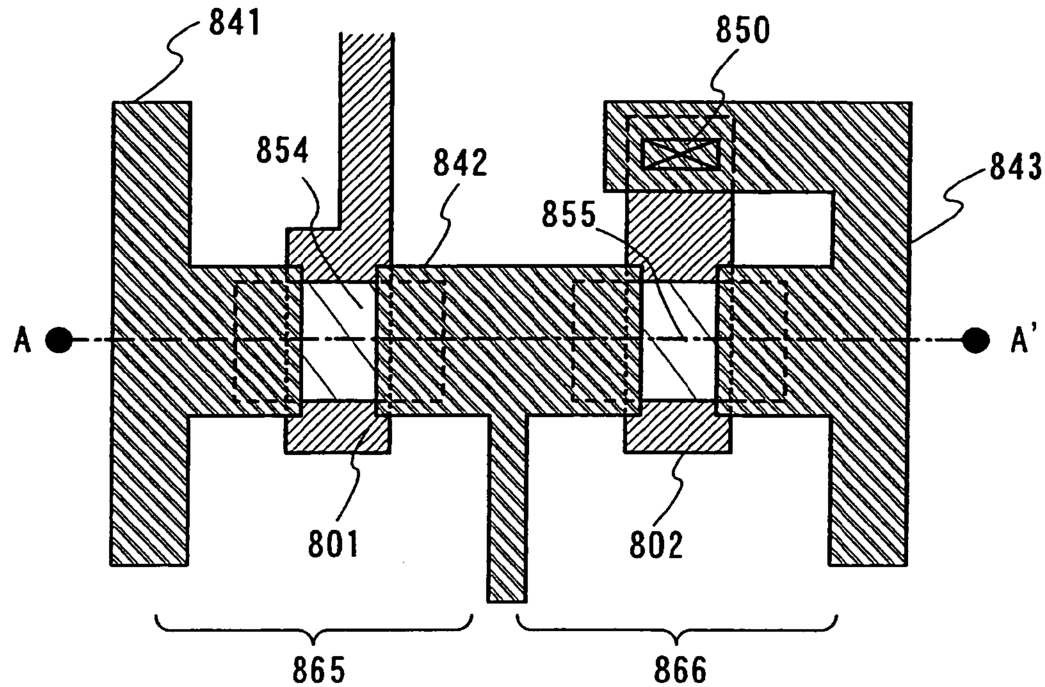
FIG. 37 is a top view illustrating a structure of a driver circuit of a semiconductor device in accordance with the invention.
Figure 38:
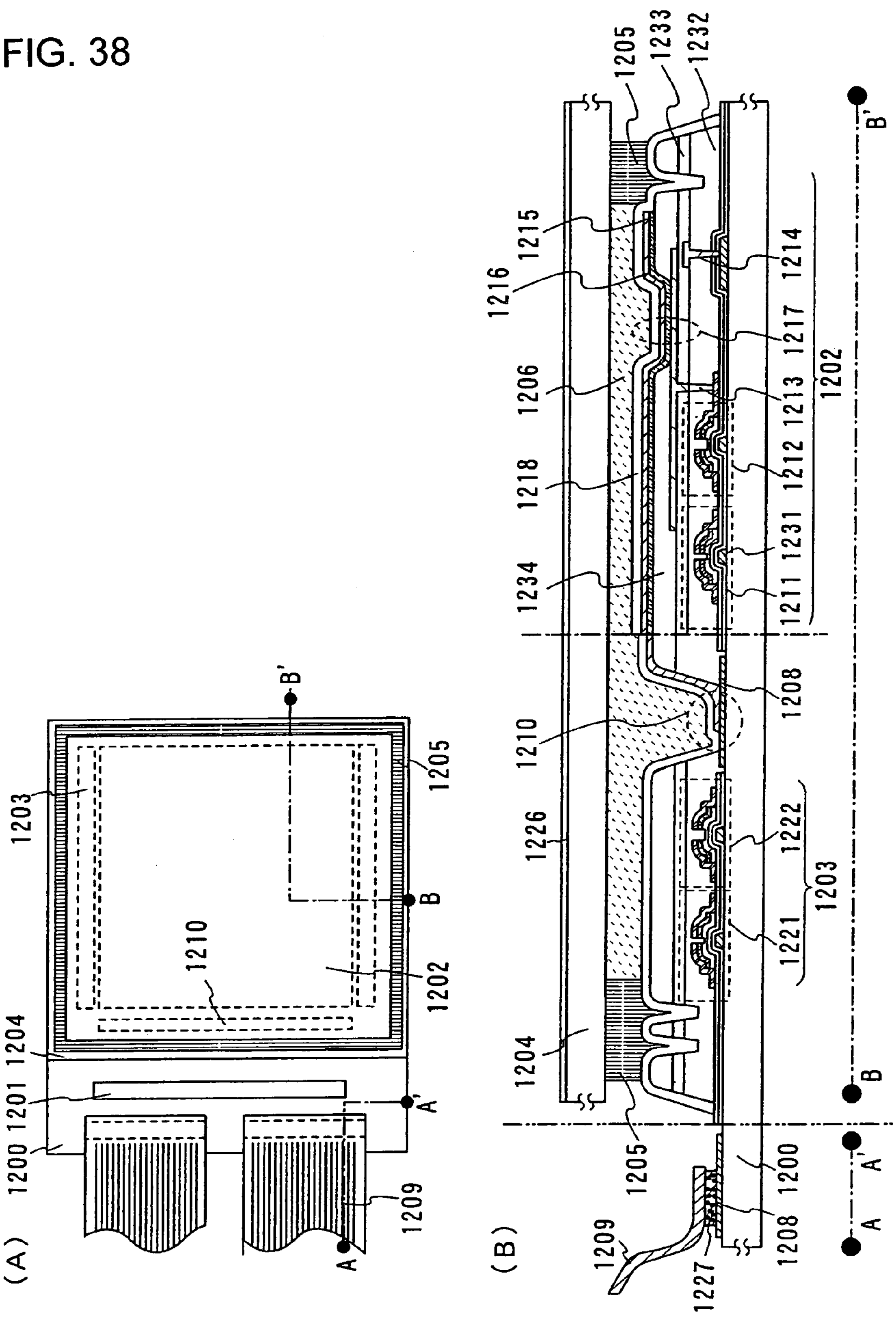
FIG. 38 shows a top view and a cross-sectional view each illustrating a structure of a light-emitting display panel in accordance with the invention.
Figure 39:
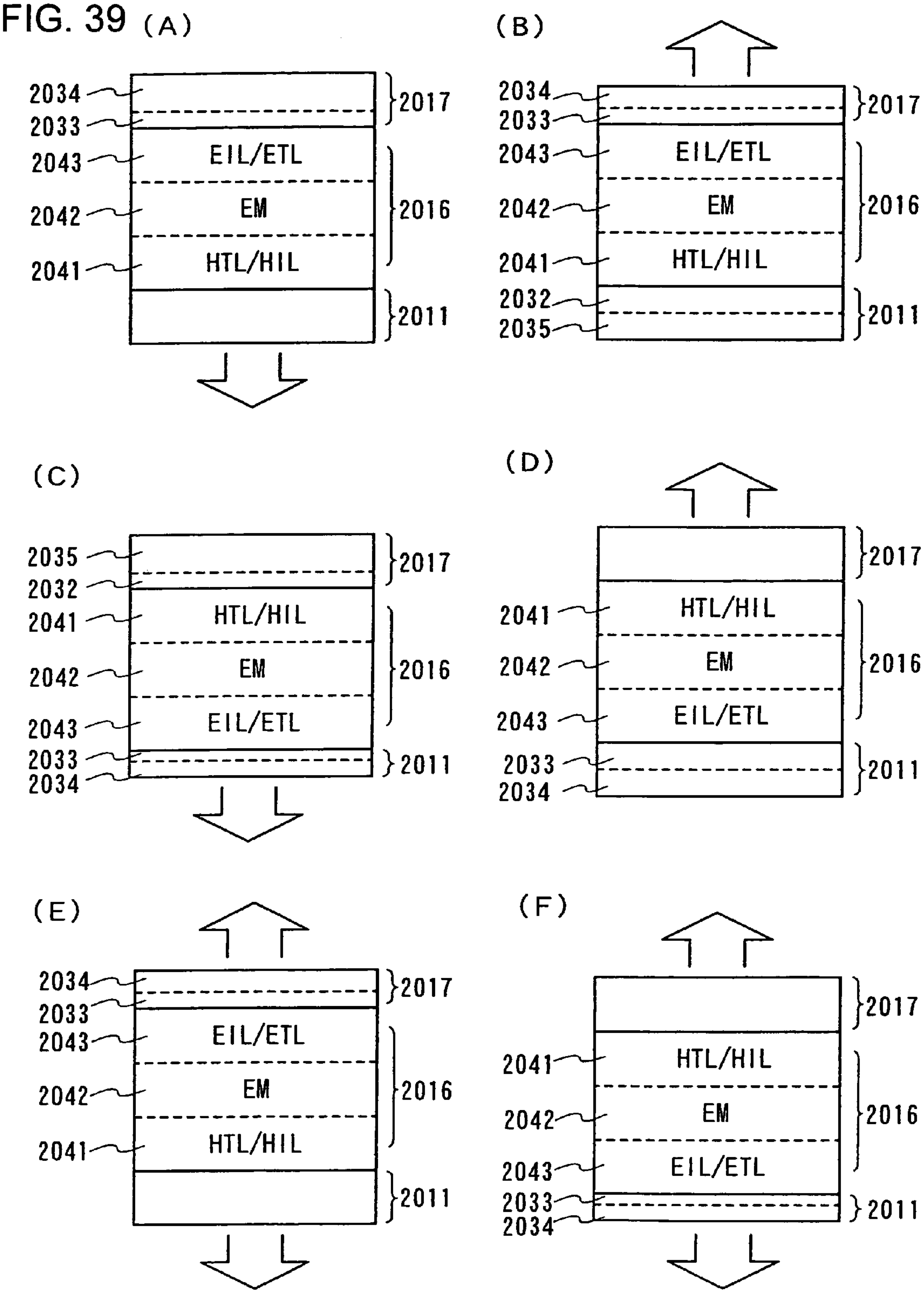
FIG. 39 shows cross-sectional views each illustrating a structure of a light-emitting element of a semiconductor device in accordance with the invention.
Figure 40:
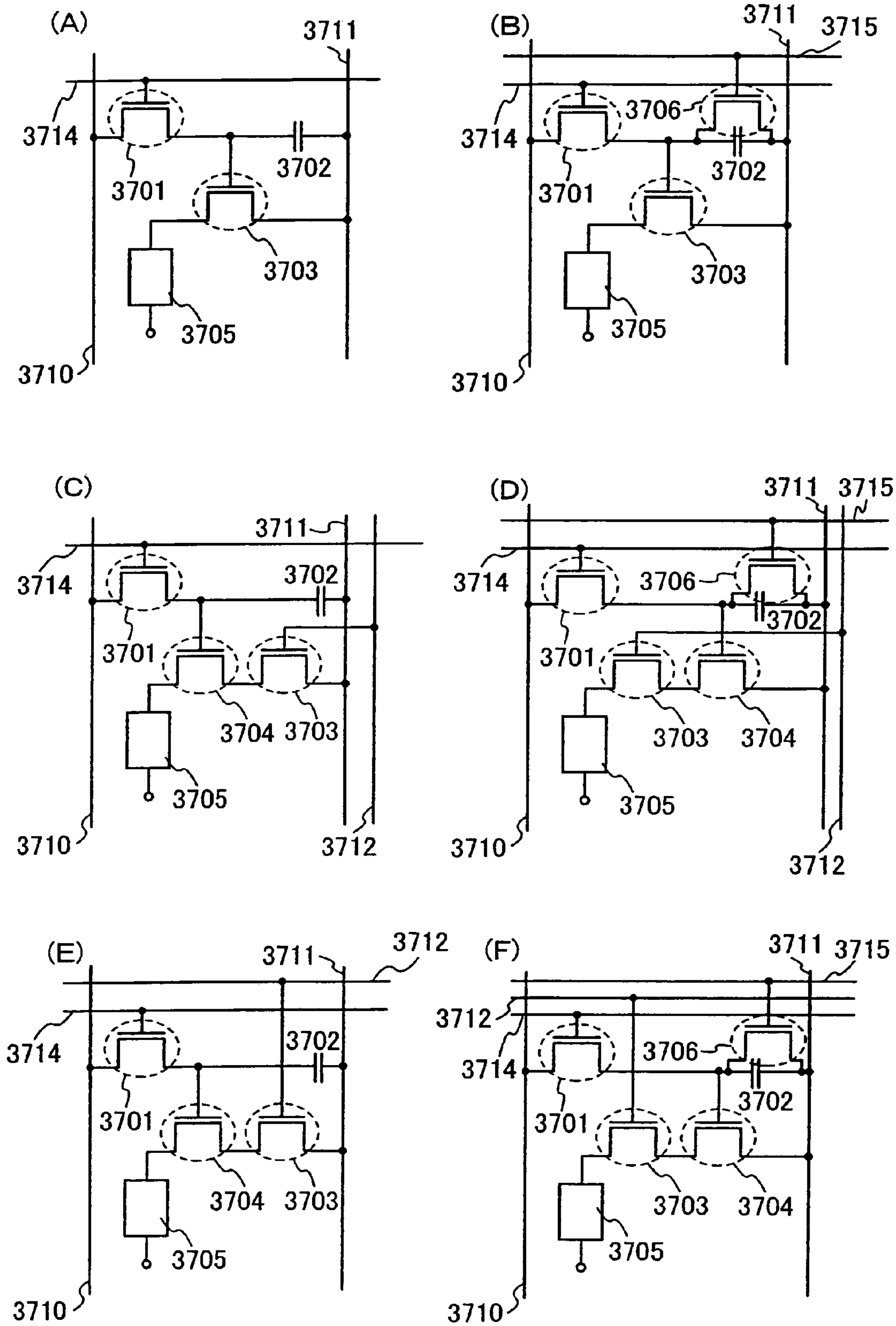
FIG. 40 shows views each illustrating a circuit of a light-emitting element of a semiconductor device in accordance with the invention.
Figure 41:
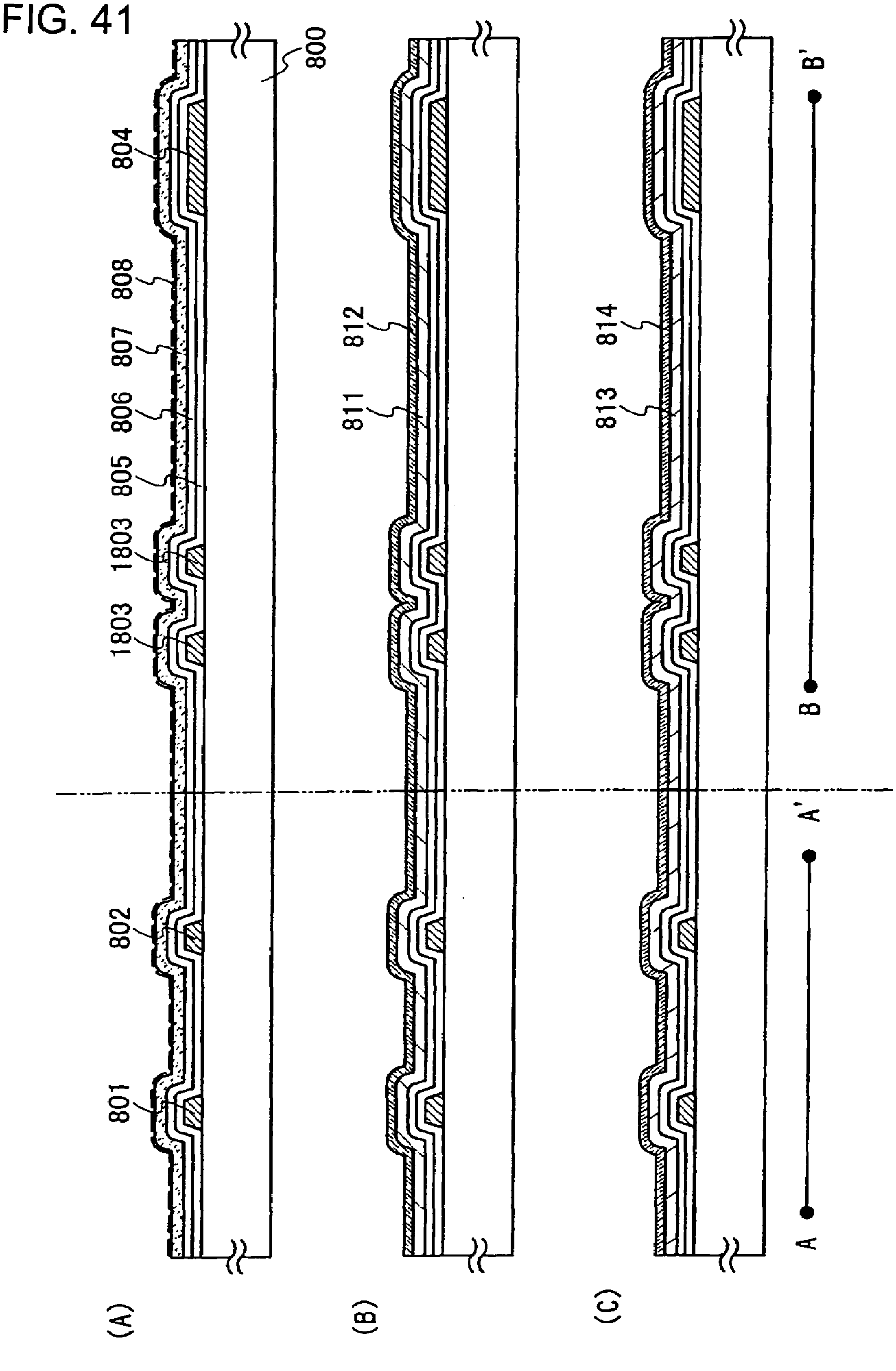
FIG. 41 shows cross-sectional views illustrating fabrication steps of a semiconductor device in accordance with the invention.
Figure 42:
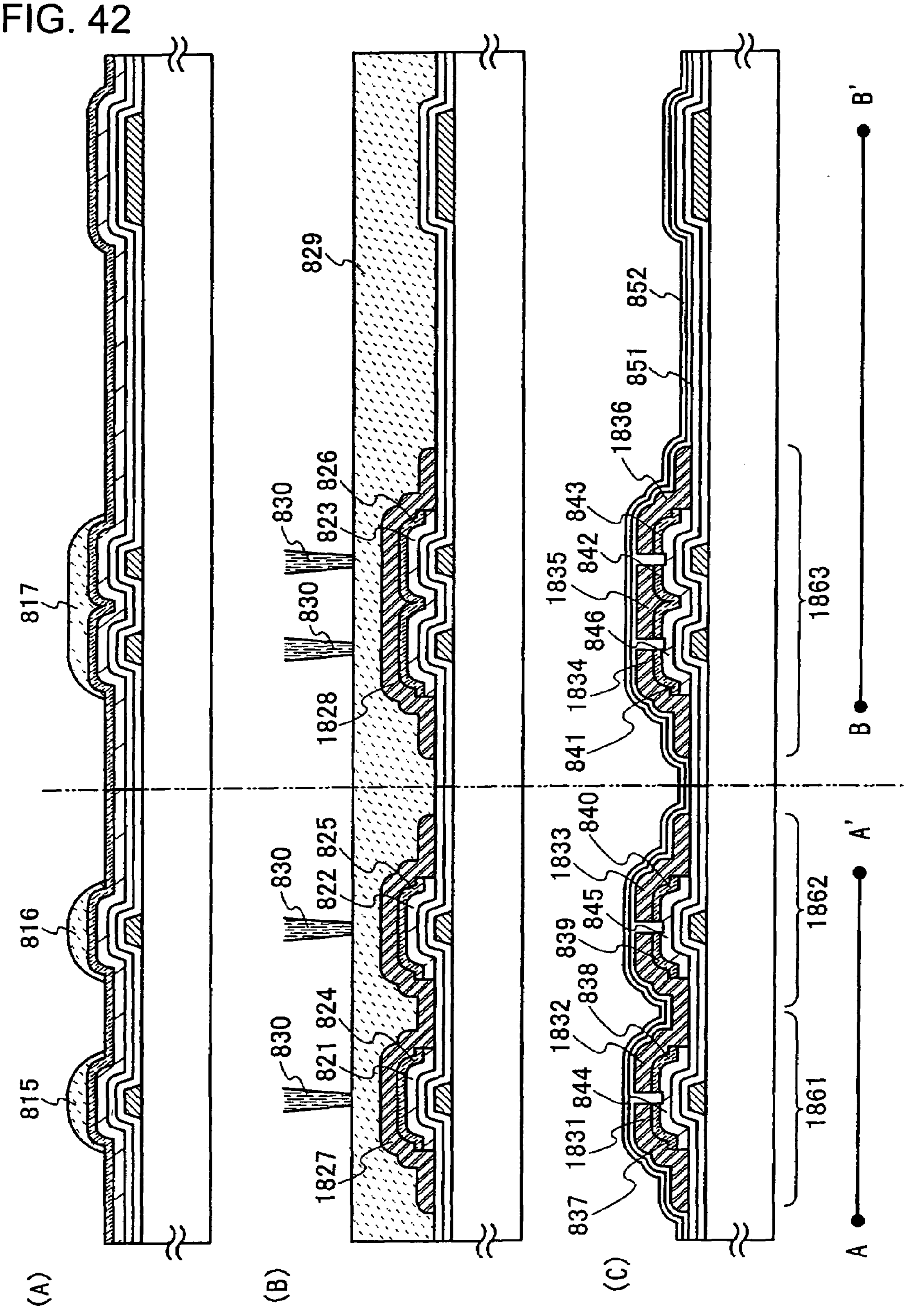
FIG. 42 shows cross-sectional views illustrating fabrication steps of a semiconductor device in accordance with the invention.
Figure 43:
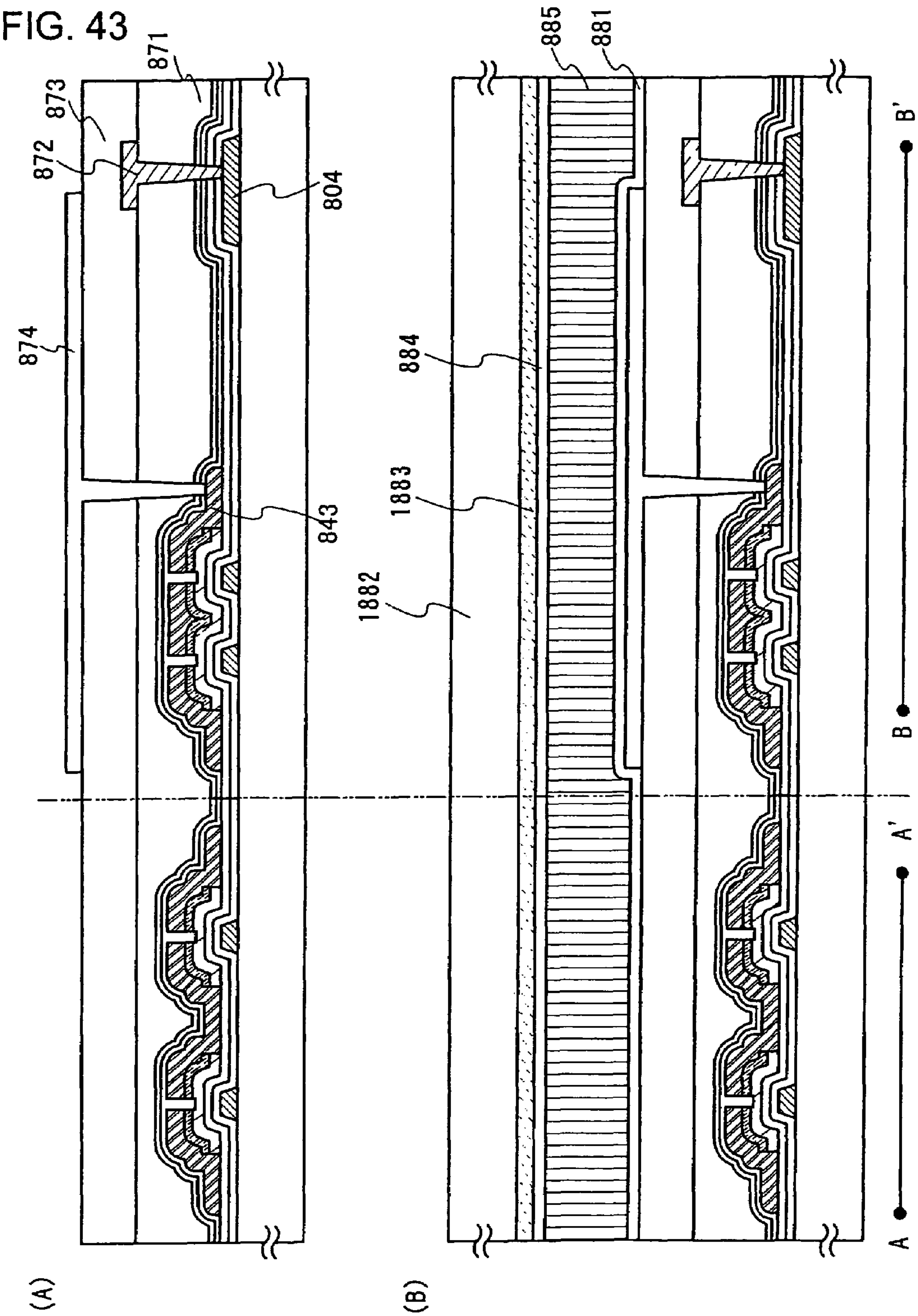
FIG. 43 shows cross-sectional views illustrating fabrication steps of a semiconductor device in accordance with the invention.
Figure 44:
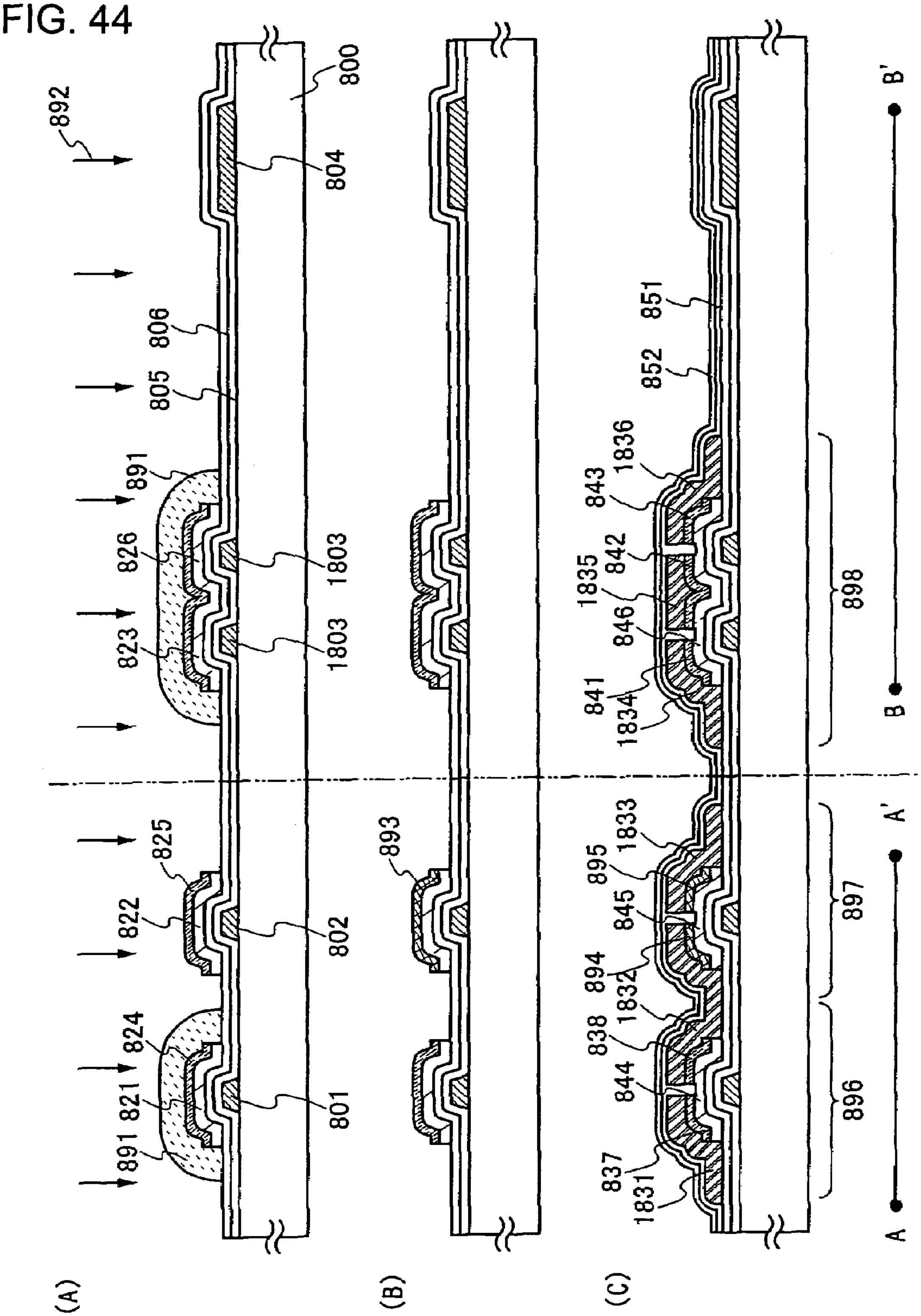
FIG. 44 shows cross-sectional views illustrating fabrication steps of a semiconductor device in accordance with the invention.
Figure 45:
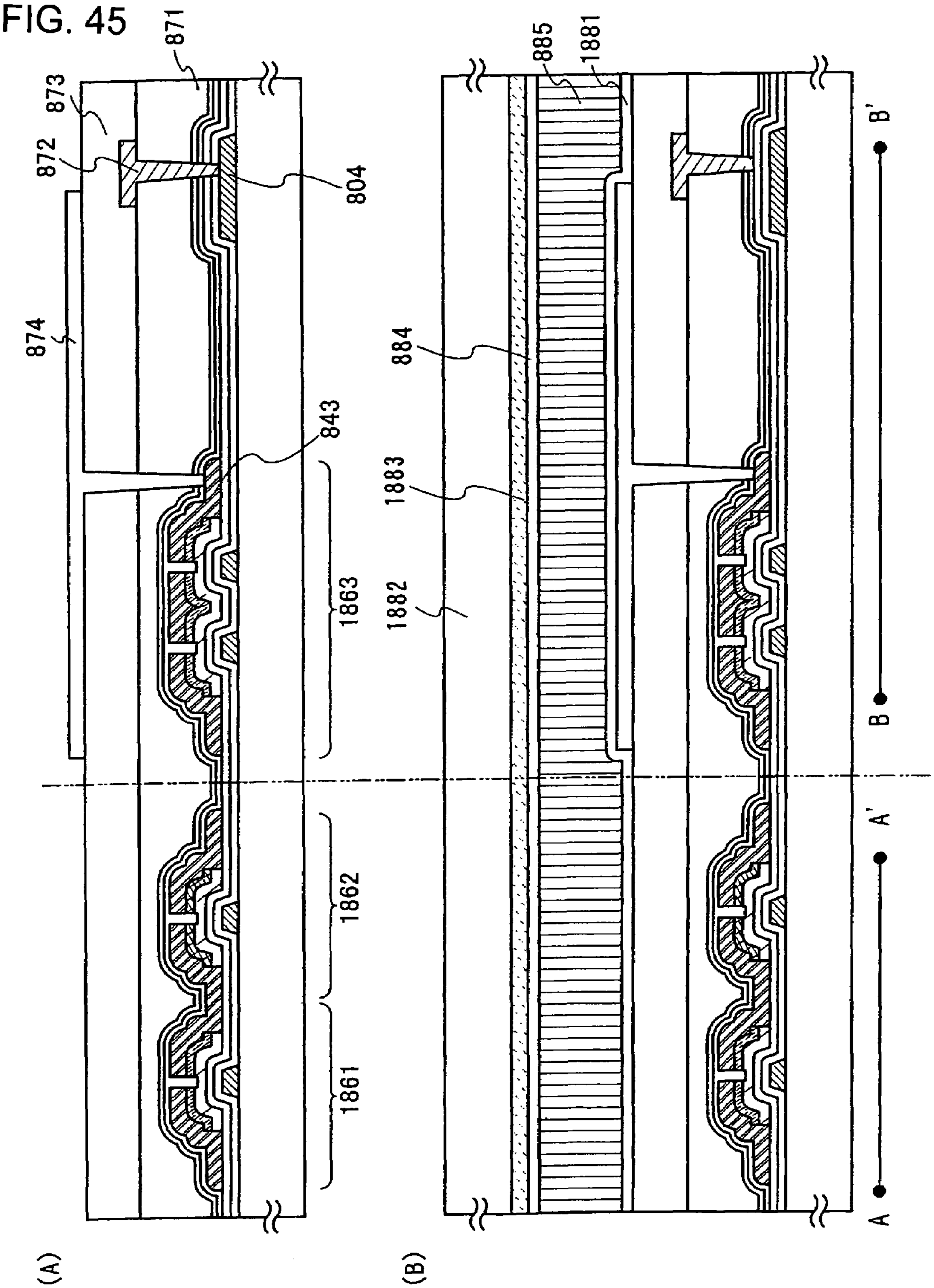
FIG. 45 shows cross-sectional views illustrating fabrication steps of a semiconductor device in accordance with the invention.
Figure 46:
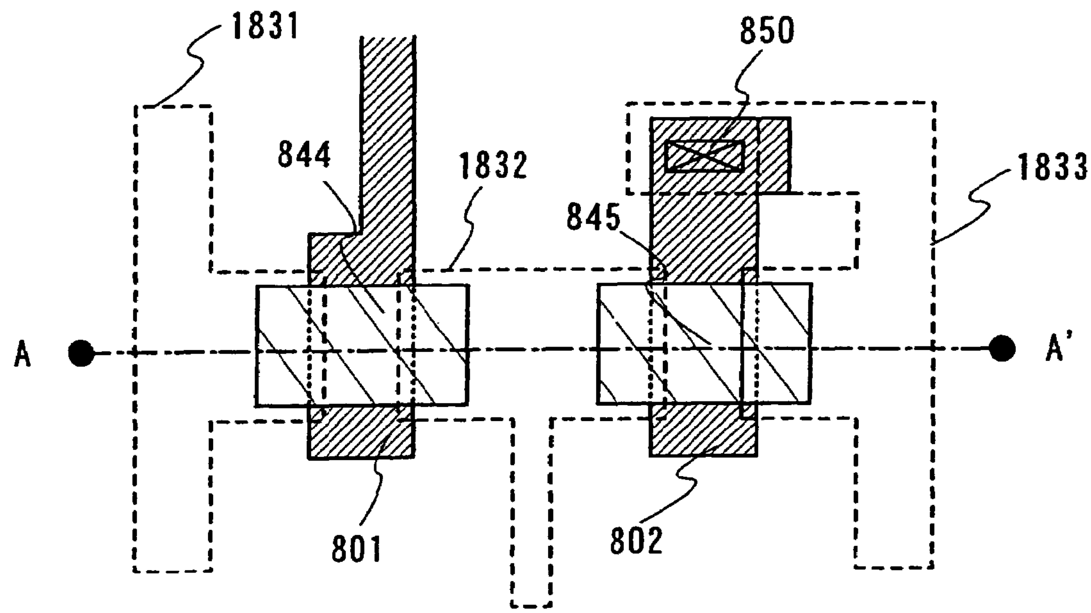
FIG. 46 shows a top view illustrating a connection of a driver circuit of a semiconductor device in accordance with the invention.
Figure 47:
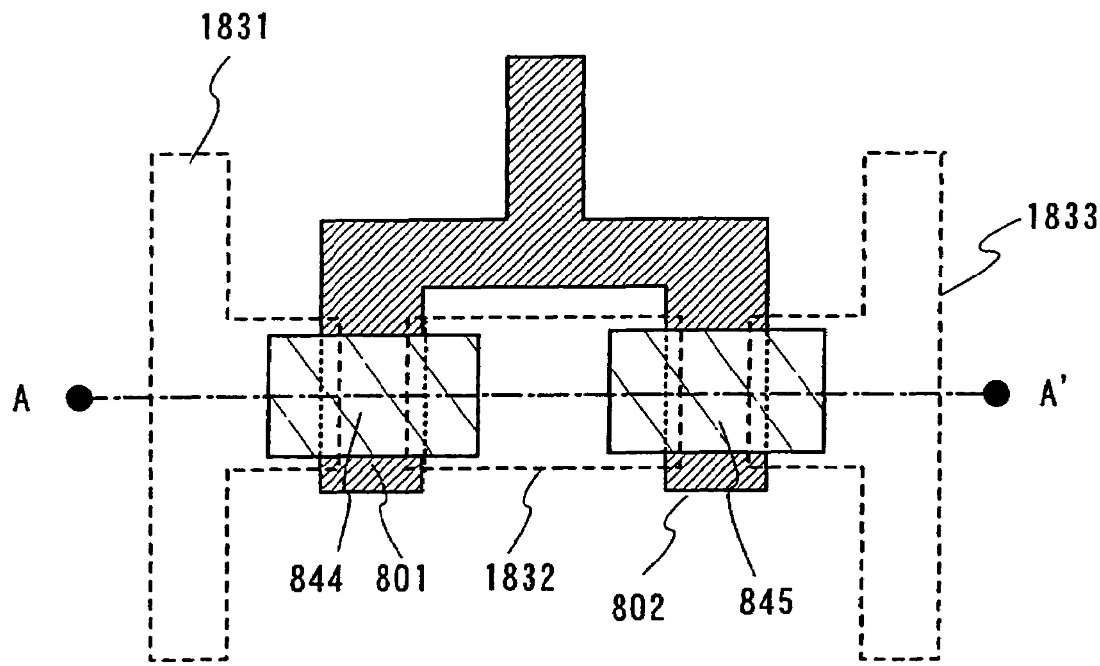
FIG. 47 shows a top view illustrating a connection of a driver circuit of a semiconductor device in accordance with the invention.
Figure 48:
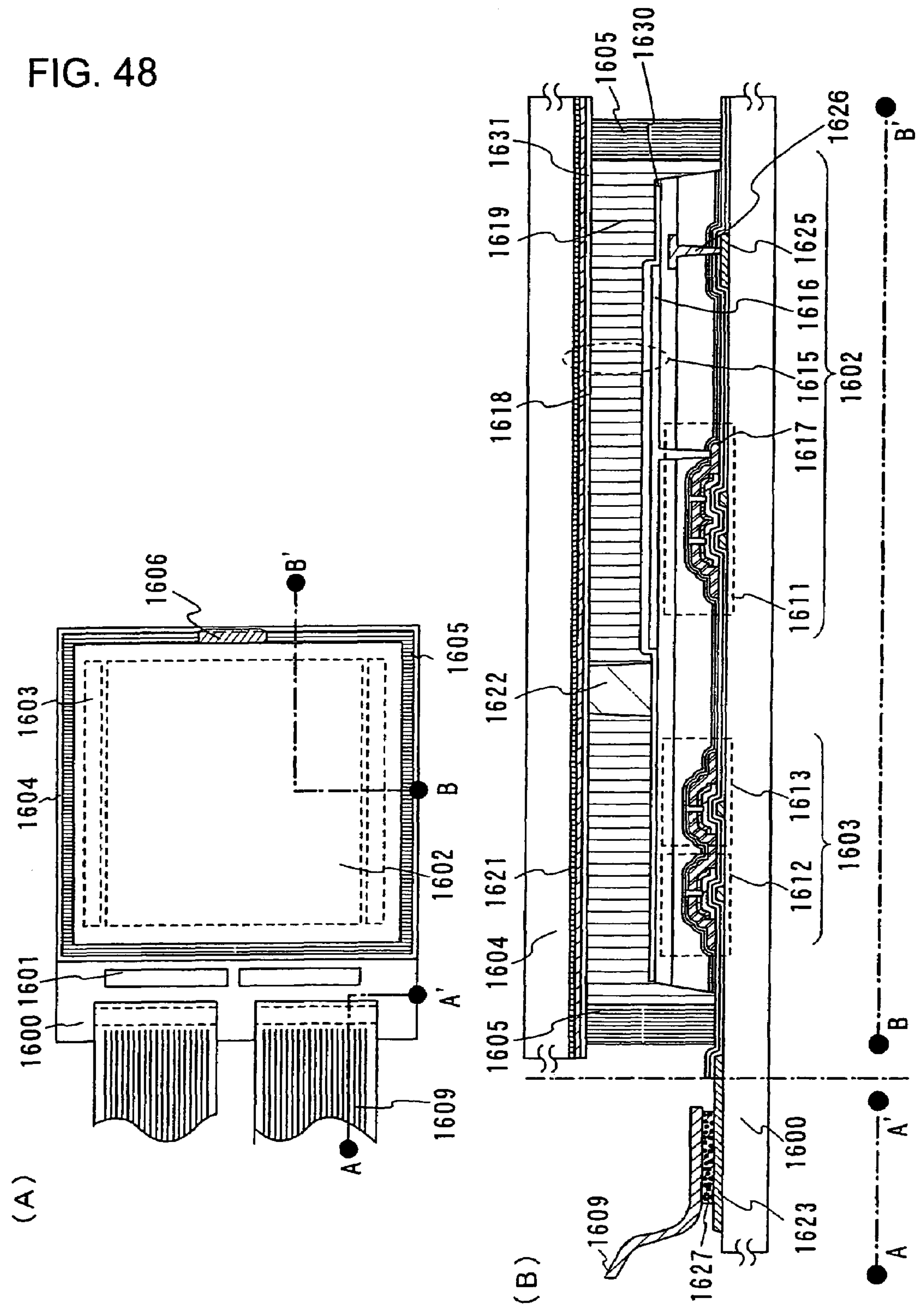
FIG. 48 shows a top view and a cross-sectional view each illustrating a structure of a liquid crystal display panel in accordance with the invention.
Figure 49:
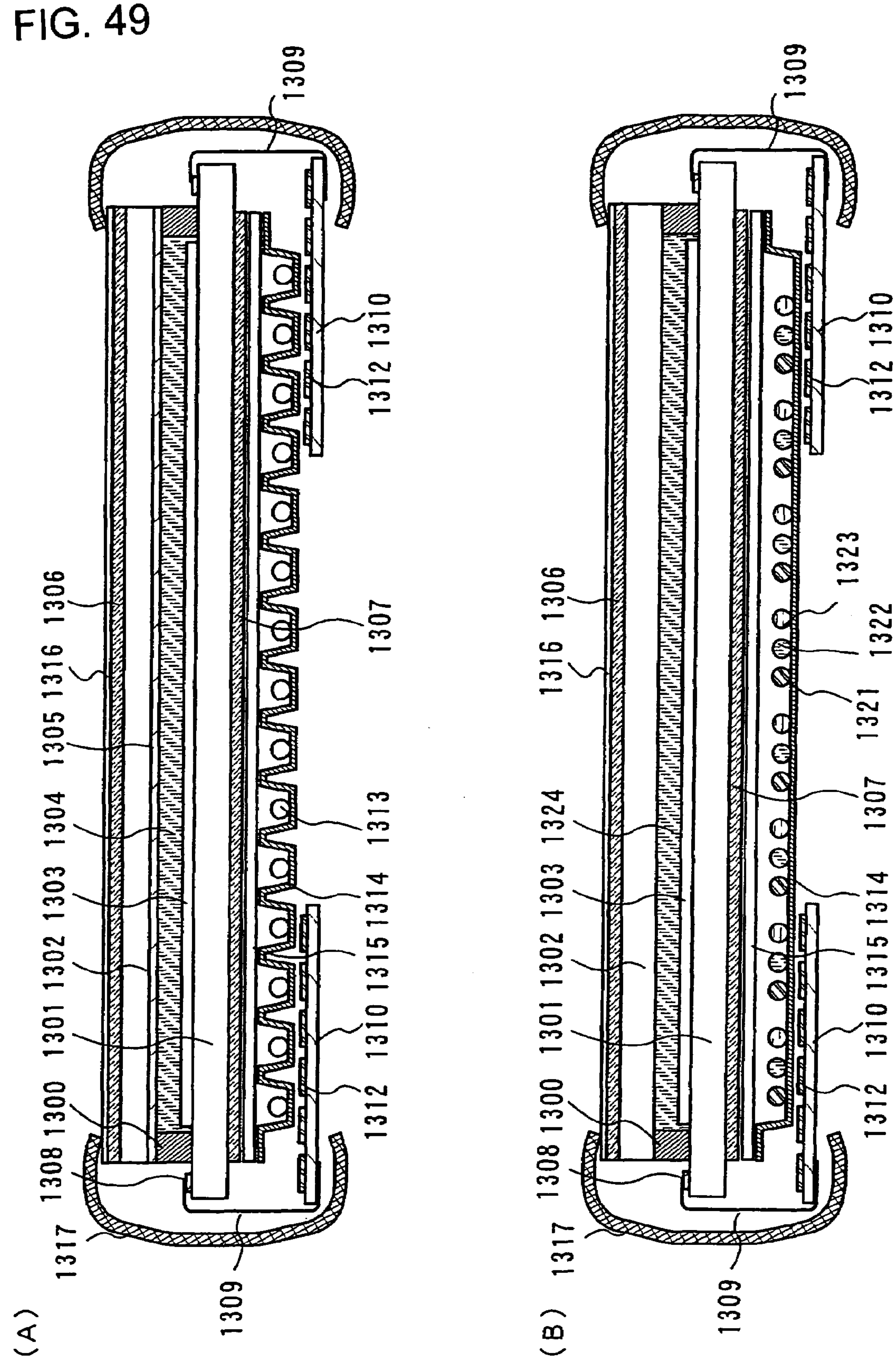
FIG. 49 shows views each illustrating a liquid crystal display module in accordance with the invention.
Figure 50:
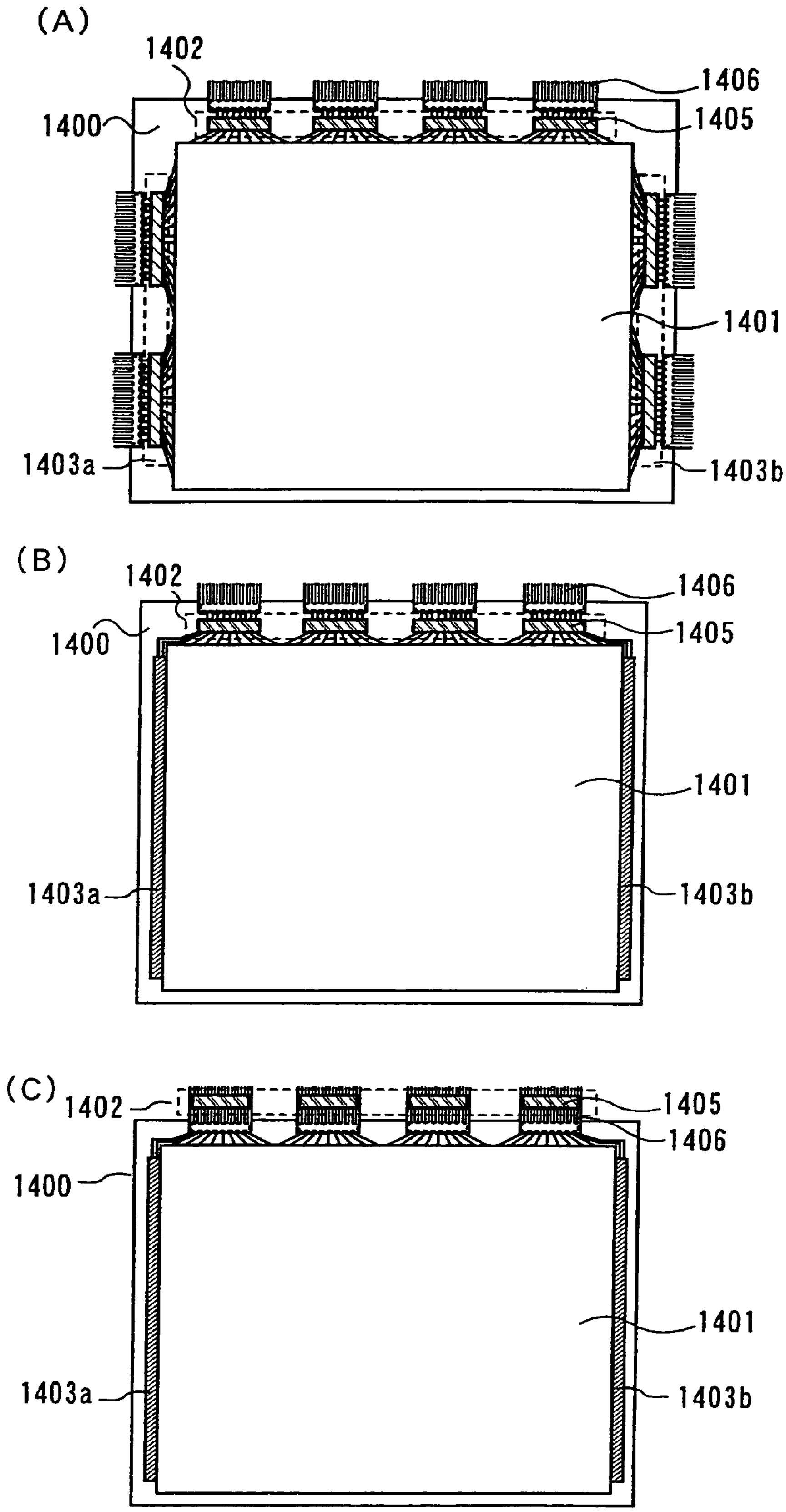
FIG. 50 shows top views each illustrating a mounting method of a semiconductor device in accordance with the invention.
Figure 51:
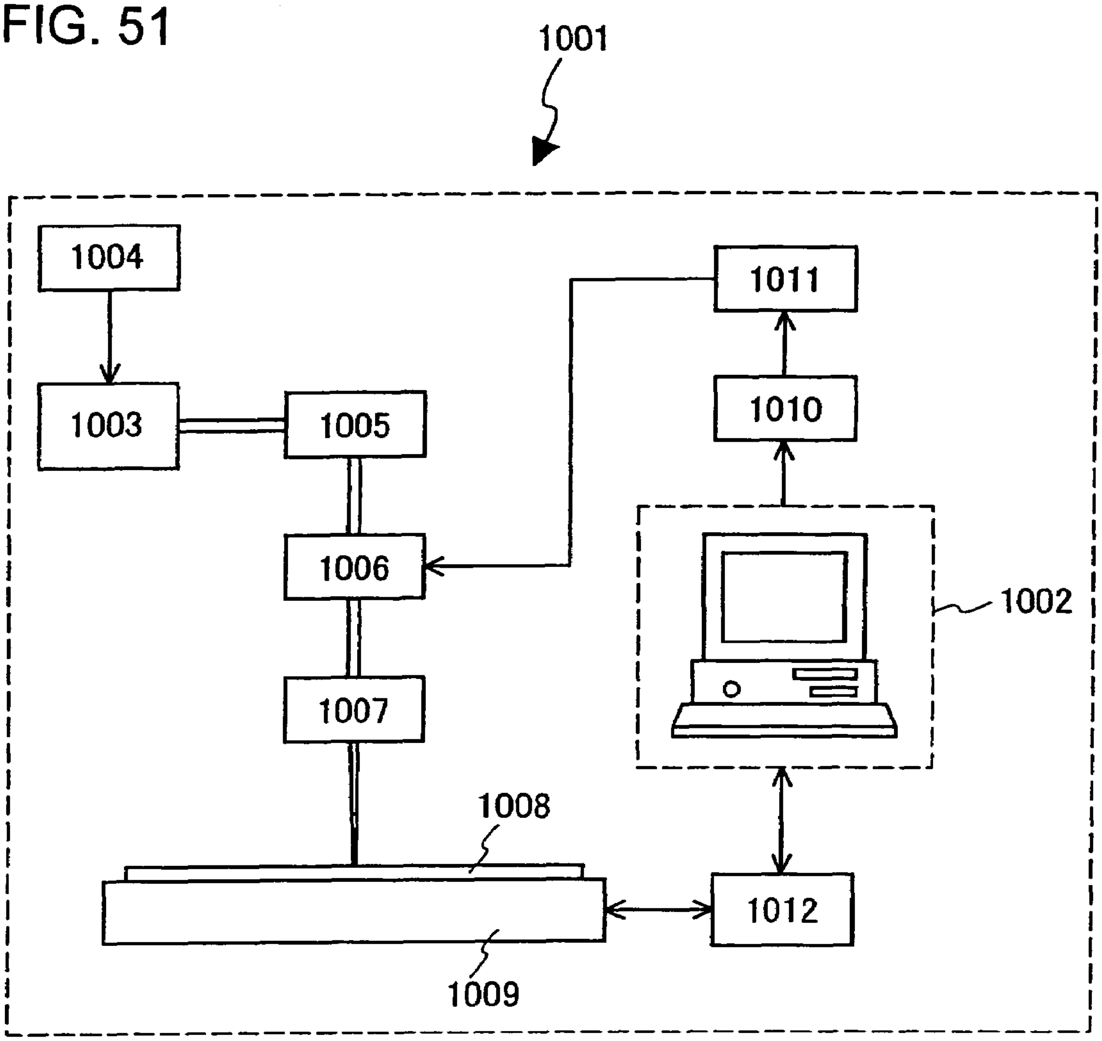
FIG. 51 shows a diagram illustrating a laser beam direct writing system applicable to the invention.
Figure 52:
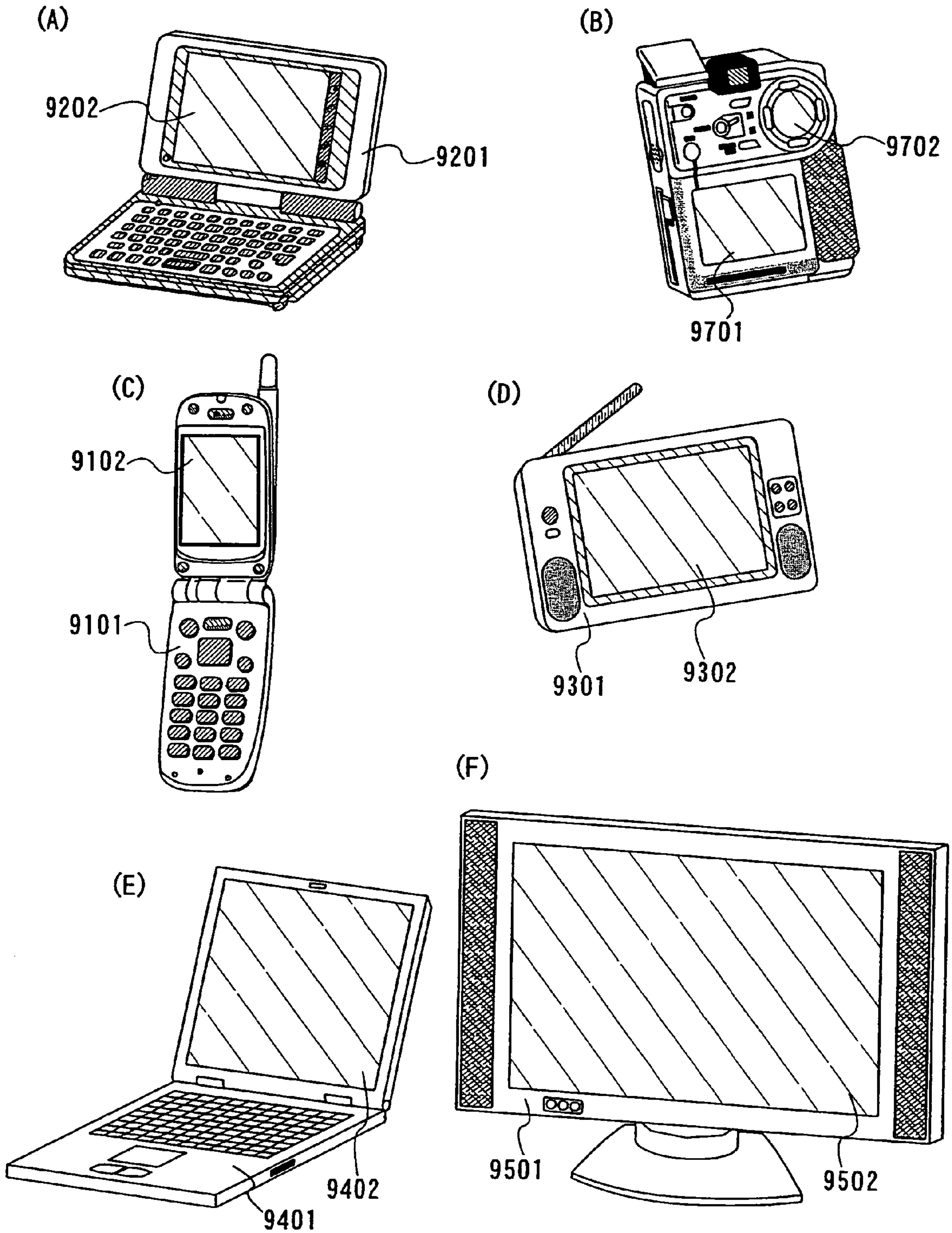
FIG. 52 shows views illustrating examples of an electronic apparatus.
Figure 53:
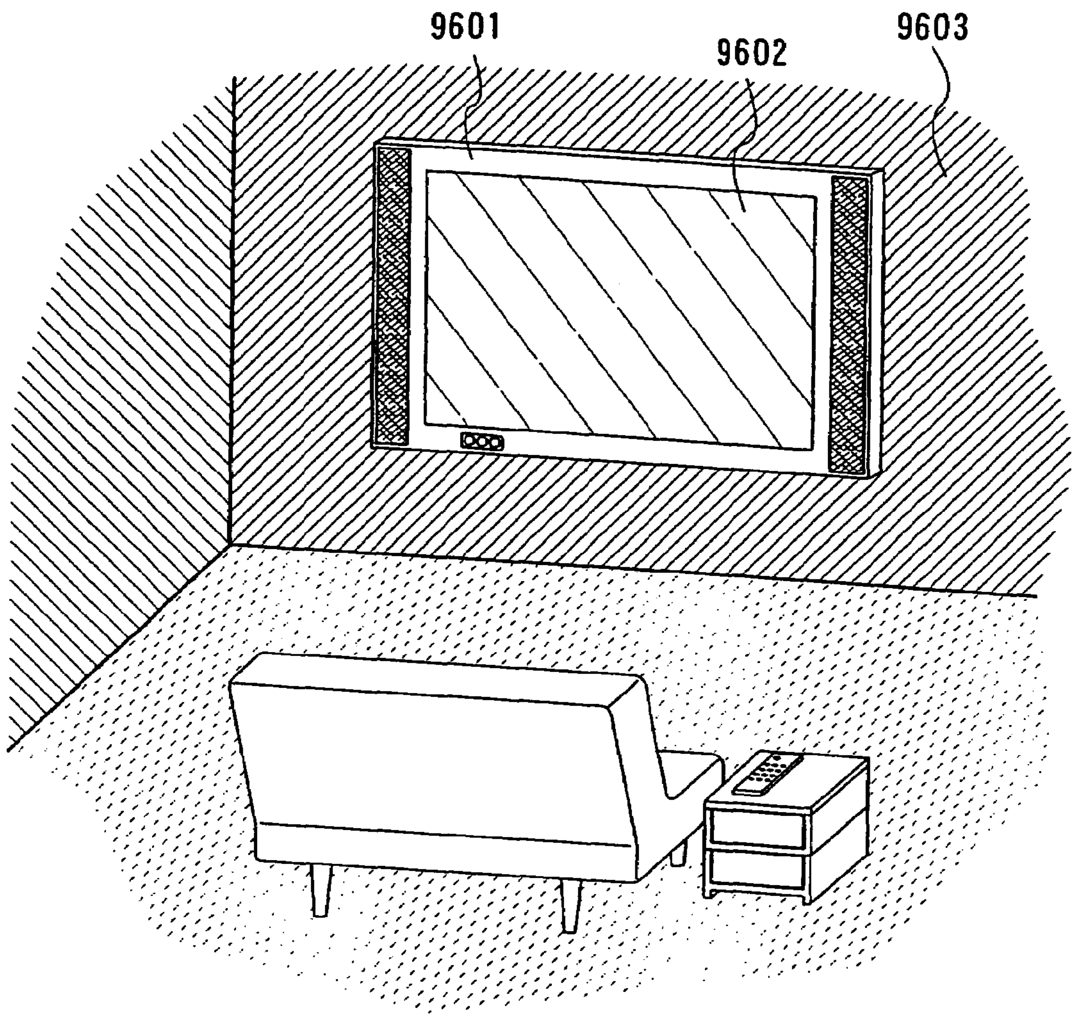
FIG. 53 shows a view illustrating an example of an electronic apparatus.
Figure 54:
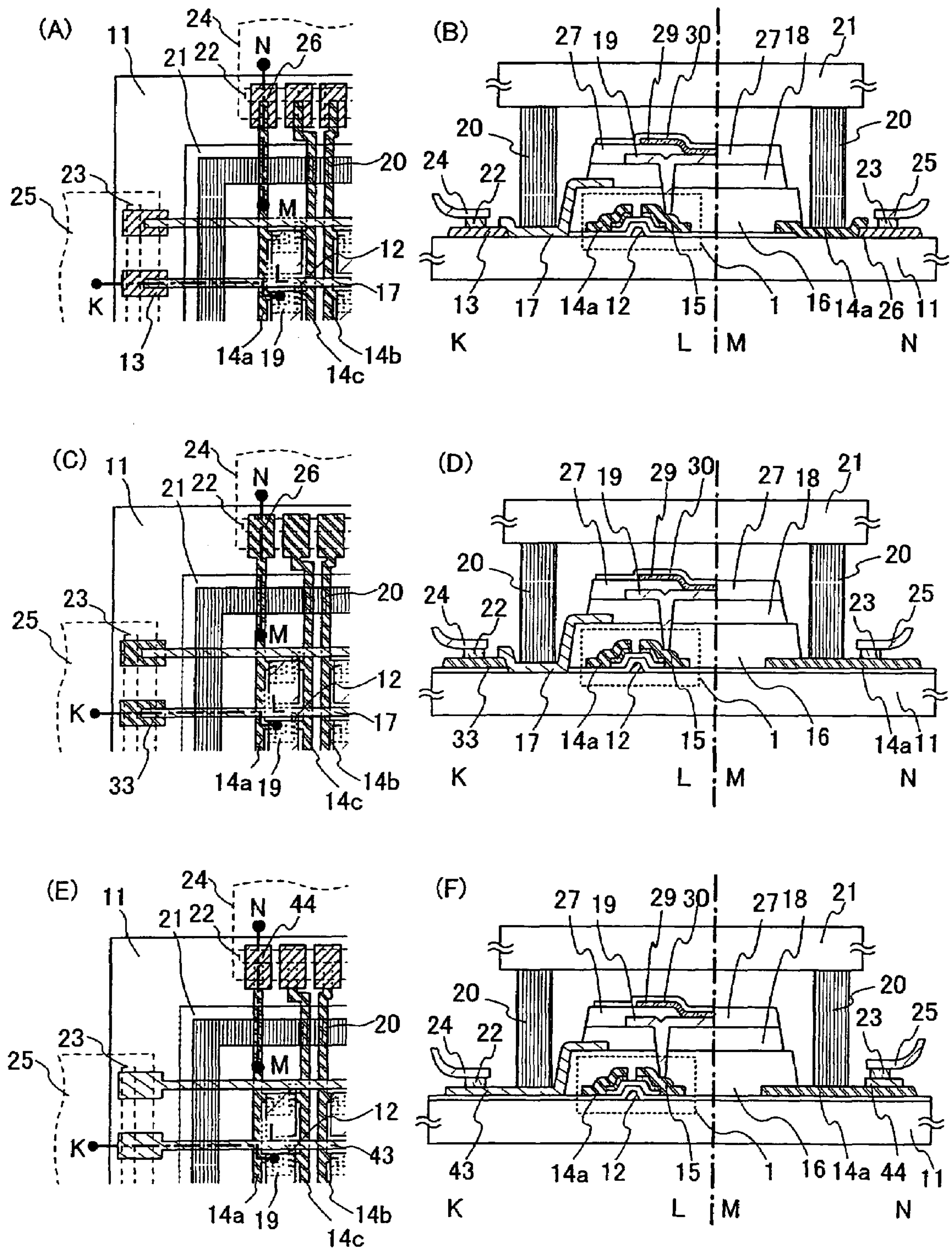
FIG. 54 shows a top view and a cross-sectional view each illustrating a structure of a peripheral portion of a semiconductor device in accordance with the invention.
Figure 55:
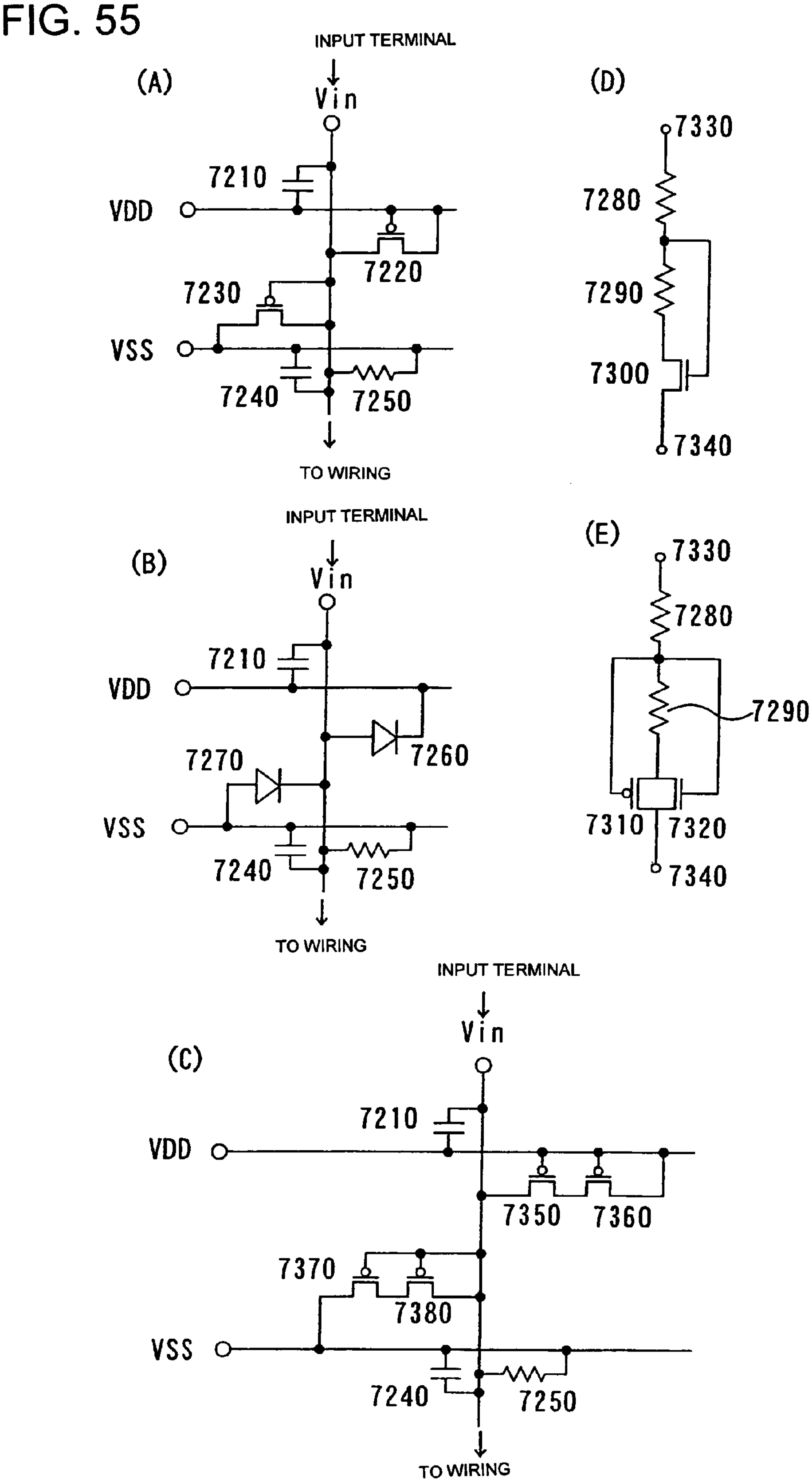
FIG. 55 shows circuit diagrams each illustrating a protection circuit.

The invention claimed is:

1. A method of fabricating a semiconductor device, comprising the steps of:

forming a gate electrode over an insulating surface;

forming a gate insulating film over the gate electrode;

forming a first semiconductor region over the gate insulating film;

adding a catalytic element into the first semiconductor region and heating the first semiconductor region;

separately forming a second semiconductor film containing an impurity element over the first semiconductor region by a plasma CVD method;

heating the first semiconductor region and the second semiconductor film;

forming a first conductive layer to be in contact with the second semiconductor film by a droplet discharge method;

partially etching the first conductive layer and the second semiconductor film to form a second conductive layer, a source region and a drain region;

forming an insulating film over the second conductive layer;

partially etching the insulating film and the gate insulating film to partially expose the gate electrode; and forming a third conductive layer to be connected to the gate electrode by a droplet discharge method.

2. The method of fabricating a semiconductor device according to claim 1, wherein the impurity element is an element selected from the group consisting of phosphorus, nitrogen, arsenic, antimony and bismuth.

3. The method of fabricating a semiconductor device according to claim 1, wherein one or more selected from the group consisting of helium, neon, argon, krypton and xenon is added into the second semiconductor film.

4. The method of fabricating a semiconductor device according to claim 1, wherein the third conductive layer is connected to three or more gate electrodes.

5. The method of fabricating a semiconductor device according to claim 1, wherein the third conductive layer is connected to two gate electrodes.

6. The method of fabricating a semiconductor device according to claim 1, wherein the gate electrode is formed by forming a conductive film over an insulating surface, discharging or applying a photosensitive resin onto the conductive film, partially irradiating the photosensitive resin with laser light to form a mask, and then etching the conductive film using the mask.

7. The method of fabricating a semiconductor device according to claim 1, wherein the gate electrode is formed of a heat-resistant conductive layer.

8. The method of fabricating a semiconductor device according to claim 1, wherein the gate electrode is formed of a crystalline silicon film containing tungsten, molybdenum, zirconium, hafnium, bismuth, niobium, tantalum, chromium (Cr), cobalt, nickel, platinum, or phosphorus, indium tin oxide, zinc oxide, indium zinc oxide, gallium-doped zinc oxide, or indium tin oxide containing silicon oxide.

9. The method of fabricating a semiconductor device according to claim 1, wherein the catalytic element is one or more of elements selected from the group consisting of tungsten, molybdenum, zirconium, hafnium, bismuth, niobium, tantalum, chromium, cobalt, nickel and platinum.

10. A method of fabricating a semiconductor device, comprising the steps of:

forming a gate electrode over an insulating surface;

forming a gate insulating film over the gate electrode;

forming a first semiconductor region over the gate insulating film;

adding a catalytic element into the first semiconductor region and heating the first semiconductor region;

separately forming a second semiconductor film containing an impurity element over the first semiconductor region by a plasma CVD method;

heating the first semiconductor region and the second semiconductor film;

forming a first conductive layer to be in contact with the second semiconductor film by a droplet discharge method;

applying a photosensitive resin over the first conductive layer;

partially irradiating the photosensitive resin with laser light to form a mask;

partially etching the first conductive layer and the second semiconductor film by using the mask to form a second conductive layer, a source region and a drain region;

forming an insulating film over the second conductive layer;

partially etching the insulating film and the gate insulating film to partially expose the gate electrode; and forming a third conductive layer to be connected to the gate electrode by a droplet discharge method.

11. The method of fabricating a semiconductor device according to claim 10, wherein the impurity element is an element selected from the group consisting of phosphorus, nitrogen, arsenic, antimony and bismuth.

12. The method of fabricating a semiconductor device according to claim 10, wherein one or more selected from the group consisting of helium, neon, argon, krypton and xenon is added into the second semiconductor film.

13. The method of fabricating a semiconductor device according to claim 10, wherein the third conductive layer is connected to three or more gate electrodes.

14. The method of fabricating a semiconductor device according to claim 10, wherein the third conductive layer is connected to two gate electrodes.

15. The method of fabricating a semiconductor device according to claim 10, wherein the gate electrode is formed of a heat-resistant conductive layer.

16. The method of fabricating a semiconductor device according to claim 10, wherein the gate electrode is formed of a crystalline silicon film containing tungsten, molybdenum, zirconium, hafnium, bismuth, niobium, tantalum, chromium (Cr), cobalt, nickel, platinum, or phosphorus, indium tin oxide, zinc oxide, indium zinc oxide, gallium-doped zinc oxide, or indium tin oxide containing silicon oxide.

17. The method of fabricating a semiconductor device according to claim 10, wherein the catalytic element is one or more of elements selected from the group consisting of tungsten, molybdenum, zirconium, hafnium, bismuth, niobium, tantalum, chromium, cobalt, nickel and platinum.

18. A method of fabricating a semiconductor device, comprising the steps of:

forming a gate electrode over an insulating surface;

forming a gate insulating film over the gate electrode;

forming a first semiconductor region over the gate insulating film;

adding a catalytic element into the first semiconductor region and heating the first semiconductor region;

separately forming a second semiconductor film containing an impurity element over the first semiconductor region by a plasma CVD method;

heating the first semiconductor region and the second semiconductor film;

forming a first conductive layer to be in contact with the second semiconductor film by a droplet discharge method;

partially etching the first conductive layer and the second semiconductor film to form a second conductive layer, a source region and a drain region;

forming a first insulating film over the second conductive layer;

partially etching the first insulating film and the gate insulating film to partially expose the gate electrode;

forming a third conductive layer to be connected to the gate electrode by a droplet discharge method;

forming a second insulating film over the third conductive layer;

partially etching the second insulating film and the first insulating film to partially expose the second conductive layer; and forming a fourth conductive layer to be connected to the second conductive layer.

19. The method of fabricating a semiconductor device according to claim 18, wherein the impurity element is an element selected from the group consisting of phosphorus, nitrogen, arsenic, antimony and bismuth.

20. The method of fabricating a semiconductor device according to claim 18, wherein one or more selected from the group consisting of helium, neon, argon, krypton and xenon is added into the second semiconductor film.

21. The method of fabricating a semiconductor device according to claim 18, wherein the third conductive layer is connected to three or more gate electrodes.

22. The method of fabricating a semiconductor device according to claim 18, wherein the third conductive layer is connected to two gate electrodes.

23. The method of fabricating a semiconductor device according to claim 18, wherein the gate electrode is formed by forming a conductive film over an insulating surface, discharging or applying a photosensitive resin onto the conductive film, partially irradiating the photosensitive resin with laser light to form a mask, and then etching the conductive film using the mask.

24. The method of fabricating a semiconductor device according to claim 18, wherein the gate electrode is formed of a heat-resistant conductive layer.

25. The method of fabricating a semiconductor device according to claim 18, wherein the gate electrode is formed of a crystalline silicon film containing tungsten, molybdenum, zirconium, hafnium, bismuth, niobium, tantalum, chromium (Cr), cobalt, nickel, platinum, or phosphorus, indium tin oxide, zinc oxide, indium zinc oxide, gallium-doped zinc oxide, or indium tin oxide containing silicon oxide.

26. The method of fabricating a semiconductor device according to claim 18, wherein the catalytic element is one or more of elements selected from the group consisting of tungsten, molybdenum, zirconium, hafnium, bismuth, niobium, tantalum, chromium, cobalt, nickel and platinum.

* * * * *